US008182980B2

(12) United States Patent
Adachi

(10) Patent No.: US 8,182,980 B2

(45) Date of Patent: May 22, 2012

(54) DEVELOPING SOLUTION FOR LITHOGRAPHIC PRINTING PLATES AND PRODUCTION METHOD OF LITHOGRAPHIC PRINTING PLATE

(75) Inventor: Keiichi Adachi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/863,616

(22) Filed: Sep. 28, 2007

(65) Prior Publication Data

US 2008/0081295 A1 Apr. 3, 2008

(30) Foreign Application Priority Data

Sep. 29, 2006 (JP) ................................ 2006-269649
Nov. 29, 2006 (JP) ................................ 2006-322274
Mar. 30, 2007 (JP) ................................ 2007-094778

(51) Int. Cl.
*G03F 7/30* (2006.01)
*G03F 7/32* (2006.01)

(52) U.S. Cl. ...... 430/302; 430/435; 101/453; 101/463.1

(58) Field of Classification Search ............... 430/270.1, 430/300, 302, 434, 435; 101/453, 463.1
See application file for complete search history.

(56) References Cited

U.S. PATENT DOCUMENTS

| | | | | |
|---|---|---|---|---|
| 4,548,894 | A * | 10/1985 | Lynch et al. | 430/273.1 |
| 6,247,856 | B1 * | 6/2001 | Shibano et al. | 396/565 |
| 2003/0049564 | A1 * | 3/2003 | Higashi et al. | 430/302 |
| 2004/0191693 | A1 * | 9/2004 | Takamiya | 430/302 |
| 2006/0057492 | A1 * | 3/2006 | Kunita et al. | 430/270.1 |
| 2007/0144384 | A1 | 6/2007 | Inno et al. | |
| 2009/0004608 | A1 * | 1/2009 | Sawada et al. | 430/325 |

FOREIGN PATENT DOCUMENTS

| | | | | |
|---|---|---|---|---|
| EP | 0 770 494 | A2 | | 5/1997 |
| EP | 1 705 522 | | * | 9/2006 |
| JP | 2938397 | B2 | | 6/1999 |
| JP | 2002-91016 | A | | 3/2002 |
| JP | 2005-275222 | A | | 10/2005 |
| JP | 2006-91838 | A | | 4/2006 |
| WO | WO 2007/080726 | | * | 7/2007 |

OTHER PUBLICATIONS

Machine translation of JP 2005-275222, published on Oct. 6, 2005.*
Japanese Office Action issued in corresponding Japanese application No. 2007-249784 on Jul. 12, 2011.

* cited by examiner

*Primary Examiner* — Anca Eoff

(74) *Attorney, Agent, or Firm* — Sughrue Mion, PLLC

(57) ABSTRACT

A developing solution containing at least one of compounds represented by the formulae <1>, <2> and <3> as defined herein, and having a pH of from 2 to 10; and a method for producing a lithographic printing plate, including imagewise exposing a lithographic printing plate precursor including an image recording layer and a support to cure the image recording layer in the exposed area, and developing the exposed lithographic printing plate precursor with an aqueous solution containing at least one of the compounds represented by the formulae <1>, <2> and <3> as defined herein and having a pH of 2 to 10 are provided.

41 Claims, 2 Drawing Sheets

DEVELOPING SOLUTION FOR LITHOGRAPHIC PRINTING PLATES AND PRODUCTION METHOD OF LITHOGRAPHIC PRINTING PLATE

FIELD OF THE INVENTION

The present invention relates to a developing solution for lithographic printing plates and a production method of a lithographic printing plate. More specifically, the present invention relates to a developing solution for lithographic printing plates, which enables processing in the region from acidic to low alkaline, enables development even in an acidic region and ensures good dispersion stability of development scum, and a production method of a lithographic printing plate.

BACKGROUND OF THE INVENTION

The lithographic printing plate generally consists of a lipophilic image part of receiving an ink in the printing process and a hydrophilic non-image part of receiving a fountain solution. The lithographic printing is a printing method where the attachment of ink to the surface of a lithographic printing plate is made to differ between the ink-receiving part assigned to the lipophilic image part of the lithographic printing plate and the fountain solution-receiving part (ink non-receiving part) assigned to the hydrophilic non-image part by utilizing the property of water and printing ink repelling each other and after inking only the image part, the ink is transferred to a printing material such as paper.

For producing such a lithographic printing plate, a lithographic printing plate precursor (PS plate) comprising a hydrophilic support having provided thereon a lipophilic photosensitive resin layer (photosensitive layer, image recording layer) has been heretofore widely used. Usually, a lithographic printing plate is obtained by a plate-making method of exposing the lithographic printing plate precursor through an original image such as lith film and while allowing the image recording layer in the portion working out to an image part to remain, removing by dissolution the image recording layer in other unnecessary portions with an alkaline developing solution or an organic solvent to reveal the hydrophilic support surface, thereby forming a non-image part.

In this way, the plate-making process using a conventional lithographic printing plate precursor requires a step of removing by dissolution the image recording layer in the unnecessary portion with an alkaline developing solution or the like after exposure and in view of environmental protection and safety, the problem to be solved includes processing with a developing solution closer to the neutral region or less discharge of waste solutions. In particular, the treatment of waste solutions discharged along with the wet processing is recently a great concern to the entire industrial world from the standpoint of consideration for global environment, and the demand for solving the problems above is becoming stronger.

On the other hand, a digitization technique of electronically processing, storing and outputting image information by using a computer has been recently widespread and various new image-output systems coping with such a digitization technique have been put into practical use. Along with this, a computer-to-plate (CTP) technique is attracting attention, where digitized image information is carried on a highly converging radiant ray such as laser light and a lithographic printing plate precursor is scan-exposed by this light to directly produce a lithographic printing plate without intervention of a lith film. Accordingly, one of important technical problems to be solved is to obtain a lithographic printing plate precursor suitable for such a technique.

As described above, preparation of the developing solution to a lower alkalinity and simplification of the processing step have been increasingly desired more than ever in terms of both the concerns for global environment and the conformity with space saving and low running cost. However, the developing process generally comprises three steps of developing the plate with an aqueous alkali solution at a pH of 10 or more, washing out the alkali agent in a water washing bath, and treating the plate with a gum solution mainly comprising a hydrophilic resin. Therefore, the automatic developing machine itself occupies a large space, and additionally, problems in view of environmental protection and running cost remain to be solved, such as treatment of development waste, water-washing waste and gum waste.

To solve these problems, for example, JP-A-2002-91016 (the term "JP-A" as used herein means an "unexamined published Japanese patent application") proposes a development method using an alkali solution containing a nonionic surfactant having a pH of 10 to 12.5, but the photosensitive composition contains an alkali-soluble polymer and this leads to a problem that development cannot be performed at a pH lower than the pH specified above. Also, for example, Japanese Patent No. 2,938,397 (corresponding to EP0770494A2) describes a lithographic printing plate precursor where an image forming layer comprising a hydrophilic binder having dispersed therein a hydrophobic thermoplastic polymer particle is provided on a hydrophilic support. This lithographic printing plate precursor can be image-exposed using an infrared laser to cause thermal coalescence of hydrophobic thermoplastic polymer particles and thereby form an image, then mounted on the cylinder of a printing press, and on-press developed with a fountain solution and/or ink.

Such a method of forming an image by the simple thermal fusion and coalescence of fine particles has a problem that the image strength (adhesion to support) is very low and the press life is insufficient, despite good on-press developability.

SUMMARY OF THE INVENTION

As described above, the development system using an alkali agent has problems, that is, a problem from the environmental aspect; a problem that a replenisher, an apparatus or the like must be provided for compensating the decrease in pH due to absorption of carbonic acid gas and this incurs increase in the amount of waste solution; and a problem in the running cost of developing solution.

Also, the development in the region from acidic to low alkaline generally has difficulty in ensuring the developability and stably dispersing the photosensitive layer components of the once removed non-image part, giving rise to a problem that the photosensitive layer components precipitate in the developing tank and in the case of performing a running process, the precipitate as a development scum attaches to the printing plate during the processing and readily causes an image defect.

Accordingly, an object of the present invention is to overcome the drawbacks of these conventional techniques and provide a developing solution for lithographic printing plates, ensuring that development in the region from acidic to neutral can be performed and the problem of developability, which occurs in such development, and the problem of dispersion stability of the photosensitive layer components (development scum) removed by the development can be overcome. The object of the present invention includes providing a production method of a lithographic printing plate.

As a result of intensive studies to attain the object above, the present inventors have found that when a lithographic printing plate precursor having no alkali-soluble acidic group is processed with an aqueous solution containing a specific surfactant after image exposure, a developing solution assured of developability in the region from acidic to low alkaline and excellent dispersibility of development scum is obtained. The present invention has been accomplished based on this finding.

That is, the present invention is as follows.

1. A developing solution for lithographic printing plates, comprising at least any one of the compounds represented by the following formulae <1>, <2> and <3> and having a pH of 2 to 10:

<1>

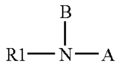

<2>

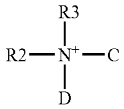

<3>

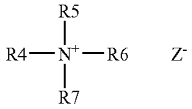

wherein in formula <1>, R1 represents H, an alkyl group or a substituent having the following structure:

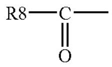

wherein R8 is H or an alkyl group,

A represents H, an alkyl group, an ethylene oxide group-containing group, a carboxylic acid group-containing group or a carboxylate-containing group, and B represents an ethylene oxide group-containing group, a carboxylic acid group-containing group or a carboxylate-containing group; in formula <2>, R2 and R3 each represents H or an alkyl group, at least either one of R2 and R3 may have a substituent or a linking group, C represents an alkyl group or a group containing an ethylene oxide group and D represents a group containing carboxylate anion or a group containing oxide anion ($O^-$); and in formula <3>, R4, R5, R6 and R7 each represents H or an alkyl group, and $Z^-$ represents a counter anion.

2. The developing solution for lithographic printing plates as described in 1 above, wherein the total concentration of the compound represented by formula <1> and the compound represented by formula <2> is 2 mass % (weight %) or more.

3. The developing solution for lithographic printing plates as described in 1 or 2 above, which comprises a water-soluble polymer compound.

4. A method for producing a lithographic printing plate, comprising imagewise exposing a lithographic printing plate precursor having an image recording layer on a support to cure the image recording layer in the exposed area, and then developing it with an aqueous solution comprising at least any one of the compounds represented by the following formulae <1>, <2> and <3> and having a pH of 2 to 10:

<1>

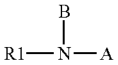

<2>

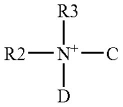

<3>

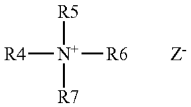

wherein in formula <1>, R1 represents H, an alkyl group or a substituent having the following structure:

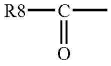

wherein R8 is H or an alkyl group,

A represents H, an alkyl group, an ethylene oxide group-containing group, a carboxylic acid group-containing group or a carboxylate-containing group, and B represents an ethylene oxide group-containing group, a carboxylic acid group-containing group or a carboxylate-containing group; in formula <2>, R2 and R3 each represents H or an alkyl group, at least either one of R2 and R3 nay have a substituent or a linking group, C represents an alkyl group or a group containing an ethylene oxide group and D represents a group containing carboxylate anion or a group containing oxide anion ($O^-$); and in formula <3>, R4, R5, R6 and R7 each represents H or an alkyl group, and $Z^-$ represents a counter anion.

5. The method for producing a lithographic printing plate as described in 4 above, wherein the image recording layer comprises (1) a polymerization initiator, (2) a polymerizable compound and (3) a binder polymer.

6. The method for producing a lithographic printing plate as described in 4 or 5 above, wherein the support of the lithographic printing plate precursor is surface-treated with an alkali metal silicate and/or an organic phosphonic acid.

7. The method for producing a lithographic printing plate as described in any one of 4 to 6 above, wherein the lithographic printing plate precursor further has a protective layer on the image recording layer.

8. The method for producing a lithographic printing plate as described in any one of 4 to 7 above, wherein the binder polymer used on the image recording layer of the lithographic printing plate precursor has an acid group or a neutralization product thereof.

9. The method for producing a lithographic printing plate as described in any one of 4 to 8 above, wherein the binder polymer used on the image recording layer of the lithographic printing plate precursor has a urethane bond.

10. The method for producing a lithographic printing plate as described in any one of 4 to 9 above, wherein the imagewise exposure is performed using a laser which emits light at 760 to 1,200 nm.

11. The method for producing a lithographic printing plate as described in any one of 4 to 9 above, wherein the imagewise exposure is performed using a laser which emits light at 250 to 420 nm.

12. The method for producing a lithographic printing plate as described in any one of 4 to 11 above, wherein the components of the image recording layer are partially or entirely enclosed in a microcapsule.

13. The method for producing a lithographic printing plate as described in any one of 4 to 12 above, wherein the exposed lithographic printing plate precursor is further heat-treated between exposure and development.

14. The method for producing a lithographic printing plate as described in any one of 4 to 13 above, wherein the exposed lithographic printing plate precursor after the developing is further heat-treated or entire-surface exposed.

According to the present invention, the developing solution contains at least any one of the compounds represented by formulae <1>, <2> and <3> as a specific surfactant, so that the development can be performed with an aqueous solution at a pH of 2 to 10, deterioration due to carbonic acid gas does not occur, and a lithographic printing plate having a constant quality can be produced using a developing solution always assured of constant developability. The present invention is advantageous also in terms of the replenishing amount of developing solution, reduction in the amount of waste solution, running cost and environmental aspect. Furthermore, the problem of dispersion stability of the photosensitive layer removed by development (development scum) can be overcome, and a developing solution for lithographic printing plates, ensuring no attachment of scum and excellent contamination resistance, and a production method of a lithographic printing plate can be provided.

DETAILED DESCRIPTION OF THE INVENTION

Figure 1:
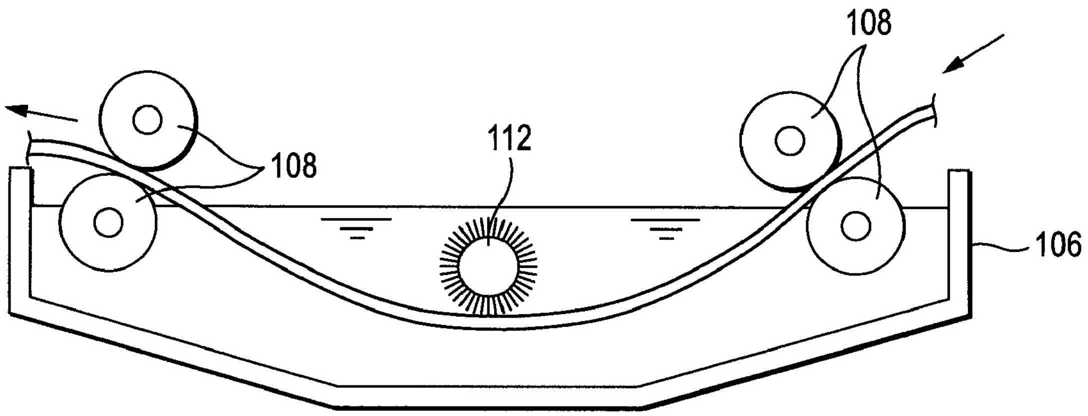
FIG. 1 is a schematic view of a developing machine.

The developing solution for lithographic printing plates and the production method of a lithographic printing plate, of the present invention, are described below.

[Developing Solution]

The developing solution for lithographic printing plates of the present invention comprises at least any one of the compounds represented by the following formulae <1>, <2> and <3> and has a pH of 2 to 10:

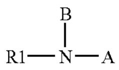

<1>

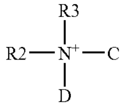

<2>

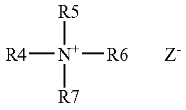

<3> wherein in formula <1>, R1 represents H, an alkyl group or a substituent having the following structure:

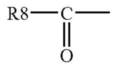

wherein R8 is H or an alkyl group,

A represents H, an alkyl group, an ethylene oxide group-containing group, a carboxylic acid group-containing group or a carboxylate-containing group, and B represents an ethylene oxide group-containing group, a carboxylic acid group-containing group or a carboxylate-containing group; in formula <2>, R2 and R3 each represents H or an alkyl group, at least either one of R2 and R3 may have a substituent or a linking group, C represents an alkyl group or a group containing an ethylene oxide group and D represents a group containing carboxylate anion or a group containing oxide anion ($O^-$); in formula <3>, R4, R5, R6 and R7 each represents H or an alkyl group, and $Z^-$ represents a counter anion; the alkyl group of R1 to R7 may have a substituent.

In formula <1> or <2>, the ethylene oxide group in the ethylene oxide group-containing group means $-(CH_2CH_2O)_nH$ (wherein n is an integer of 1 or more, preferably from 2 to 20), and the ethylene oxide group-containing group includes an ethylene oxide group alone. In formula <1>, the carboxylic acid group-containing group includes a carboxylic acid group alone. In formula <1>, the carboxylate in the carboxylate-containing group means —COOM (wherein M is an alkali metal or an alkaline earth metal, preferably an alkali metal), and the carboxylate-containing group includes a carboxylate alone. In formula <2>, the group containing carboxylate anion includes a carboxylate anion alone. In formula <2>, the group containing oxide anion ($O^-$) includes an oxide anion alone.

The compounds represented by formulae <1>, <2> and <3> (hereinafter sometimes referred to as a "surfactant") are not particularly limited, but representative examples thereof are set forth below.

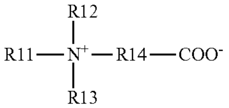

(I)

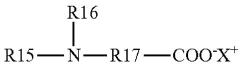

(II)

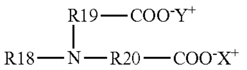

(III)

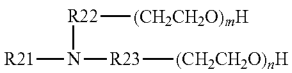

(IV)

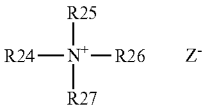

(V)

Other examples include a surfactant represented by the following formula (VI):

(VI)

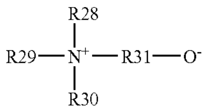

(In the formulae above, R11 represents H, an alkyl group or an alkyl group having a linking group; the linking group includes an ester, carbonyl or amide bond, and the number of carbon atoms connected to N through the bond is from 8 to 20;

R12, R15, R18 and R24 to R29 each represents H or an alkyl group;

R13 represents an alkyl group or a group containing an ethylene oxide group;

R16 represents H, an alkyl group or a group containing an ethylene oxide group;

R21 represents H, an alkyl group or

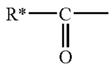

(wherein R* represents H or an alkyl group),

R30 represents an alkyl group or a group containing an ethylene oxide group; and R14, R17, R19, R20, R22, R23 and R31 each represents an alkylene group or a single bond.)

In the compound of formula (I), the carboxyl group may be connected directly to N and in this case, an alkylene group as R14 is not present and R14 is a single bond. In the compound (I), if the total carbon number increases, the hydrophobic moiety becomes large and dissolution in an aqueous developing solution becomes difficult. The dissolution may be improved by mixing a dissolution aid which helps dissolution, such as organic solvent or alcohol, with water, but if the total carbon number is excessively large, the surfactant cannot be dissolved within a proper mixing range. The sum total of carbon numbers of R11 to R14 is preferably from 10 to 40, more preferably from 12 to 30.

In the case where R11 to R13 each is an alkyl group or R14 is an alkylene group, the structure thereof may be linear or branched.

The carbon number of R11 to R14 in this compound (surfactant) is affected by the material, particularly the binder, used in the photosensitive layer. In the case of a binder having high hydrophilicity, a compound where the carbon number of R11 to R14 is relatively small tends to be preferred, and in the case of using a binder having low hydrophilicity, a compound where the carbon number of R11 to R14 is large is preferred.

Representative compounds include the followings.

I-a)

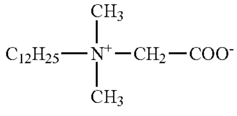

-continued

I-b)

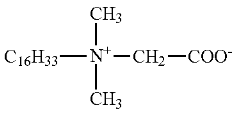

I-c)

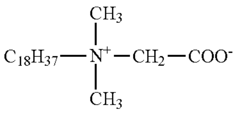

I-d)

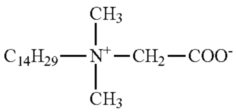

I-e)

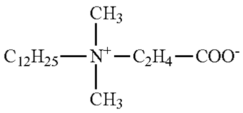

I-f)

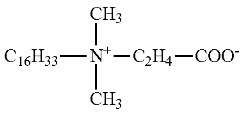

I-g)

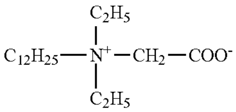

I-h)

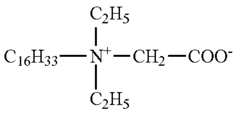

I-i)

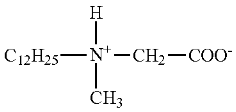

I-j)

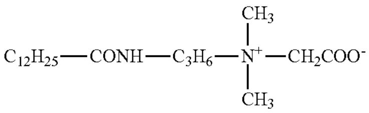

I-k)

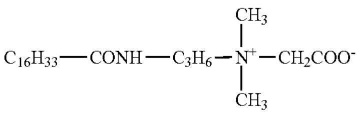

I-l)

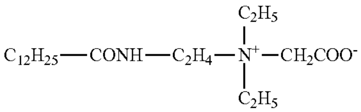

I-m)

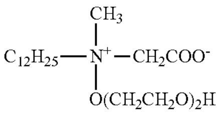

-continued

I-n)

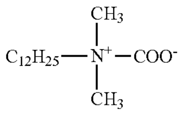

In the compound of formula (II), R15 is H or an alkyl group, R16 is H, an alkyl group or a group containing an ethylene oxide group and R17 is an alkylene group or a single bond. The carboxyl group may be connected directly to N and in this case, R17 is not present. Similarly to the compound (I), also in the compound (II), if the total carbon number increases, the hydrophobic moiety becomes large and dissolution in an aqueous developing solution becomes difficult. The dissolution may be improved by mixing a dissolution aid which helps dissolution, such as organic solvent or alcohol, with water, but if the total carbon number is excessively large, the surfactant cannot be dissolved within a proper mixing range. The sum total of carbon numbers of R15 to R17 is preferably from 10 to 30, more preferably from 12 to 25.

In the case where R15 and R16 each is an alkyl group or R17 is an alkylene group, the structure thereof may be linear or branched.

The carbon number of R15 to R17 in this compound (surfactant) is affected by the material, particularly the binder, used in the photosensitive layer. In the case of a binder having high hydrophilicity, a compound where the carbon number of R15 to R17 is relatively small tends to be preferred, and in the case of using a binder having low hydrophilicity, a compound where the carbon number of R15 to R17 is large is preferred.

Furthermore, in the compound above, as for $X^+$, a monovalent metal ion such as potassium ion and sodium ion, a divalent metal ion such as calcium ion and magnesium ion, an ammonium ion, a hydrogen ion and the like are used. In the compound (II), among these ions, sodium ion and potassium ion are preferred. Representative compounds include the followings.

$C_{12}H_{25}—NH—CH_2—COO^-Na^+$ II-a)

$C_{14}H_{29}—NH—CH_2—COO^-Na^+$ II-b)

$C_{12}H_{25}—NH—C_2H_4—COO^-Na^+$ II-c)

$C_{14}H_{29}—NH—C_2H_4—COO^-Na^+$ II-d)

$C_{16}H_{33}—NH—CH_2—COO^-Na^+$ II-e)

II-f)

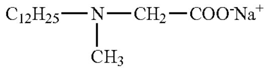

II-g)

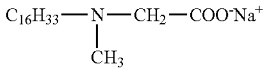

II-h)

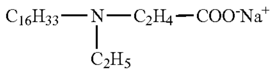

II-i)

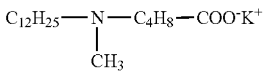

-continued

II-j)

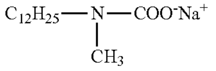

In the compound of formula (III), R18 is H or an alkyl group, and R19 and R20 each is an alkylene group or a single bond. Similarly to the compounds (I) and (II), also in the compound (III), if the total carbon number increases, the hydrophobic moiety becomes large and dissolution in an aqueous developing solution becomes difficult. The dissolution may be improved by mixing a dissolution aid which helps dissolution, such as organic solvent or alcohol, with water, but if the total carbon number is excessively large, the surfactant cannot be dissolved within a proper mixing range. The sum total of carbon numbers of R18 to R20 is preferably from 10 to 30, more preferably from 12 to 28.

In the case where R18 is an alkyl group and R19 and R20 each is an alkylene group, the structure thereof may be linear or branched.

The carbon number of R18 to R20 in this compound (surfactant) is affected by the material, particularly the binder, used in the photosensitive layer. In the case of a binder having high hydrophilicity, a compound where the carbon number of R18 to R20 is relatively small tends to be preferred, and in the case of using a binder having low hydrophilicity, a compound where the carbon number of R18 to R20 is large is preferred.

Furthermore, in the compound above, as for $X^+$ and $Y^+$, a monovalent metal ion such as potassium ion and sodium ion, a divalent metal ion such as calcium ion and magnesium ion, an ammonium ion, a hydrogen ion and the like are used. In the compound (III), among these ions, sodium ion and potassium ion are preferred. Representative compounds include the followings III-a)

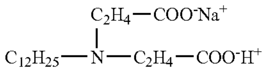

III-b)

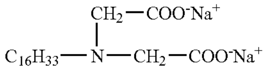

III-c)

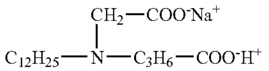

III-d)

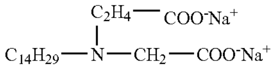

III-e)

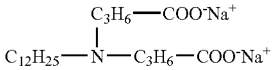

III-f)

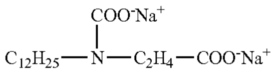

In the compound of formula (IV), the ethylene oxide may be connected directly to N and in this case, R22 and R23 each is a single bond. Also in the compound (IV), if the total carbon number increases, the hydrophobic moiety becomes large and dissolution in an aqueous developing solution becomes difficult. The dissolution may be improved by mixing a dissolution aid which helps dissolution, such as organic solvent or alcohol, with water, but if the total carbon number is excessively large, the surfactant cannot be dissolved within a proper mixing range. The sum total of carbon numbers of R21 to R23 is preferably from 8 to 50, more preferably from 12 to 40.

In the case where R21 is an alkyl group and R22 and R23 each is an alkylene group, the structure thereof may be linear or branched.

The carbon number of R21 to R23 in this compound (surfactant) is affected by the material, particularly the binder, used in the photosensitive layer. In the case of a binder having high hydrophilicity, a compound where the carbon number of R21 to R23 is relatively small tends to be preferred, and in the case of using binder having low hydrophilicity, a compound the carbon number of R21 to R23 is large is preferred.

As m and n indicating the number of ethylene oxides each is larger, the hydrophilicity increases and the stability in water is enhanced. m and n may be the same number or different numbers. A sum of m and n is preferably from 3 to 40 and more preferably from 5 to 20. Representative compounds include the followings.

IV-a)

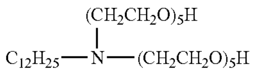

IV-b)

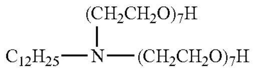

IV-c)

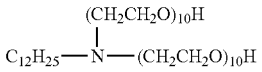

IV-d)

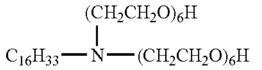

IV-e)

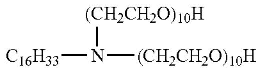

IV-f)

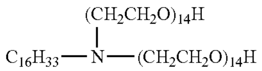

IV-g)

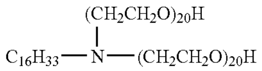

IV-h)

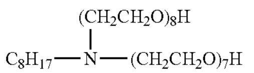

IV-i)

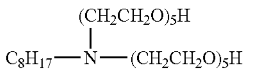

IV-j)

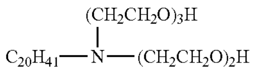

IV-K)

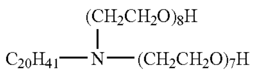

IV-l)

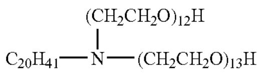

-continued

IV-m)

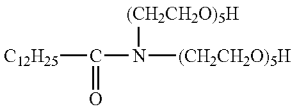

IV-n)

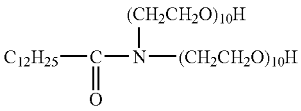

IV-o)

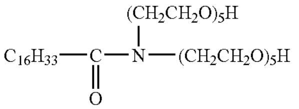

IV-p)

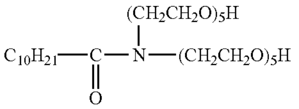

IV-m)

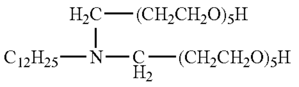

In the compound of formula (V), R24 to R27 is H or an alkyl group.

Also in the compound (V), if the total carbon number increases, the hydrophobic moiety becomes large and dissolution in an aqueous developing solution becomes difficult. The dissolution may be improved by mixing a dissolution aid which helps dissolution, such as organic solvent or alcohol, with water, but if the total carbon number is excessively large, the surfactant cannot be dissolved within a proper mixing range. The sum total of carbon numbers of R24 to R27 is preferably from 10 to 30, more preferably from 12 to 28.

In the case where R24 to R27 each is an alkyl group, the structure thereof may be linear or branched.

The carbon number of R24 to R27 in this compound (surfactant) is affected by the material, particularly the binder, used in the photosensitive layer. In the case of a binder having high hydrophilicity, a compound where the carbon number of R24 to R27 is relatively small tends to be preferred, and in the case of using a binder having low hydrophilicity, a compound where the carbon number of R24 to R27 is large is preferred.

$Z^-$ represents a counter anion. Although not limited, for example, $Cl^-$, $Br^-$ or $I^-$ is used in many cases. Representative compounds include the followings.

V-a)

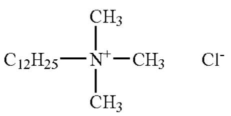

V-b)

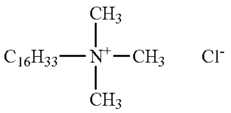

V-c)

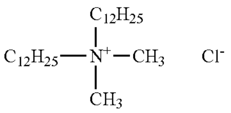

-continued

V-d)

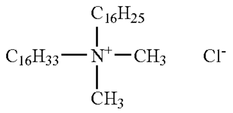

V-e)

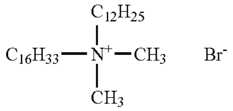

V-f)

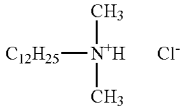

In the compound of formula (VI), R28 and R29 each is H or an alkyl group. R30 represents an alkyl group or a group containing an ethylene oxide group Also in the compound (VI), if the total carbon number increases, the hydrophobic moiety becomes large and dissolution in an aqueous developing solution becomes difficult. The dissolution may be improved by mixing a dissolution aid which helps dissolution, such as organic solvent or alcohol, with water, but if the total carbon number is excessively large, the surfactant cannot be dissolved within a proper mixing range. The sum total of carbon numbers of R28 to R30 is preferably from 8 to 30, more preferably from 10 to 28.

In the case where R28 to R30 each is an alkyl group, the structure thereof may be linear or branched.

The carbon number of R28 to R30 in this compound (surfactant) is affected by the material, particularly the binder, used in the photosensitive layer. In the case of a binder having high hydrophilicity, a compound where the carbon number of R28 to R30 is relatively small tends to be preferred, and in the case of using a binder having low hydrophilicity, a compound where the carbon number of R28 to R30 is large is preferred.

Representative compounds include the followings.

VI-a)

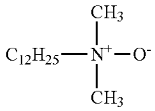

VI-b)

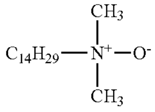

VI-c)

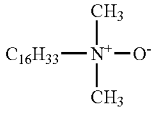

VI-d)

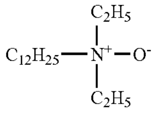

VI-e)

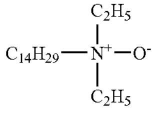

-continued

VI-f)

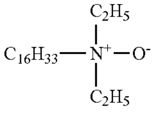

VI-g)

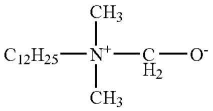

The surfactant above usually exerts the effect when used in a total amount of 2 mass % in the developing solution of the present invention, but depending on the kind of the surfactant, the effect may be in an acceptable level and not in a satisfactory level. Preferably, the surfactant needs to be added in an amount of 5 mass % or more. Also, if the surfactant concentration (effective ingredient concentration) exceeds 20 mass %, when this developing solution is actually used in a developing bath, the member of the bath may be eroded to cause a failure of the apparatus. Accordingly, the effective ingredient concentration is preferably 20% or less.

The surfactants for use in the present invention, including those exemplified above, are available from PIONIN Series of Takemoto Oil & Fat Co., Ltd.

The optimal pH of the developing solution varies depending on the photosensitive material used. That is, for example, some expresses the developability on the weak alkali side, some expresses the developability on the acidic side, and some have little pH dependency. The specific surfactants of the present invention can be effectively used in any developing solution of these cases and can accelerate the development. In Examples described later, a developing solution at a pH of 7 is described, but the pH is not limited thereto, and the developing solution may be used at a different pH depending on the structure of the binder.

The developing solution of the present invention may contain a water-soluble polymer compound in addition to the above-described specific surfactant, and in this case, a desensitization treatment can be performed at the same time with the development processing. Of course, it may be also possible to develop the photosensitive material with a solution not containing a water-soluble polymer compound and then apply a desensitization treatment using an aqueous solution of the water-soluble polymer.

Examples of the water-soluble polymer compound used here include soybean polysaccharide, modified starch, gum arabic, dextrin, a cellulose derivative (e.g., carboxymethyl cellulose, carboxyethyl cellulose, methyl cellulose) and a modified product thereof, pullulan, polyvinyl alcohol and a derivative thereof, polyvinylpyrrolidone, polyacrylamide, an acrylamide copolymer, a vinyl methyl ether/maleic anhydride copolymer, a vinyl acetate/maleic anhydride copolymer and a styrene/maleic anhydride copolymer.

As for the soybean polysaccharide, those conventionally known may be used. For example, the soybean polysaccharide is commercially available under the trade name of Soyafive (produced by Fuji Oil Co., Ltd.), and various grade products may be used. Those having a viscosity of 10 to 100 mPa/sec in a 10 mass % aqueous solution can be preferably used.

The modified starch is preferably a modified starch represented by the following formula (III). As for the starch represented by formula (III), any starch such as corn, potato, tapioca, rice and wheat can be used. This starch can be modified, for example, by a method of decomposing the starch with an acid, an enzyme or the like in the range of the number of glucose residues per molecule being from 5 to 30, and further adding oxypropylene in an alkali.

(III)

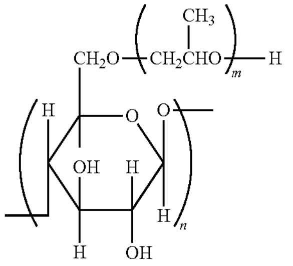

(wherein the etherification degree (substitution degree) is from 0.05 to 1.2 per glucose unit, n represents an integer of 3 to 30, and m represents an integer of 1 to 3).

Among these water-soluble polymer compounds, preferred are, for example, soybean polysaccharide, modified starch, gum arabic, dextrin, carboxymethyl cellulose and polyvinyl alcohol.

Two or more kinds of water-soluble polymer compounds may be used in combination. The content of the water-soluble polymer compound in the developing solution is preferably from 0.1 to 20 mass %, more preferably from 0.5 to 10 mass %.

In the present invention, the water-soluble polymer compound is incorporated into the developing solution containing the specific surfactant and having a specific pH, whereby a desensitization treatment can be performed simultaneously with the development processing. Also, in order to ensure the desensitization treatment, the photosensitive material may be brought into contact with an aqueous solution containing the water-soluble polymer compound after the development processing with the developing solution.

In addition to those described above, the developing solution of the present invention may contain a wetting agent, an antiseptic, a chelating compound, a defoaming agent, an organic acid, an organic solvent, an inorganic acid, an inorganic salt and the like.

Examples of the wetting agent which can be suitably used include ethylene glycol, propylene glycol, triethylene glycol, butylene glycol, hexylene glycol, diethylene glycol, dipropylene glycol, glycerin, trimethylolpropane and diglycerin. One of these wetting agents may be used alone, or two or more species thereof may be used in combination. The wetting agent is generally used in an amount of 0.1 to 5 mass % based on the entire mass of the developing solution.

Examples of the antiseptic which can be preferably used include phenol or a derivative thereof, formalin, an imidazole derivative, sodium dehydroacetate, a 4-isothiazolin-3-one derivative, benzisothiazolin-3-one, 2-methyl-4-isothiazolin-3-one, a benzotriazole derivative, an amidine-guanidine derivative, quaternary ammonium salts, a pyridine, quinoline or guanidine derivative, diazine, a triazole derivative, oxazole, an oxazine derivative, nitrobromoalcohol-based 2-bromo-2-nitropropane-1,3-diol, 1,1-dibromo-1-nitro-2-ethanol and 1,1-dibromo-1-nitro-2-propanol.

The amount of the antiseptic added is an amount large enough to stably exert the effect on bacterium, fungus, yeast and the like and is preferably from 0.01 to 4 mass % based on the developing solution in use, though this may vary depending on the kind of bacterium, fungus, yeast or the like. Also, it is preferred to use two or more kinds of antiseptics for exerting the effect on various fungi and bacteria.

Examples of the chelating compound include ethylenediaminetetraacetic acid and its potassium and sodium salts; diethylenetriaminepentaacetic acid and its potassium and sodium salts; triethylenetetraminehexaacetic acid and its potassium and sodium salts; hydroxyethylethylenediaminetriacetic acid and its potassium and sodium salts; nitrotriacetic acid and its sodium salt; 1-hydroxyethane-1,1-diphosphonic acid and its potassium and sodium salts; organic phosphonic acids such as aminotri(methylene-phosphonic acid) and its potassium and sodium salts; and phosphonoalkane tricarboxylic acids. Other than the sodium and potassium salts of these chelating agents, organic amine salts are also effective.

A chelating agent which stably exists in the composition of the developing solution and does not inhibit the printing performance is selected. The amount added thereof is suitably from 0.001 to 1.0 mass % based on the developing solution in use.

As for the defoaming agent, a general self-emulsion-type or emulsion-type silicon-based compound, a nonionic compound having an HLE of 5 or less, and the like may be used. A silicon defoaming agent is preferred. A silicon defoaming agent of any type such as emulsion dispersion type or solubilization type may be used.

The content of the defoaming agent is suitably from 0.001 to 1.0 mass % based on the developing solution in use.

Examples of the organic acid include a citric acid, an acetic acid, an oxalic acid, a malonic acid, a salicylic acid, a caprylic acid, a tartaric acid, a malic acid, a lactic acid, a levulinic acid, a p-toluenesulfonic acid, a xylenesulfonic acid, a phytic acid and an organic phosphonic acid. The organic acid may also be used in the form of an alkali metal salt or ammonium salt thereof. The content of the organic acid is preferably from 0.01 to 0.5 mass % based on the entire mass of the developing solution.

Examples of the organic solvent which can be contained include aliphatic hydrocarbons (e.g., hexane, heptane, "Isopar E, H and G" (produced by Esso Chemicals Ltd.), gasoline, kerosene), aromatic hydrocarbons (e.g., toluene, xylene), halogenated hydrocarbons (e.g., methylene dichloride, ethylene dichloride, trichlene, monochloro-benzene), and polar solvents.

Examples of the polar solvent include alcohols (e.g., methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methylphenylcarbinol, n-amyl alcohol, methylamyl alcohol), ketones (e.g., acetone, methyl ethyl ketone, ethyl butyl ketone, methyl isobutyl ketone, cyclohexanone), esters (e.g., ethyl acetate, propyl acetate, butyl acetate, amyl acetate, benzyl acetate, methyl lactate, butyl lactate, ethylene glycol monobutyl acetate, propylene glycol monomethyl ether acetate, diethylene glycol acetate, diethyl phthalate, butyl levulinate), and others (e.g., triethyl phosphate, tricresyl phosphate, N-phenylethanolamine, N-phenyldiethanolamine).

In the case where the organic solvent is insoluble in water, the organic solvent may be used after solubilizing it in water by using a surfactant or the like. In the case of containing an organic solvent in the developing solution, the concentration of the solvent is preferably less than 40 mass % in view of safety and inflammability.

Examples of the inorganic acid and inorganic salt include phosphoric acid, metaphosphoric acid, monoammonium phosphate, diammonium phosphate, monosodium phosphate, disodium phosphate, monopotassium phosphate, dipotassium phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogensulfate and nickel sulfate. The content of the inorganic salt is preferably 0.01 to 0.5 mass % based on the entire mass of the developing solution.

The developing solution of the present invention is obtained by dissolving or dispersing the above-described components in water, if desired. The solid content concentration of the developing solution is preferably from 2 to 25 mass %. It may also be possible to prepare a concentrate solution and dilute it with water on use.

The pH of the developing solution of the present invention is from 2 to 10. A high pH is advantageous in terms of developability and dispersibility of the photo-sensitive layer, but a low pH is advantageous for the printing performance, particularly staining. Accordingly, in view of balance therebetween, the pH is preferably from 3 to 9, more preferably 4 to 8.

Examples of the method for brining the lithographic printing plate precursor for use in the present invention into contact with the developing solution include manual processing, dip processing and mechanical processing such as horizontal transfer processing.

The exposed lithographic printing plate precursor is heated in a preheating part provided in advance of the development. The printing plate precursor is preferably inserted and heated in the preheating part within 1 minute after exposure, and the heating temperature is generally from 50 to 150° C.

After the preheating, pre-washing is provided, where the plate is cooled and at the same time, the protective layer is removed.

The means for these preheating and pre-washing and for the development described later are often connected to a setter for exposure. The present invention is of course not limited thereto, and these means may be used in a separated state.

The preheating and pre-washing are described above, but the processing may be in a mode where these two steps are omitted. When these steps are omitted, the processing becomes simple. In omitting these steps, both steps may be omitted or either one step may be omitted, and this may be selected depending on the performance of the material.

The development is described below. Examples of the manual processing include a method of fully impregnating a sponge or absorbent cotton with the aqueous solution, processing the plate by rubbing the entire surface thereof with the sponge or absorbent cotton, and after the completion of processing, thoroughly washing the plate with water. Examples of the dip processing include a method of dipping the lithographic printing plate precursor in a vat or deep tank containing the aqueous solution for about 60 seconds with stirring, and thoroughly washing the plate with water while rubbing it with absorbent cotton or a sponge.

In the development processing, an apparatus allowing for simplification of the structure and process is used in accordance with the development method of the present invention. The developing solution is less affected by carbon dioxide in air as compared with conventional alkali development systems and therefore, the shielding degree of the solution from air can be reduced. In the case of performing a desensitization treatment at the same time with development, unlike conventional systems, it is not necessarily required to provide water-washing and desensitization steps after development, and the system may suffice if one bath or two baths at most are provided. Also, even if a desensitizing agent such as water-soluble resin is not charged, when a desensitization treatment is performed using a conventional gum solution or the like in the subsequent step without water washing, the same performance as in conventional systems can be obtained. Furthermore, when only one bath is provided by using one developing solution not containing a desensitizing agent such as water-soluble resin, the surface protection or desensitizing property may be poor as compared with conventional systems, but printing can be performed and therefore, the bath can be formulated as a system for simple processing. That is, even in this case, when two baths are provided, a system can be established, as a result, the apparatus can be reduced in its cost and can be installed in a space by far smaller than the space conventionally required for the apparatus. In addition, the above-described material may be applied to an automatic developing machine (comprising preheating, pre-washing, development, water washing and finishing <gumming> steps) which has been heretofore used for the processing, and in this case, although the same processing solution may be used for the development step and the finishing step, the design of the processing solution for use in the development step can be made simpler. This is a construction that only one bath is provided by using one developing solution not containing a desensitizing agent such as water-soluble resin and a conventionally employed finishing solution (gum solution) is used for the finishing bath. By virtue of setting up such a construction, the developing solution can be applied to the conventionally employed automatic developing machine, and the equipment can be effectively used.

Since a rubbing member is generally indispensable for the development processing, a rubbing member such as brush is disposed in the developing bath for removing the photosensitive layer in the non-image part.

The surfactant for use in the present invention enables to greatly reduce the load on the rubbing member such as brush. Usually, the non-image part cannot be removed with a developing solution in the region from low alkaline to acidic unless the development is performed under strong rubbing conditions so as to remove the non-image part of the photosensitive layer. However, the developing solution using the surfactant for use in the present invention enables development with a rubbing member and rubbing conditions (rotation number, brush pressure) of the same level as those employed in normal alkali development.

Of course, a gum coater and an automatic developing machine, which have been heretofore known for PS plates and CTP plates, may also be used in this system. In the case of using a conventional automatic developing machine, examples of the processing method include a method of pumping up the developing solution charged in a developing tank and spraying it from a spray nozzle, a method of processing a printing plate by dipping and conveying it in a tank filled with the developing solution by means of an in-liquid guide roll or the like, and a so-called disposable processing method of processing a printing plate by supplying a substantially unused developing solution in a necessary amount every one plate. Any of these methods can be applied. In all methods, a system having a rubbing mechanism by a brush, molleton or the like is more preferred. Furthermore, an apparatus where a laser exposure part and an automatic developing machine part are integrally incorporated may also be used.

[Lithographic Printing Plate Precursor]

The lithographic printing plate precursor for use in the plate-making method of the present invention comprises a support having thereon a negative image recording layer which is removable with either one or both of printing ink and fountain solution and is cured upon exposure. From the standpoint that the layer is easily developed and good press life is obtained, the negative image recording layer is a polymerizable image recording layer containing, as essential components, (1) a polymerization initiator, (2) a polymerizable compound and (3) a hydrophobic binder polymer. The constituent elements and components of the lithographic printing plate precursor, such as image recording layer and support, are described below.

(Image Recording Layer)

<Polymerization Initiator>

The polymerization initiator for use in the present invention is a compound capable of generating a radical or an acid by the effect of light or heat energy and initiating and accelerating the polymerization of a polymerizabie unsaturated group-containing compound. This polymerization initiator can be appropriately selected from known radical or acid generators and compounds having a bond of which bonding/dissociation energy is small.

Examples of the compound capable of generating a radical or an acid include an organohalogen compound, a carbonyl compound, an organic peroxide, an azo-based compound, an azide compound, a metallocene compound, a hexaarylbiimidazole compound, an organoboron compound, a disulfone compound, an oxime ester compound and an onium salt compound.

Specific examples of the organchalogen compound include the compounds described in Wakabayashi et al., *Bull. Chem. Soc. Japan,* 42, 2924 (1969), U.S. Pat. No. 3,905,815, JP-B-46-4605 (the term "JP-B" as used herein means an "examined Japanese patent publication"), JP-A-48-36281, JP-A-53-133428, JP-A-55-32070, JP-A-60-239736, JF-A-61-169835, JP-A-61-169837, JP-A-62-58241, JP-A-62-212401, JP-A-63-70243, JP-A-63-298339, and M. P. Hutt, *Journal of Heterocyclic Chemistry,* 1, No. 3 (1970). In particular, an oxazole compound and an S-triazine compound, which are substituted by a trihalomethyl group, are preferred.

An s-triazine derivative where at least one mono-, di- or tri-halogenated methyl group is bonded to the s-triazine ring, and an oxadiazole derivative where the halogenated methyl group is bonded to the oxadiazole ring, are more preferred. Specific examples thereof include 2,4,6-tris(monochloromethyl)-s-triazine, 2,4,6-tris-(dichloromethyl)-s-triazine, 2,4,6-tris(trichloromethyl)-s-triazine, 2-methyl-4,6-bis(trichloromethyl)-s-triazine, 2-n-propyl-4,6-bis trichloromethyl)-s-triazine, 2-($\alpha$,$\alpha$,$\beta$-trichloroethyl)-4,6-his(trichloromethyl)-s-triazine, 2-(3,4-epoxyphenyl)-4,6-bis(trichloromethyl)-s-triazine, 2-[1-(p-methoxyphenyl)-2,4-butadienyl]-4,6-bis (trichloromethyl)-s-triazine, 2-styryl-4,6-bis (trichloromethyl)-s-triazine, 2-(p-methoxystyryl)-4,6-bis (tricoloromethyl)-s-triazine, 2-(p-i-propyloxystyryl)-4,6-his trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-his(trichloromethyl)-s-triazine, 2-benzylthio-4,6-his(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine, and the following compounds.

(I)-1

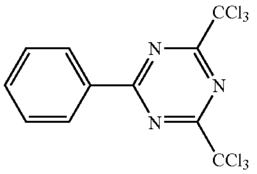

(I)-2

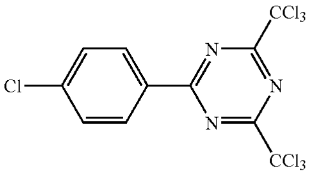

(I)-3

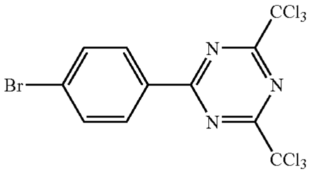

(I)-4

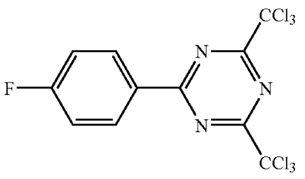

(I)-5

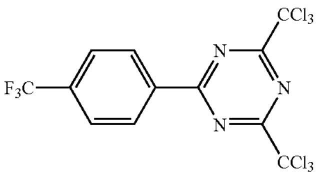

(I)-6

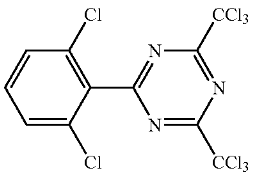

(I)-7

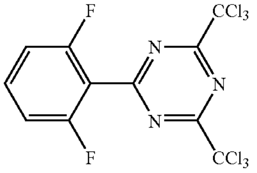

(I)-8

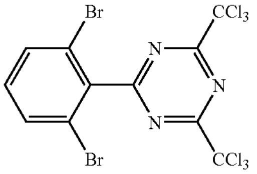

-continued
(I)-9
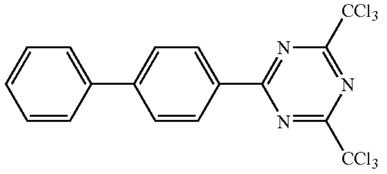
(I)-10
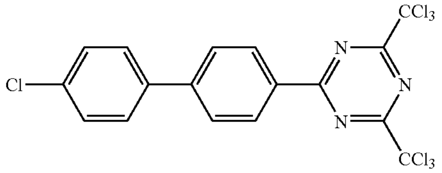
(I)-11
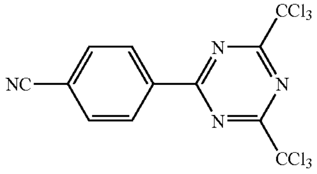
(I)-12
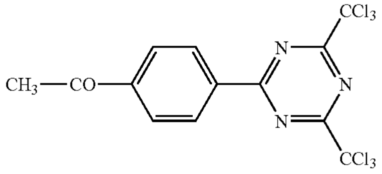
(I)-13
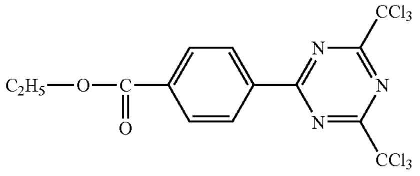
(I)-14
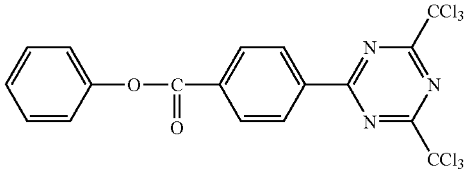
(I)-15
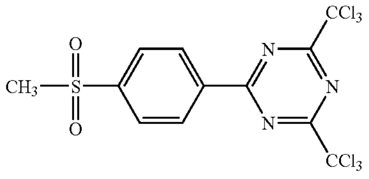
(I)-16
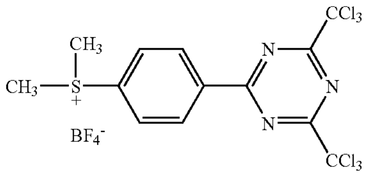
-continued
(I)-17
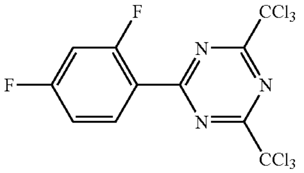
(I)-18
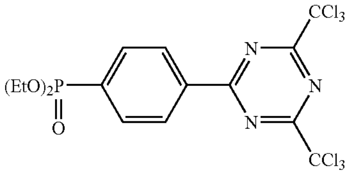
(I)-19
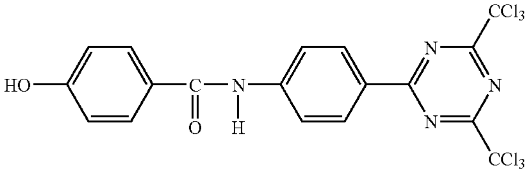
(I)-20
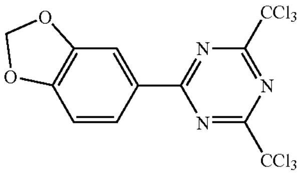
(I)-21
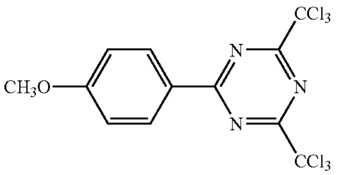
(I)-22
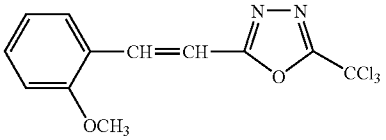
(I)-23
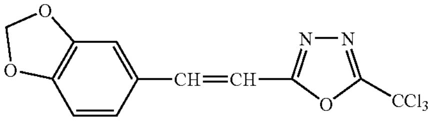
(I)-24
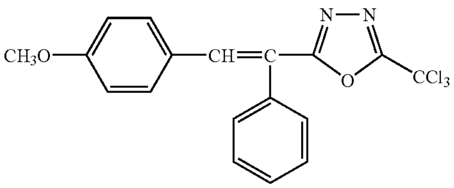
(I)-25
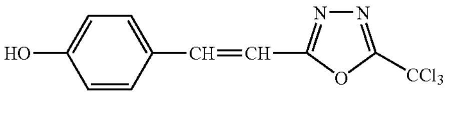

-continued (I)-26

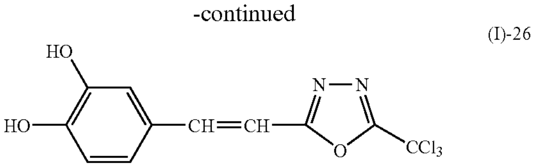

(I)-27

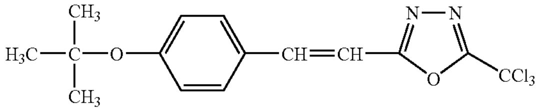

Examples of the carbonyl compound include benzophenone, a benzophenone derivative such as Michler's ketone, 2-methylbenzo-phenone, 3-methylbenzophenone, 4-methylbenzo-phenone, 2-chlorobenzophenone, 4-bromobenzophenone and 2-carboxybenzophenone, an acetophenone derivative such as 2,2-dimethoxy-2-phenylacetophenone, 2,2-diethoxyacetophenone, 1-hydroxycyclohexyl phenyl ketone, α-hydroxy-2-methylphenylpropanone, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propanone and 1,1,1-trichloromethyl-(p-butylphenyl)ketone, thioxanthone, a thioxanthone derivative such as 2-ethylthioxanthone, 2-isopropylthioxanthone, 2-chloro-thioxanthone, 2,4-dimethylthioxanthone, 2,4-diethyl-thioxanthone and 2,4-diisopropylthioxanthone, and a benzoic acid ester derivative such as ethyl p-dimethylaminobenzoate and ethyl p-diethylaminobenzoate.

Examples of the azo compound which can be used include azo compounds described in JP-A-8-108621.

Examples of the organic peroxide include trimethyl-cyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butyl-peroxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic peroxide, benzoyl peroxide, 2,4-dichlorobenzyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl)peroxydicarbonate, tert-butyl peroxyacetate, tert-butyl peroxypivalate, tert-butyl peroxyneodecanoate, tert-butyl peroxyoctanoate, tert-butyl peroxylaurate, tert-carbonate, 3,3',4,4'-tetra(tert-butyl-peroxycarbonyl)benzophenone, 3,3',4,4'-tetra(tert-hexyl-peroxycarbonyl)benzophenone, 3,3',4,4'-tetra(p-isopropyl-cumylperoxycarbonyl)benzophenone, carbonyl di(tert-butylperoxydihydrogendiphthalate) and carbonyl di(tert-hexylperoxydihydrogendiphthalate).

Examples of the metallocene compound include various titanocene compounds described in JP-A-59-152396, JP-A-61-151197, JP-A-63-41484, JP-A-2-249, JP-A-2-4705 and JP-A-5-83588, such as dicyclopentadienyl-Ti-bis-phenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl and dimethylcyclopentadienyl-Ti-bis-2,3,4,5,6-pentafluorophen-1-yl, and iron-arene complexes described in JP-A-1-304453 and JP-A-1-152109.

Examples of the hexaarylbiimidazole compound include various compounds described in JP-B-6-29285 and U.S. Pat. Nos. 3,479,185, 4,311,783 and 4,622,286, such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4',5,5'-tetraphenylbiimidazole.

Examples of the organoboron compound include organoborates described in JP-A-62-143044, JP-A-62-150242, JP-A-9-188685, JP-A-9-188686, JP-A-9-188710, JP-A-2000-131837, JP-A-2002-107916, Japanese Patent 2764769, JP-A-2002-116539 and Martin Kunz, *Rad Tech '98. Proceeding Apr.* 19-22, 1998, *Chicago*; organoboron sulfonium complexes and organoboron oxosulfonium complexes described in JP-A-6-157623, JP-A-6-175564 and JP-A-6-175561; organoboron iodonium complexes described in JP-A-6-175554 and JP-A-6-175553; organoboron phosphonium complexes described in JP-A-9-188710; and organoboron transition metal coordination complexes described in JP-A-6-348011, JP-A-7-128785, JP-A-7-140589, JP-A-7-306527 and JP-A-7-292014.

Examples of the disulfone compound include compounds described in JP-A-61-166544 and JP-A-2003-328465.

Examples of the oxime ester compound include compounds described in *J.C.S. Perkin II,* 1653-1660 (1979), *J.C.S. Perkin II,* 156-162 (1979), *Journal of Photopolymer Science and Technology,* 202-232 (1995), JP-A-2000-66385 and JP-A-2000-80068. Specific examples thereof include the compounds shown by the following structural formulae.

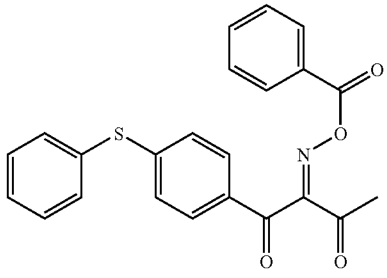

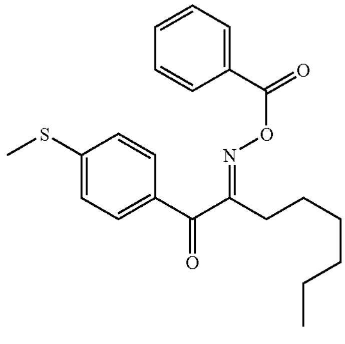

-continued
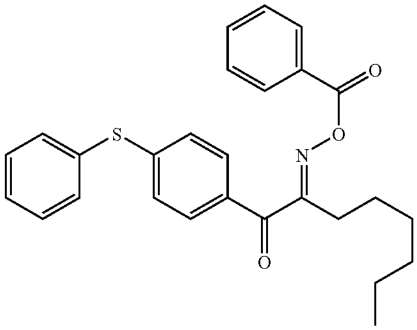
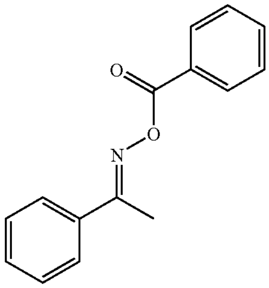
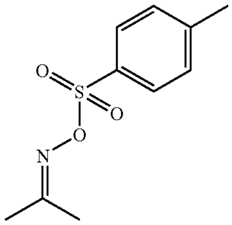
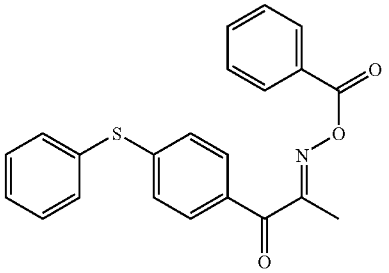
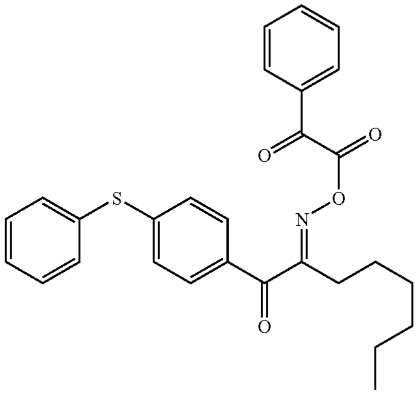
-continued
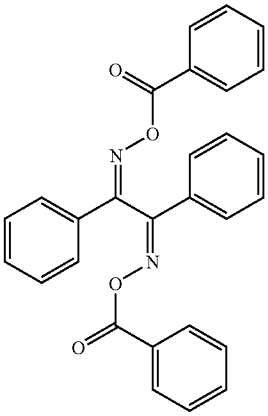
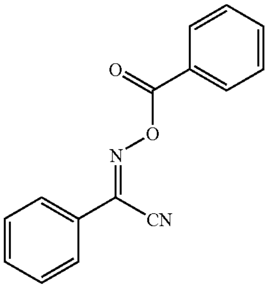
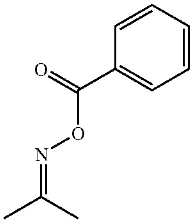
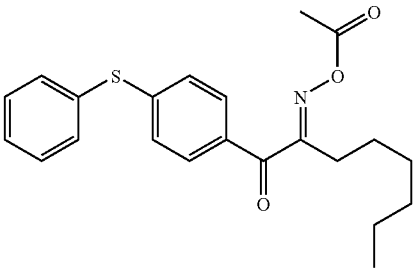
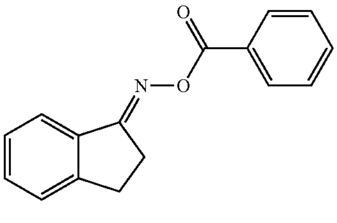

-continued

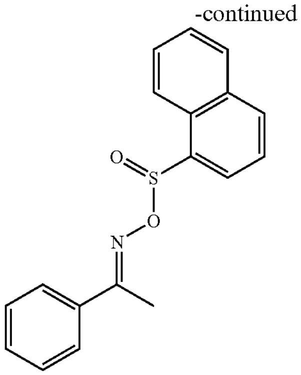

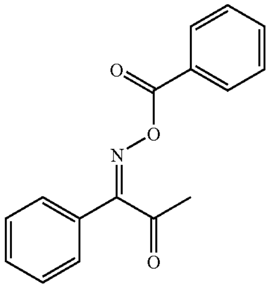

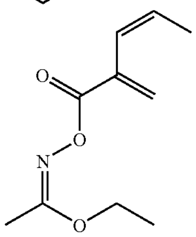

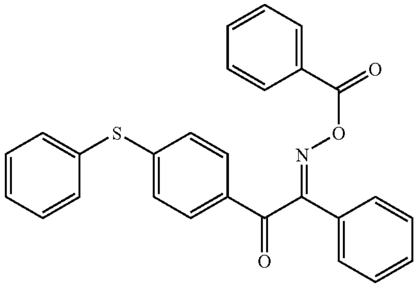

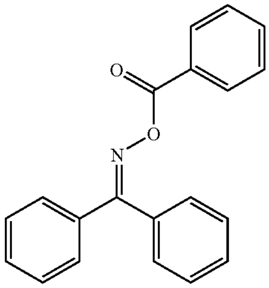

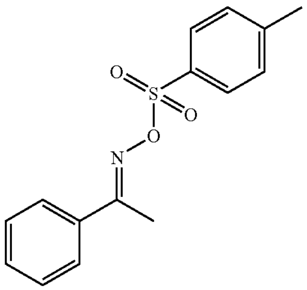

-continued

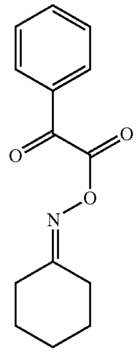

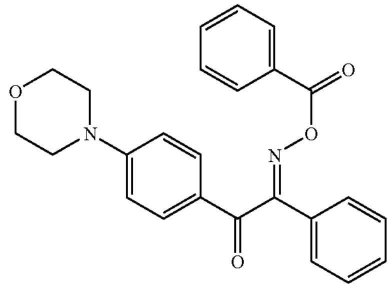

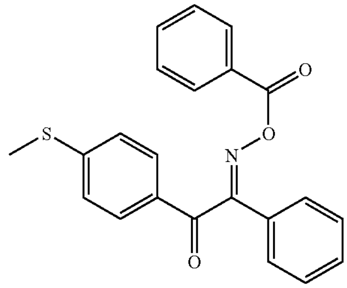

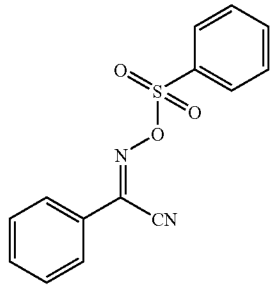

Examples of the onium salt compound include onium salts such as diazonium salts described in S. I. Schlesinger, *Photogr. Sci. Eng.,* 18, 387 (1974) and T. S. Bal et al., *Polymer,* 21, 423 (1980), ammonium salts described in U.S. Pat. No. 4,069,055 and JP-A-4-365049, phosphonium salts described in U.S. Pat. Nos. 4,069,055 and 4,069,056, iodonium salts described in European Patent 104,143, U.S. Pat. Nos. 339,049 and 410,201, JP-A-2-150848 and JP-A-2-296514, sulfonium salts described in European Patents 370,693, 390,214, 233,567, 297,443 and 297,442, U.S. Pat. Nos. 4,933,377, 161,811, 410,201, 339,049, 4,760,013, 4,734,444 and 2,833,827, and German Patents 2,904,626, 3,604,580 and 3,604,581, selenonium salts described in J. V. Crivello et al., *Macromolecules,* 10 (6), 1307 (1977) and J. V. Crivello et al., *J. Polymer Sci.*, Polymer Chem. Ed., 17, 1047 (1979), and arsonium salts described in C. S. Wen et al., *Teh. Proc. Conf. Rad. Curing ASIA*, p. 478, Tokyo, October (1988).

The onium salt suitably used in the present invention is an onium salt represented by any one of the following formulae (RI-I) to (RI-III):

(RI-I)

(RI-II)

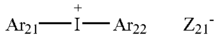

(RI-III)

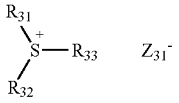

In formula (RI-I), $Ar_{11}$ represents an aryl group having a carbon number of 20 or less, which may have from 1 to 6 substituent(s), and preferred examples of the substituent include an alkyl group having a carbon number of 1 to 12, an alkenyl group having a carbon number of 1 to 12, an alkynyl group having a carbon number of 1 to 12, an aryl group having a carbon number of 1 to 12, an alkoxy group having a carbon number of 1 to 12, an aryloxy group having a carbon number of 1 to 12, a halogen atom, an alkylamino group having a carbon number of 1 to 12, a dialkylamino group having a carbon number of 1 to 12, an alkylamido or arylamido group having a carbon number of 1 to 12, a carbonyl group, a carboxyl group, a cyano group, a sulfonyl group, a thioalkyl group having a carbon number of 1 to 12, and a thioaryl group having a carbon number of 1 to 12. $Z_{11}^-$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, preferred in view of stability are perchlorate ion, hexafluorophosphate ion, tetrafluoroborate ion, sulfonate ion and sulfinate ion.

In formula (RI-II), $Ar_{21}$ and $Ar_{22}$ each independently represents an aryl group having a carbon number of 20 or less, which may have from 1 to 6 substituent(s), and preferred examples of the substituent include an alkyl group having a carbon number of 1 to 12, an alkenyl group having a carbon number of 1 to 12, an alkynyl group having a carbon number of 1 to 12, an aryl group having a carbon number of 1 to 12, an alkoxy group having a carbon number of 1 to 12, an aryloxy group having a carbon number of 1 to 12, a halogen atom, an alkylamino group having a carbon number of 1 to 12, a dialkylamino group having a carbon number of 1 to 12, an alkylamido or arylamido group having a carbon number of 1 to 12, a carbonyl group, a carboxyl group, a cyano group, a sulfonyl group, a thioalkyl group having a carbon number of 1 to 12, and a thioaryl group having a carbon number of 1 to 12. $Z_{21}^-$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, preferred in view of stability and reactivity are perchlorate ion, hexafluorophosphate ion, tetrafluoroborate ion, sulfonate ion, sulfinate ion and carboxylate ion.

In formula (RI-III), $R_{31}$, $R_{32}$ and $R_{33}$ each independently represents an aryl, alkyl, alkenyl or alkynyl group having a carbon number of 20 or less, which may have from 1 to 6 substituent(s). In view of reactivity and stability, an aryl group is preferred. Examples of the substituent include an alkyl group having a carbon number of 1 to 12, an alkenyl group having a carbon number of 1 to 12, an alkynyl group having a carbon number of 1 to 12, an aryl group having a carbon number of 1 to 12, an alkoxy group having a carbon number of 1 to 12, an aryloxy group having a carbon number of 1 to 12, a halogen atom, an alkylamino group having a carbon number of 1 to 12, a dialkylamino group having a carbon number of 1 to 12, an alkylamido or arylamido group having a carbon number of 1 to 12, a carbonyl group, a carboxyl group, a cyano group, a sulfonyl group, a thioalkyl group having a carbon number of 1 to 12, and a thioaryl group having a carbon number of 1 to 12. $Z_{31}^-$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, preferred in view of stability and reactivity are perchlorate ion, hexafluorophosphate ion, tetrafluoroborate ion, sulfonate ion, sulfinate ion and carboxylate ion. The carboxylate ion described in JP-A-2001-343742 is more preferred, and the carboxylate ion described in JP-A-2002-148790 is still more preferred.

(N-1)

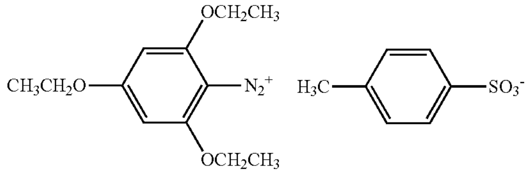

(N-2)

$PF_6^-$ (N-3)

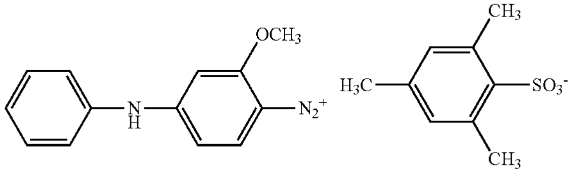

(N-4)

$ClO_4^-$ (N-5)

$PF_6^-$ (N-6)

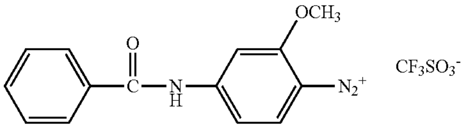

(N-7)

$BF_4^-$ (N-8)

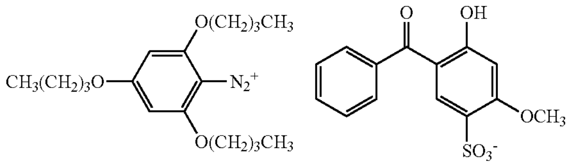

(N-9)

$ClO_4^-$ (N-10)

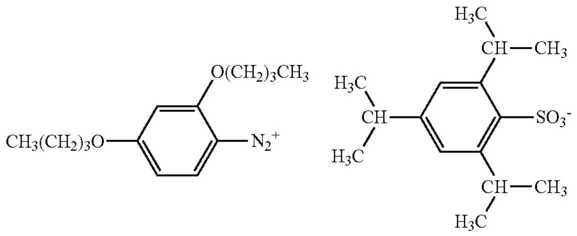

-continued
(N-11)
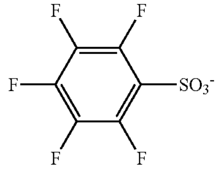
(N-12)
$PF_6^-$
(N-13)
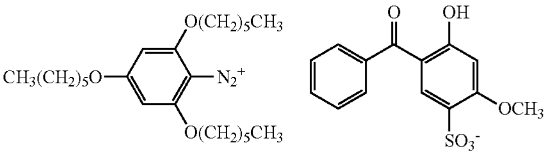
(N-14)
$ClO_4^-$
(N-15)
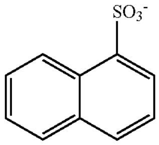
(N-16)
$PF_6^-$
(N-17)
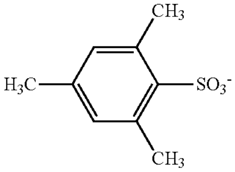
(I-1)
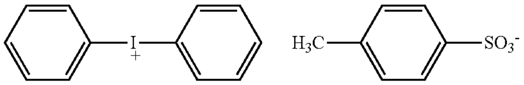
(I-2)
$PF_6^-$ 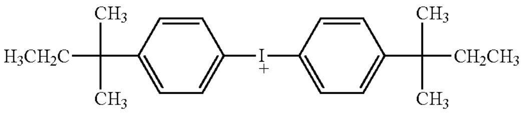
(I-3)
$PF_6^-$
(I-4)
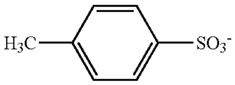
(I-5)
$ClO_4^-$
(I-6)
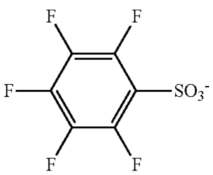
(I-7)
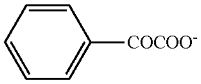
(I-8)
$CF_3SO_3^-$
-continued
(I-9)
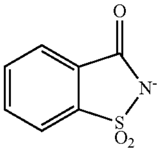
(I-10)
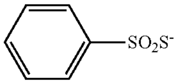
(I-11)
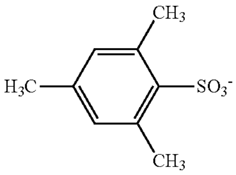
(I-12)
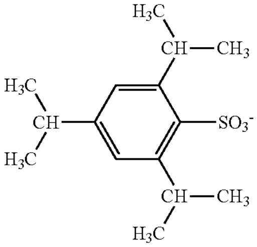
(I-13)
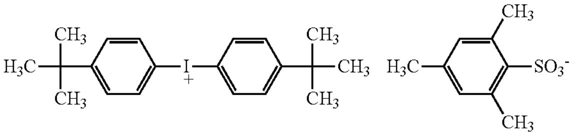
(I-14)
$ClO_4^-$
(I-15)
$PF_6^-$
(I-16)
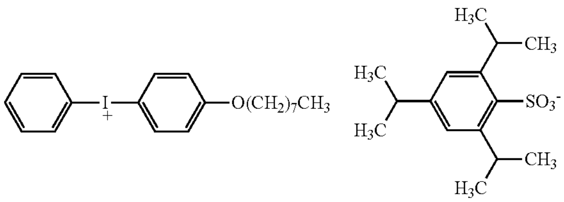
(I-17)
$CF_3COO^-$
(I-18)
$CF_3SO_3^-$
(I-19)
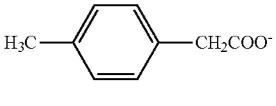
(I-20)
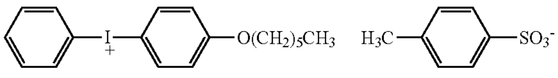
(I-21)
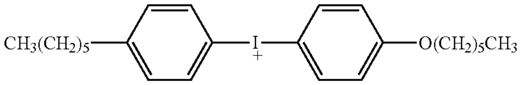

-continued
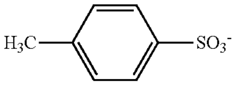
(I-22)
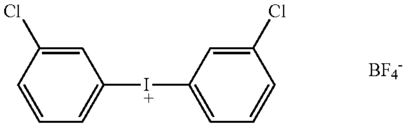
(I-23)
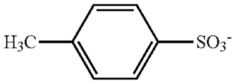
(I-18)
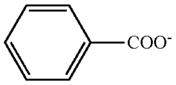
(S-1)
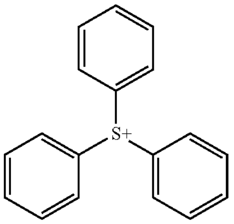
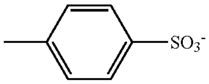
(S-2)
$PF_6^-$
(S-3)
$ClO_4^-$
(S-4)
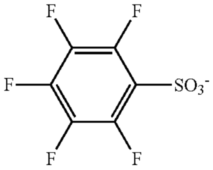
(S-5)
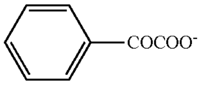
(S-6)
$CF_3SO_3^-$
(S-7)
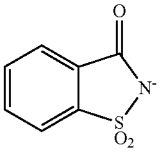
(S-8)
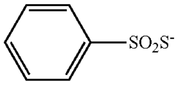
(S-9)
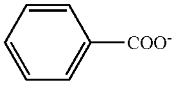
-continued
(S-10)
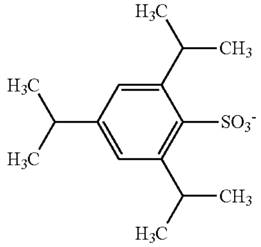
(S-11)
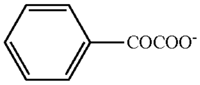
(S-12)
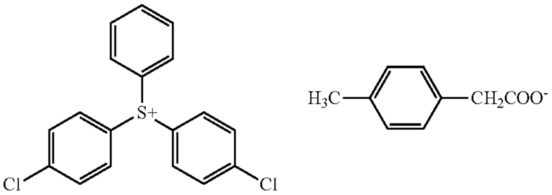
(S-13)
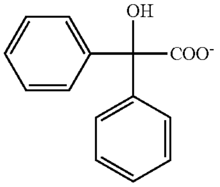
(S-14)
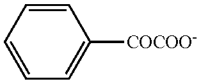
(S-15)
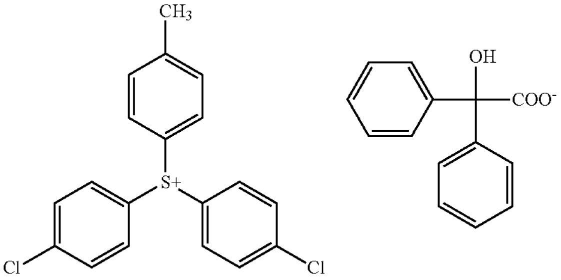
(S-16)
$BF_4^-$
(S-17)
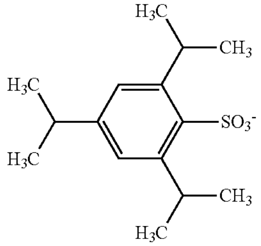

-continued (S-18)

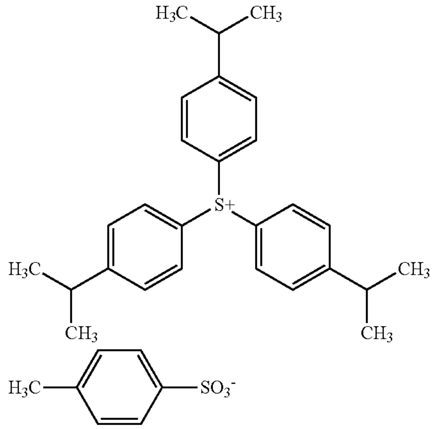

The polymerization initiator is not limited to those described above but particularly in view of reactivity and stability, a triazine-based initiator, an organohalogen compound, an oxime ester compound, a diazonium salt, an iodonium salt and a sulfonium salt are more preferred.

One of these polymerization initiators may be used alone, or two or more thereof may be used in combination. Also, the polymerization initiator may be added together with other components in the same layer or may be added to a layer separately provided. The amount of the polymerization initiator added is preferably from 0.1 to 50 mass %, more preferably from 0.5 to 30 mass %, still more preferably from 0.8 to 20 mass %, based on all solid contents constituting the image recording layer.

<Polymerizable Compound>

The polymerizable compound which can be used in the present invention is an addition-polymerizable compound having at least one ethylenically unsaturated double bond and is selected from compounds having at least one, preferably two or more, ethylenically unsaturated bond(s) Such compounds are widely known in this industrial field, and these known compounds can be used in the present invention without any particular limitation.

These compounds have a chemical mode such as monomer, prepolymer (that is, dimer, trimer or oligomer) or a mixture thereof. Examples of such a monomer and its copolymer include an unsaturated carboxylic acid (e.g., acrylic acid, methacrylic acid, itaconic acid, crotonic acid, isocrotonic acid, maleic acid), and esters and amides thereof. Among these, preferred are esters of an unsaturated carboxylic acid with an aliphatic polyhydric alcohol compound, and amides of an unsaturated carboxylic acid with an aliphatic polyvalent amine compound. Also, an addition reaction product of an unsaturated carboxylic acid ester or amide having a nucleophilic substituent such as hydroxyl group, amino group or mercapto group with a monofunctional or polyfunctional isocyanate or epoxy, and a dehydrating condensation reaction product with a monofunctional or polyfunctional carboxylic acid may be suitably used. Furthermore, an addition reaction product of an unsaturated carboxylic acid ester or amide having an electrophilic substituent such as isocyanate group or epoxy group with a monofunctional or polyfunctional alcohol, amine or thiol, and a displacement reaction product of an unsaturated carboxylic acid ester or amide having a desorptive substituent such as halogen group or tosyloxy group with a monofunctional or polyfunctional alcohol, amine or thiol may also be suitably used. In addition, compounds where the unsaturated carboxylic acid of the compounds above is replaced by an unsaturated phosphonic acid, styrene, vinyl ether or the like, may also be used.

Specific examples of the ester monomer of an aliphatic polyhydric alcohol compound with an unsaturated carboxylic acid include the followings. Examples of the acrylic acid ester include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer and isocyanuric acid EO-modified triacrylate.

Examples of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)-phenyl]dimethylmethane and bis[p-(methacryloxyethoxy)-phenyl]dimethylmethane.

Examples of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate. Examples of the crotonic acid ester include ethylene glycol dicrotonate, tetramethylene glycol dicrotonate, pentaerythritol dicrotonate and sorbitol tetradicrotonate. Examples of the isocrotonic acid ester include ethylene glycol diisocrotonate, pentaerythritol diisocrotonate and sorbitol tetraisocrotonate. Examples of the maleic acid ester include ethylene glycol dimaleate, triethylene glycol dimaleate, pentaerythritol dimaleate and sorbitol tetramaleate.

Other examples of the ester which can be suitably used include aliphatic alcohol-based esters described in JP-B-51-47334 and JP-A-57-196231, those having an aromatic skeleton described in JP-A-59-5240, JP-A-59-5241 and JP-A-2-226149, and those containing an amino group described in JP-A-1-165613. These ester monomers may also be used as a mixture.

Specific examples of the amide monomer of an aliphatic polyvalent amine compound with an unsaturated carboxylic acid include methylenebisacrylamide, methylenebis-methacrylamide, 1,6-hexamethylenebis-acrylamide, 1,6-hexamethylenebis-methacrylamide, diethylenetriaminetris-acrylamide, xylylenebisacrylamide and xylylenebis-methacrylamide. Other preferred examples of the amide-type monomer include those having a cyclohexylene structure described in JP-B-54-21726.

A urethane-based addition-polymerizable compound produced by using an addition reaction of isocyanate with a hydroxyl group is also preferred, and specific examples thereof include a vinyl urethane compound having two or more polymerizable vinyl groups within one molecule described in JP-B-48-41708, which is obtained by adding a hydroxyl group-containing vinyl monomer represented by the following formula (A) to a polyisocyanate compound having two or more isocyanate groups within one molecule:

$$CH_2{=}C(R_4)COOCH_2CH(R_5)OH \quad (A)$$

(wherein $R_4$ and $R_5$ each represents H or $CH_3$).

In addition, urethane acrylates described in JP-A-51-37193, JP-B-2-32293 and JP-B-2-16765, and urethane compounds having an ethylene oxide-type skeleton described in JP-B-58-49860, JP-B-56-17654, JP-B-62-39417 and JP-B-62-39418 are also suitably used. Furthermore, when addition-polymerizable compounds having an amino or sulfide structure within the molecule described in JP-A-63-277653, JP-A-63-260909 and JP-A-1-105238 are used, a photopolymerizable composition having very excellent photosensitization speed can be obtained.

Other examples include a polyfunctional acrylate or methacrylate such as polyester acrylates described in JP-A-48-64183, JP-B-49-43191 and JP-B-52-30490 and epoxy acrylates obtained by reacting an epoxy resin with a (meth)acrylic acid. Also, a specific unsaturated compound described in JP-B-46-43946, JP-B-1-40337 and JP-B-1-40336, a vinyl phosphonic acid-based compound described in JP-A-2-25493, and the like may be used.

In some cases, a structure containing a perfluoroalkyl group described in JP-A-61-22048 is suitably used. Furthermore, those described as a photocurable monomer or oligomer in *Adhesion*, Vol. 20, No. 7; pp. 300-308 (1984) may also be used.

Examples of the vinyl ether group-containing compound for use in the present invention include compounds described in JP-A-2002-029162. Specific examples thereof include, but are not limited to, tetramethylene glycol divinyl ether, trimethylolpropane trivinyl ether, tetraethylene glycol divinyl ether, pentaerythritol divinyl ether, pentaerythritol trivinyl ether, pentaerythritol tetravinyl ether, 1,4-bis{2-(vinyloxy)ethyloxy}benzene, 1,2-bis{2-(vinyloxy)ethyloxy}benzene, 1,3-bis{2-(vinyloxy)-ethyloxy}benzene, 1,3,5-tris{2-(vinyloxy)ethyloxy}benzene, 4,4'-bis{2-(vinyloxy)ethyloxy}biphenyl, 4,4'-bis{2-(vinyloxy)ethyloxy}diphenyl ether, 4,4'-bis{2-(vinyloxy)-ethyloxy}diphenylmethane, 1,4-bis{2-(vinyloxy)ethyloxy}-naphthalene, 2,5-bis{2-(vinyloxy)ethyloxy}furan, 2,5-bis{2-(vinyloxy)ethyloxy}thiophene, 2,5-bis{2-(vinyloxy)-ethyloxy}imidazole, 2,2-bis[4-{2-(vinyloxy)ethyloxy}-phenyl]propane {bis(vinyloxyethyl)ether of bisphenol A}, 2,2-bis{4-(vinyloxymethyloxy)phenyl}propane and 2,2-bis{4-(vinyloxy)phenyl}propane.

Details of the manner of use of these addition-polymerizable compounds, such as structure, sole or combination use and amount added, can be freely selected in accordance with the designed performance of the final lithographic printing plate precursor and, for example, may be selected from the following standpoints.

In view of sensitivity, a structure having a large unsaturated group content per one molecule is preferred and in most cases, a bifunctional or greater functional compound is preferred. For increasing the strength of image part, namely, cured layer, a trifunctional or greater functional compound is preferred. Also, a method of controlling both sensitivity and strength by using a combination of compounds differing in the functional number or in the polymerizable group (for example, an acrylic acid ester, a methacrylic acid ester, a styrene-based compound and a vinyl ether-based compound) is effective.

The selection and manner of use of the addition-polymerizable compound are important factors also in view of compatibility and dispersibility with other components (e.g., water-insoluble polymer, initiator, colorant) in the image recording layer. For example, the compatibility may be enhanced by using a low-purity compound or using two or more kinds of compounds in combination. Also, a specific structure may be selected for the purpose of enhancing the adhesion to, for example, substrate or protective layer which is described later.

The polymerizable compound is preferably used in an amount of 5 to 80 mass %, more preferably from 25 to 75 mass %, based on all solid contents constituting the image recording layer. Also, one of these compounds may be used alone, or two or more thereof may be used in combination.

<Hydrophobic Binder Polymer>

The hydrophobic binder polymer for use in the image recording layer of the present invention is preferably a water-insoluble polymer, and the hydrophobic binder polymer usable in the present invention preferably contains substantially no acidic group such as carboxyl group, sulfone group and phosphoric acid group. The acid value of the binder polymer (the percentage acid content per g of polymer, expressed by the chemical equivalent number) is preferably 0.3 meq/g or less, more preferably 0.1 meq/g or less.

More specifically, the hydrophobic binder polymer usable in the present invention is preferably insoluble in water or an aqueous solution at a pH of 10 or more. The solubility of the hydrophobic binder polymer in water or an aqueous solution at a pH of 10 or more is preferably 0.5 mass % or less, more preferably 0.1 mass %. By virtue of using such a hydrophobic binder polymer, the film strength, water resistance and inking property of the image recording layer and in turn, the press life can be enhanced.

As for the hydrophobic binder polymer, conventionally known hydrophobic binder polymers may be freely used preferably within the range described above as long as the polymer does not impair the performance of the lithographic printing plate of the present invention. A linear organic polymer having film-forming property is preferred.

Preferred examples of such a hydrophobic binder polymer include a polymer selected from an acryl resin, a polyvinyl acetal resin, a polyurethane resin, a polyamide resin, an epoxy resin, a methacryl resin, a styrene-based resin and a polyester resin.

The hydrophobic binder polymer may be imparted with a crosslinking property so as to enhance the film strength in the image part. The crosslinking property may be imparted to the hydrophobic binder polymer by introducing a crosslinking functional group such as ethylenically unsaturated bond into the polymer. The crosslinking functional group may be introduced by copolymerization. Examples of the hydrophobic binder polymer having an ethylenically unsaturated bond within the molecule include a polymer which is a polymer of acrylic or methacrylic acid ester or amide and in which the ester or amide residue (R' in —COOR' or —CONHR') has an ethylenically unsaturated bond.

Examples of the residue (R' above) having an ethylenically unsaturated bond include $-(CH_2)_nCR^1{=}CR^2R^3$, $-(CH_2C)_n$ $CH_2CR^1{=}CR^2R^3$, $-(CH_2CH_2O)_n$ $CH_2CR^1{=}CR^2R^3$, $-(CH_2)_nNH-CO-O-CH_2CR^1{=}CR^2R^3$, $-(CH_2)_n-O-CO-CR^1{=}CR^2R^3$ and $-(CH_2CH_2O)_2-X$ (wherein $R^1$ to $R^3$ each represents a hydrogen atom, a halogen atom or an alkyl, aryl, alkoxy or aryloxy group having a carbon number of 1 to 20, $R^1$ and $R^2$ or $R^3$ may combine with each other to form a ring, n represents an integer of 1 to 10, and X represents a dicyclopentadienyl residue).

Specific examples of the ester residue include $-CH_2CH{=}CH_2$ (described in JP-B-7-21633), $-CH_2CH_2O-CH_2CH{=}CH_2$, $-CH_2C(CH_3){=}CH_2$, $-CH_2CH{=}CH-C_6H_5$, $-CH_2CH_2OCOCH{=}CH-C_6H_5$, $-CH_2CH_2-NHCOO-CH_2CH{=}CH_2$ and $-CH_2CH_2O-X$ (wherein X represents a dicyclopentadienyl residue).

Specific examples of the amide residue include $-CH_2CH{=}CH_2$, $-CH_2CH_2-Y$ (wherein Y represents a cyclohexene residue) and $-CH_2CH_2-OCO-CH{=}CH_2$.

In the hydrophobic binder polymer having a crosslinking property, for example, a free radical (a polymerization initiating radical or a radical grown in the process of polymerization of a polymerizable compound) is added to the crosslinking functional group to cause an addition-polymerization between polymers directly or through a polymerization chain of the polymerizable compound, as a result, crosslinking is formed between polymer molecules and curing is thereby effected. Alternatively, an atom (for example, a hydrogen atom on the carbon atom adjacent to the functional crosslinkable group) in the polymer is withdrawn by a free radical to produce a polymer radical, and the polymer radicals combine with each other, as a result, crosslinking is formed between polymer molecules and curing is thereby effected.

The content of the crosslinking group (content of the radical-polymerizable unsaturated double bond determined by iodine titration) in the hydrophobic binder polymer is preferably from 0.1 to 10.0 mmol, more preferably from 1.0 to 7.0 mmol, and most preferably from 2.0 to 5.5 mmol, per g of the hydrophobic binder polymer.

In view of enhancing the developability with an aqueous solution, the binder polymer is preferably hydrophilic. On the other hand, in view of enhancing the press life, it is important that the binder polymer has good compatibility with the polymerizable compound contained in the image recording layer, that is, the binder polymer is preferably lipophilic. From these aspects, in the present invention, copolymerization of a hydrophilic group and a lipophilic group in the hydrophobic binder polymer is also effective for enhancing the developability and press life. Examples of the hydrophilic group which can be suitably used include those having a hydrophilic group such as hydroxy group, carboxylate group, hydroxyethyl group, ethyleneoxy group, hydroxypropyl group; polyoxyethyl group, polyoxypropyl group/amino group, aminoethyl group, aminopropyl group, ammonium group, amide group and carboxymethyl group.

The hydrophobic binder polymer preferably has a weight average molecular weight of 5,000 or more, more preferably from 10,000 to 300,000, and a number average molecular weight of 1,000 or more, more preferably from 2,000 to 250,000. The polydispersity (weight average molecular weight/number average molecular weight) is preferably from 1.1 to 10.

The hydrophobic binder polymer may be a random polymer, a block polymer, a graft polymer or the like but is preferably a random polymer.

One of the hydrophobic binder polymers may be used alone, or two or more species thereof may be used as a mixture.

The content of the hydrophobic binder polymer is from 5 to 90 mass %, preferably from 10 to 70 mass %, more preferably from 10 to 60 mass %, based on the entire solid content of the image recording layer. Within this range, good strength of image part and good image-forming property can be obtained.

<Infrared Absorbent>

In the image recording layer of the lithographic printing plate precursor which is imagewise exposed using a light source of emitting infrared ray, an infrared absorbent may be used in combination with the above-described polymerization initiator. The infrared absorbent has a function of converting the absorbed infrared ray into heat and by the effect of heat generated here, the polymerization initiator thermally decomposes to generate a radical. The infrared absorbent for use in the present invention is a dye or pigment having an absorption maximum at a wavelength of 760 to 1,200 nm.

As for the dye, commercially available dyes and known dyes described in publications such as *Senryo Binran* (*Handbook of Dyes*), compiled by Yuki Cosei Kagaku Kyokai (1970) may be used. Specific examples thereof include dyes such as azo dye, metal complex salt azo dye, pyrazolone azo dye, naphthoquinone dye, anthraquinone dye, phthalocyanine dye, carbonium dye, quinoneimine dye, methine dye, cyanine dye, squarylium dye, pyrylium salt and metal thiolate complex.

Preferred examples of the dye include cyanine dyes described in JP-A-58-125246, JP-A-59-84356 and JP-A-60-78787, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792, and cyanine dyes described in British Patent 434,875.

Also, a near infrared absorbing sensitizer described in U.S. Pat. No. 5,156,938 may be suitably used. Furthermore, a substituted arylbenzo(thio)pyrylium salt described in U.S. Pat. No. 3,881,924, a trimethinethiapyrylium salt described in JP-A-57-142645 (corresponding to U.S. Pat. No. 4,327,169), a pyrylium-based compound described in JP-A-58-181051, JP-A-58-220143, JP-A-59-41363, JP-A-59-84249, JP-59-84249, JP-A-59-146063 and JP-A-59-146061, a cyanine dye described in JP-A-59-216146, a pentamethinethiapyrylium salt described in U.S. Pat. No. 4,283,475, and a pyrylium compound described in JP-B-5-13514 and JP-B-5-19702 may also be preferably used. Other preferred examples of the dye include near infrared absorbing dyes represented by formulae (I) and (II) of U.S. Pat. No. 4,756,993.

Among these dyes, preferred are a cyanine dye, a squarylium dye, a pyrylium salt, a nickel thiolate complex and an indolenine cyanine dye, more preferred are a cyanine dye and an indolenine cyanine dye, still more preferred is, for example, a cyanine dye represented by the following formula (II):

Formula (II):

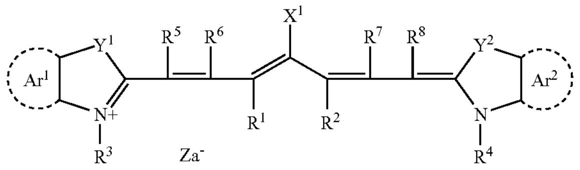

In formula (II), $X^1$ represents a hydrogen atom, a halogen atom, $-NPh_2$, $X^2$-$L^1$ or a group shown below:

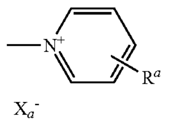

$X^2$ represents an oxygen atom, a nitrogen atom or a sulfur atom, and $L^1$ represents a hydrocarbon group having a carbon number of 1 to 12, a heteroatom-containing aromatic ring, or a heteroatom-containing hydrocarbon group having a carbon number of 1 to 12. The heteroatom as used herein indicates N, S, O, a halogen atom or Se. $X_a^-$ has the same definition as $Za^-$ described later, and $R^a$ represents a substituent selected from a hydrogen atom, an alkyl group, an aryl group, a substituted or unsubstituted amino group and a halogen atom.

$R^1$ and $R^2$ each independently represents a hydrocarbon group having a carbon number of 1 to 12. In view of storage stability of the coating solution for the recording layer, $R^1$ and $R^2$ each is preferably a hydrocarbon group having a carbon number of 2 to more, and $R^1$ and $R^2$ are more preferably combined with each other to form a 5- or 6-membered ring.

$Ar^1$ and $Ar^2$ may be the same or different and each represents an aromatic hydrocarbon group which may have a substituent. Preferred examples of the aromatic hydrocarbon group include a benzene ring and a naphthalene ring, and preferred examples of the substituent include a hydrocarbon group having a carbon number of 12 or less, a halogen atom and an alkoxy group having a carbon number of 12 or less. $Y^1$ and $Y^2$ may be the same or different and each represents a sulfur atom or a dialkylmethylene group having a carbon number of 12 or less. $R^3$ and $R^4$ may be the same or different and each represents a hydrocarbon group having a carbon number of 20 or less, which may have a substituent. Preferred examples of the substituent include an alkoxy group having a carbon number of 12 or less, a carboxyl group and a sulfo group. $R^5$, $R^6$, $R^7$ and $R^8$ may be the same or different and each represents a hydrogen atom or a hydrocarbon group having a carbon number of 12 or less and in view of availability of the raw material, is preferably a hydrogen atom. $Za^-$ represents a counter anion, but when the cyanine dye represented by formula (II) has an anionic substituent in its structure and neutralization of electric charge is not necessary, $Za^-$ is not present. In view of storage stability of the coating solution for the recording layers $Za^-$ is preferably halogen ion, perchlorate ion, tetrafluoroborate ion, hexafluorophosphate ion or sulfonate ion, more preferably perchlorate ion, hexafluorophosphate ion or arylsulfonate ion.

Specific examples of the cyanine dye represented by formula (II), which can be suitably used in the present invention, include those described in paragraphs [0017] to [0019] of JP-A-2001-133969.

Other preferred examples include a specific indolenine cyanine dye described in JP-A-2002-278057.

As for the pigment used as the infrared absorbent in the present invention, commercially available pigments and pigments described in *Color Index* (*C.I.*) *Binran* (*C.I. Handbook*), *Saishin Ganryo Binran* (*Handbook of Newest Pigments*), compiled by Nippon Ganryo Gijutsu Kyokai (1977), *Saishin Ganryo Oyo Gijutsu* (*Newest Pigment Application Technology*), C M C Shuppan (1986), and *Insatsu Ink Gijutsu* (*Printing Ink Technology*), C M C Shuppan (1984) can be used.

The kind of the pigment includes a black pigment, a yellow pigment, an orange pigment, a brown pigment, a red pigment, a violet pigment, a blue pigment, a green pigment, a fluorescent pigment, a metal powder pigment and a polymer bond pigment. Specific examples of the pigment which can be used include an insoluble azo pigment, an azo lake pigment, a condensed azo pigment, a chelate azo pigment, a phthalocyanine-based pigment, an anthraquinone-based pigment, a perylene- or perynone-based pigment, a thioindigo-based pigment, a quinacridone-based pigment, a dioxazine-based pigment, an isoindolinone-based pigment, a quinophthalone-based pigment, a dyed lake pigment, an azine pigment, a nitroso pigment, a nitro pigment, a natural pigment, a fluorescent pigment, an inorganic pigment and carbon black. Among these pigments, carbon black is preferred.

These pigments may or may not be surface-treated before use. Examples of the method for surface treatment include a method of coating the surface with resin or wax, a method of attaching a surfactant, and a method of bonding a reactive substance (for example, silane coupling agent, epoxy compound or isocyanate) to the pigment surface. These surface-treating methods are described in *Kinzoku Sekken no Seishitsu to Oyo* (*Properties and Application of Metal Soap*), Saiwai Shobo, *Insatsu Ink Gijutsu* (*Printing Ink Technology*), C M C Shuppan (1984), and *Saishin Ganryo Oyo Gijutsu* (*Newest Pigment Application Technology*), C M C Shuppan (1986).

The particle diameter of the pigment is preferably from 0.01 to 10 μm, more preferably from 0.05 to 1 μm, still more preferably from 0.1 to 1 μm. Within this range, good stability of the pigment dispersion in the coating solution for the image recording layer and good uniformity of the image recording layer can be obtained.

For dispersing the pigment, a known dispersion technique used in the production of ink or toner may be used. Examples of the dispersing machine include an ultrasonic disperser, a sand mill, an attritor, a pearl mill, a super-mill, a ball mill, an impeller, a disperser, a KD mill, a colloid mill, a dynatron, a three-roll mill and a pressure kneader. These are described in detail in *Saishin Ganryo Oyo Gijutsu* (*Newest Pigment Application Technology*), C M C Shuppan (1986).

The amount of the infrared absorbent added to the image recording layer is preferably a necessary minimum amount so as to suppress the side effect of inhibiting the polymerization reaction.

The infrared absorbent can be added at a ratio of 0.001 to 50 mass %, preferably from 0.005 to 30 mass %, more preferably from 0.01 to 10 mass %, to the entire solid content of the image recording layer. Within this range, high sensitivity can be obtained without adversely affecting the uniformity or film strength of the image recording layer.

<Sensitizer>

In the image recording layer of the lithographic printing plate precursor which is imagewise exposed using a light source of emitting light at 250 to 420 nm, a sensitizer may be used in combination with the above-described polymerization initiator so as to elevate the radical generation efficiency.

Specific examples of the sensitizer include benzoin, benzoin methyl ether, benzoin ethyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-tert-butyl-9,10-anthraquinone, 2,6-dichloro-9,10-anthraquinone, xanthone, 2-methylxanthone, 2-methoxyxanthone, thioxanthone, benzyl, dibenzalacetone, p-(dimethylamino)phenyl styryl ketone, p-(dimethylamino)phenyl p-methylstyryl ketone, benzophenone, p-(dimethylamino)benzophenone (or Michler's ketone), p-(diethylamino)benzophenone and benzanthrone.

Furthermore, the sensitizer preferred in the present invention includes a compound represented by formula (III) described in JP-B-51-48516:

(III)

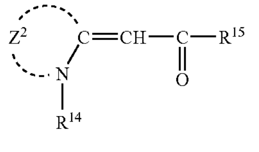

In the formula above, $R^{14}$ represents an alkyl group (e.g., methyl, ethyl, propyl) or a substituted alkyl group (e.g., 2-hydroxyethyl, 2-methoxyethyl, carboxymethyl, 2-carboxyethyl), and $R^{15}$ represents an alkyl group (e.g., methyl, ethyl) or an aryl group (e.g., phenyl, p-hydroxy-phenyl, naphthyl, thienyl).

$Z^2$ represents a nonmetallic atom group necessary for forming a nitrogen-containing heterocyclic nucleus usually used in a cyanine dye, for example, benzothiazoles (e.g., benzothiazole, 5-chlorobenzothiazole, 6-chlorobenzothiazole) naphthothiazoles (e.g., α-naphthothiazole, β-naphthothiazole), benzoselenazoles (e.g., benzoselenazole, 5-chlorobenzoselenazole, 6-methoxybenzoselenazole) naphthoselenazoles (e.g., α-naphthoselenazole, β-naphtho-selenazole), benzoxazoles (e.g., benzoxazole, 5-methylbenzoxazole, 5-phenylbenzoxazole) and naphthoxazoles (e.g. α-naphthoxazole, β-naphthoxazole).

Specific examples of the compound represented by formula (III) include those having a chemical structure constituted by combining these $Z^2$, $R^{14}$ and $R^{15}$. Many of such compounds are present as a known substance and therefore, the compound used may be appropriately selected from those known substances. Other preferred examples of the sensitizer for use in the present invention include a merocyanine dye described in JP-B-5-47095 and a ketocoumarin-based compound represented by the following formula (IV):

(IV)

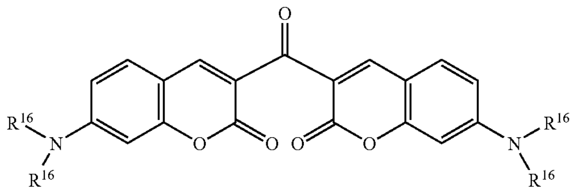

In the formula above, $R^{16}$ represents an alkyl group such as methyl group and ethyl group.

The sensitizer can be added at a ratio of preferably from 0.1 to 50 mass %, more preferably from 0.5 to 30 mass %, still more preferably from 0.6 to 20 mass %, to all solid contents constituting the image recording layer.

<Microcapsule>

In the present invention, the above-described components constituting the image recording layer and other constituent components described later may be incorporated into the image recording layer by a method of enclosing a part or all of the constituent components in a microcapsule and adding the microcapsule to the image recording layer described, for example, in JP-A-2001-277740 and JP-A-2001-277742. In this case, the constituent components may be incorporated inside and outside the microcapsule at an arbitrary ratio.

For microencapsulating the constituent components of the image recording layer, a conventionally known method can be applied. Examples of the method for producing a microcapsule include, but are not limited to, a method utilizing coacervation described in U.S. Pat. Nos. 2,800,457 and 2,800,458, a method utilizing interfacial polymerization described in U.S. Pat. No. 3,287,154, JP-B-38-19574 and JP-B-42-446, a method utilizing precipitation of a polymer described in U.S. Pat. Nos. 3,418,250 and 3,660,304, a method using an isocyanate polyol wall material described in U.S. Pat. No. 3,796,669, a method using an isocyanate wall material described in U.S. Pat. No. 3,914,511, a method using a urea-formaldehyde or urea-formaldehyde-resorcinol wall-forming material described in U.S. Pat. Nos. 4,001,140, 4,087,376 and 4,089,802, a method using a wall material such as melamine-formaldehyde resin or hydroxy cellulose described in U.S. Pat. No. 4,025,445, an in situ method utilizing monomer polymerization described in JP-B-36-9163 and JP-A-51-9079, a spray drying method described in British Patent 930,422 and U.S. Pat. No. 3,111,407, and an electrolytic dispersion cooling method described in British Patents 952,807 and 967,074.

The microcapsule wall for use in the present invention preferably has a three-dimensionally crosslinked structure and a property of swelling with a solvent. From this standpoint, the wall material of the microcapsule is preferably polyurea, polyurethane, polyester, polycarbonate, polyamide or a mixture thereof, more preferably polyurea or polyurethane. Also, a compound having a crosslinking functional group such as ethylenically unsaturated bond which can be introduced into the above-described water-insoluble polymer may be introduced into the microcapsule wall.

The average particle diameter of the microcapsule is preferably from 0.01 to 3.0 μm, more preferably from 0.05 to 2.0 μm, still more preferably from 0.10 to 1.0 μm. Within this range, good resolution and good aging stability can be obtained.

[Other Components of Image Recording Layer]

The image recording layer of the present invention may further contain varicus additives, if desired. These are described below.

<Hydrophilic Polymer>

The image recording layer of the lithographic printing plate precursor of the present invention may contain a hydrophilic polymer so as to enhance the developability and dispersion stability of the microcapsule.

Suitable examples of the hydrophilic polymer include those having a hydrophilic group such as hydroxy group, carboxyl group, carboxylate group, hydroxyethyl group, polycxyethyl group, hydroxypropyl group, polyoxypropyl group, amino group, aminoethyl group, aminopropyl group, ammonium group, amide group, carboxymethyl group, sulfonic acid group and phosphoric acid group.

Specific examples thereof include gum arabic, casein, gelatin, a starch derivative, carboxymethyl cellulose and its sodium salt, cellulose acetate, sodium alginate, vinyl acetate-maleic acid copolymers, styrene-maleic acid copolymers, polyacrylic acids and their salts, polymethacrylic acids and their salts, a homopolymer or copolymer of hydroxyethyl methacrylate, a homopolymer or copolymer of hydroxyethyl acrylate, a homopolymer or copolymer of hydroxypropyl methacrylate, a homopolymer or copolymer of hydroxypropyl acrylate, a homopolymer or copolymer of hydroxybutyl methacrylater a homopolymer or copolymer of hydroxybutyl acrylate, polyethylene glycols, hydroxypropylene polymers, polyvinyl alcohols, a hydrolyzed polyvinyl acetate having a hydrolysis degree of 60 mol % or more, preferably 80 mol % or more, polyvinylformal, polyvinylbutyral, polyvinylpyrrolidone, a homopolymer or polymer of acrylamide, a homopolymer or copolymer of methacrylamide, a homopolymer or copolymer of N-methylolacrylamide, alcohol-soluble nylon, and a polyether of 2,2-bis-(4-hydroxyphenyl)-propane with epichlorohydrin.

The hydrophilic polymer preferably has a weight average molecular weight of 5,000 or more, more preferably from 10,000 to 300,000. The hydrophilic polymer may be a random polymer, a block polymer, a graft polymer or the like.

The content of the hydrophilic polymer in the image recording layer is preferably 20 mass % or less, more preferably 10 mass % or less, based on the entire solid content of the image recording layer.

<Surfactant>

In the present invention, a surfactant is preferably used in the image recording layer so as to accelerate the development and enhance the coated surface state. The surfactant includes, for example, a nonionic surfactant, an anionic surfactant, a cationic surfactant, an amphoteric surfactant and a fluorine-containing surfactant.

One surfactant may be used alone, or two or more species may be used in combination.

The nonionic surfactant for use in the present invention is not particularly limited and a conventionally known nonionic surfactant can be used. Examples thereof include polyoxyethylene alkyl ethers, polyoxyethylene alkylphenyl ethers, polyoxyethylene polystyrylphenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylenated castor oils, polyoxyethylene glycerin fatty acid partial esters, fatty acid diethanolamides, N,N-bis-2-hydroxyalkylamines, a polyoxyethylene alkylamine, a triethanolamine fatty acid ester, a trialkylamine oxide, a polyethylene glycol and a copolymer of polyethylene glycol and polypropylene glycol.

The anionic surfactant for use in the present invention is not particularly limited and a conventionally known anionic surfactant can be used. Examples thereof include fatty acid salts, abietates, hydroxyalkanesulfonates, alkanesulfonates, dialkylsulfosuccinic ester salts, linear alkylbenzenesulfonates, branched alkylbenzenesulfonates, alkylnaphthalenesulfonates, alkyl-phenoxypolyoxyethylenepropylsulfonates, polyoxyethylene-alkylsulfophenyl ether salts, an N-methyl-N-oleyltaurine sodium salt, a monoamide disodium N-alkylsulfosuccinate, petroleum sulfonates, a sulfated beef tallow oil, sulfuric ester salts of fatty acid alkyl ester, alkylsulfuric ester salts, polyoxyethylene alkyl ether sulfuric ester salts, fatty acid monoglyceride sulfuric ester salts, polyoxyethylene alkylphenyl ether sulfuric ester salts, polyoxyethylene styrylphenyl ether sulfuric ester salts, alkylphosphoric ester salts, polyoxyethylene alkyl ether phosphoric ester salts, polyoxyethylene alkylphenyl ether phosphoric ester salts, partially saponified styrene/maleic anhydride copolymerization products, partially saponified olefin/maleic anhydride copolymerization products, and naphthalenesulfonate formalin condensates.

The cationic surfactant for use in the present invention is not particularly limited and a conventionally known cationic surfactant can be used. Examples thereof include alkylamine salts, quaternary ammonium salts, polyoxyethylene alkylamine salts and polyethylene polyamine derivatives.

The amphoteric surfactant for use in the present invention is not particularly limited and a conventionally known amphoteric surfactant can be used. Examples thereof include carboxybetaines, aminocarboxylic acids, sulfo-betaines, aminosulfuric esters and imidazolines.

The term "polyoxyethylene" in the above-described surfactants can be instead read as "polyoxyalkylene" such as polyoxymethylene, polyoxypropylene and polyoxybutylene, and these surfactants can also be used in the present invention.

The surfactant is more preferably a fluorine-containing surfactant containing a perfluoroalkyl group within the molecule. This fluorine-containing surfactant includes an anionic type such as perfluoroalkylcarboxylate, perfluoroalkylsulfonate and perfluoroalkylphosphoric ester, an amphoteric type such as perfluoroalkylbetaine; a cationic type such as perfluoroalkyltrimethylammonium salt; and a nonionic type such as perfluoroalkylamine oxide, perfluoroalkyl ethylene oxide adduct, oligomer containing a perfluoroalkyl group and a hydrophilic group, oligomer containing a perfluoroalkyl group and a lipophilic group, oligomer containing a perfluoroalkyl group, a hydrophilic group and a lipophilic group, and urethane containing a perfluoroalkyl group and a lipophilic group. In addition, fluorine-containing surfactants described in JP-A-62-170950, JP-A-62-226143 and JP-A-60-168144 may also be suitably used.

One surfactant may be used alone, or two or more species may be used in combination.

The surfactant content is preferably from 0.001 to 10 mass %, more preferably from 0.01 to 7 mass %, based on the entire solid content of the image recording layer.

<Colorant>

In the present invention, a dye having large absorption in the visible light region can be used as a colorant for the image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industry Co., Ltd.), Victoria Pure Blue, Crystal Violet (CI42555), Methyl Violet (CI42535), Ethyl Violet, Rhodamine B (CT145170B), Malachite Green (CI42000), Methylene Blue (CI52015), and dyes described in JP-A-62-293247. Also, a pigment such as phthalocyanine-based pigment, azo-based pigment, carbon black and titanium oxide may be suitably used.

The colorant is preferably added because the image part and the non-image part can be clearly distinguished after image formation. The amount of the colorant added is preferably from 0.01 to 10 mass % based on the entire solid content of the image recording material.

<Printing-Out Agent>

In the image recording layer of the present invention, a compound of undergoing discoloration by the effect of an acid or a radical can be added so as to produce a print-cut image. As for such a compound, various coloring matters such as diphenylmethane type, triphenylmethane type, thiazine type, oxazine type, xanthene type, anthraquinone type, iminoquinone type, azo type and azomethine type are effective.

Specific examples thereof include dyes such as Brilliant Green, Ethyl Violet, Methyl Green, Crystal Violet, Basic Fuchsine, Methyl Violet 2B, Quinaldine Red, Rose Bengale, Metanil Yellow, Thymolsulfophthalein, Xylenol Blue, Methyl Orange, Paramethyl Red, Congo Red, Benzopurpurine 4B, α-Naphthyl Red, Nile Blue 2B, Nile Blue A, Methyl Violet, Malachite Green, Parafuchsine, Victoria Pure Blue BOH [produced by Hodogaya Chemical Co., Ltd.], Oil Blue #603 [produced by Orient Chemical Industry Co., Ltd.], Oil Pink #312 [produced by Orient Chemical Industry Co., Ltd.], Oil Red 5B produced by Orient Chemical Industry Co., Ltd.], Oil Scarlet #308 [produced by Orient Chemical Industry Co., Ltd.], Oil Red OG [produced by Orient Chemical Industry Co., Ltd.], Oil Red RR [produced by Orient Chemical Industry Co., Ltd.], Oil Green #502 [produced by Orient Chemical Industry Co., Ltd.], Spiron Red BEH Special [produced by Hodogaya Chemical Co., Ltd.], m-Cresol Purple, Cresol Red, Rhodamine B, Rhodamine 6G, Sulforhodamine B, Auramine, 4-p-diethyl-aminophenyliminonaphthoquinone, 2-carboxyanilino-4-p-diethylaminophenyliminonaphthoquinone, 2-carboxystearyl-amino-4-p-N,N-bis(hydroxyethyl)aminophenyliminonaphtho-quinone, 1-phenyl-3-methyl-4-p-diethylaminophenylimino-5-pyrazolone and 1-β-naphthyl-4-p-diethylaminophenylimino-5-pyrazolone, and leuco dyes such as p,p',p"-hexamethyl-triaminotriphenyl methane (Leuco Crystal Violet) and Pergascript Blue SRB (produced by Ciba Geigy).

Other suitable examples include leuco dyes known as a material for heat-sensitive or pressure-sensitive paper. Specific examples thereof include Crystal Violet Lactone, Malachite Green Lactone, Benzoyl Leuco Methylene Blue, 2-(N-phenyl-N-methylamino)-6-(N-p-tolyl-N-ethyl) aminofluorane, 2-anilino-3-methyl-6-(N-ethyl-p-toluidino) fluorane, 3,6-dimethoxyfluorane, 3-(N,N-diethylamino)-5-methyl-7-(N,N-dibenzylamino)fluorane, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-xylidino-fluorane, 3-(N,N-diethylamino)-6-methyl-7-chlorofluorane, 3-(N,N-diethylamino)-6-methoxy-7-aminofluorane, 3-(N,N-diethylamino)-7-(4-chloroanilino)fluorane, 3-(N,N-diethylamino)-7-chlorofluorane, 3-(N,N-diethylamino)-7-benzylaminofluorane, 3-(N,N-diethylamino)-7,8-benzofluorane, 3-(N,N-dibutylamino)-6-methyl-7-anilinofluorane, 3-(N,N-dibutylamino)-6-methyl-7-xylidinofluorane, 3-piperidino-6-methyl-7-anilinofluorane, 3-pyrrolidino-6-methyl-7-anilino-fluorane, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide and 3-(4-diethylaminophenyl)-3-(1-ethyl-2-methylindol-3-yl) phthalide.

The dye of undergoing discoloration by the effect of an acid or a radical is preferably added in an amount of 0.01 to 15 mass % based on the solid content of the image recording layer.

<Polymerization Inhibitor>

In the image recording layer of the present invention, a small amount of a thermopolymerization inhibitor is preferably added so as to prevent unnecessary thermo-polymerization of the radical polymerizable compound during preparation or storage of the image recording layer.

Suitable examples of the thermopolymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenyihydroxylamine aluminum salt.

The thermopolymerization inhibitor is preferably added in an amount of about 0.01 to about 5 mass % based on the entire solid content of the image recording layer.

<Higher Fatty Acid Derivative, etc.>

In the image recording layer of the present invention, for example, a higher fatty acid derivative such as behenic acid or behenic acid amide may be added and unevenly distributed to the surface of the image recording layer in the process of drying after coating so as to prevent polymerization inhibition by oxygen. The amount of the higher fatty acid derivative added is preferably from about 0.1 to about 10 mass % based on the entire solid content of the image recording layer.

<Plasticizer>

The image recording layer of the present invention may contain a plasticizer. Suitable examples of the plasticizer include phthalic acid esters such as dimethyl phthalate, diethyl phthalate, dibutyl phthalate, diisobutyl phthalate, diocyl phthalate, octyl capryl phthalate, dicyclohexyl phthalate, ditridecyl phthalate, butyl benzyl phthalate, diisodecyl phthalate and diallyl phthalate; glycol esters such as dimethyl glycol phthalate, ethyl phthalylethyl glycolate, methyl phthalylethyl glycolate, butyl phthalylbutyl glycolate and triethylene glycol dicaprylic acid ester; phosphoric acid esters such as tricresyl phosphate and triphenyl phosphate; aliphatic dibasic acid esters such as diisobutyl adipate, dioctyl adipate, dimethyl sebacate, dibutyl sebacate, dioctyl azelate and dibutyl maleate; polyglycidyl methacrylate, triethyl citrate, glycerin triacetyl ester and butyl laurate. The plasticizer content is preferably about 30 mass % or less based on the entire solid content of the image recording layer <Inorganic Fine Particle>

The image recording layer of the present invention may contain an inorganic fine particle so as to elevate the cured film strength of the image part. Suitable examples of the inorganic fine particle include silica, alumina, magnesium oxide, titanium oxide, magnesium carbonate, calcium alginate and a mixture thereof. Even if such an inorganic fine particle has no light-to-heat converting property, the inorganic fine particle can be used, for example, for strengthening the film or roughening the surface to elevate the interfacial adhesion. The average particle diameter of the inorganic fine particle is preferably from 5 nm to 10 μm, more preferably from 0.5 to 3 μm. Within this range, the inorganic particles are stably dispersed in the image recording layer, so that the image recording layer can maintain sufficiently high film strength and the non-image part formed can have excellent hydrophilicity to cause less staining at printing.

Such an inorganic fine particle is easily available on the market as a colloidal silica dispersion or the like.

The inorganic fine particle content is preferably 20 mass % or less, more preferably 10 mass % or less, based on the entire solid content of the image recording layer.

<Low-Molecular Hydrophilic Compound>

The image recording layer of the present invention may contain a hydrophilic low-molecular compound so as to enhance the developability. Examples of the hydrophilic low-molecular compound include, as the water-soluble organic compound, glycols and ether or ester derivatives thereof, such as ethylene glycol, diethylene glycol, triethylene glycol, propylene glycol, dipropylene glycol and tripropylene glycol; polyhydroxys such as glycerin and pentaerythritol; organic amines and salts thereof, such as triethanolamine, diethanolamine and monoethanolamine; organic sulfonic acids and salts thereof, such as toluenesulfonic acid and benzenesulfonic acid; organic phosphonic acids and salts thereof, such as phenylphosphonic acid; and organic carboxylic acids and salts thereof, such as tartaric acid, oxalic acid, citric acid, malic acid, lactic acid, gluconic acid and amino acids.

<Formation of Image Recording Layer>

The image recording layer of the present invention is formed by dispersing or dissolving the above-described necessary components in a solvent to prepare a coating solution and coating the coating solution. Examples of the solvent used here include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyllactone, toluene and water. These solvents are used individually or as a mixture. The solid content concentration of the coating solution is preferably from 1 to 50 mass %.

The image recording layer of the present invention may also be formed by dispersing or dissolving the same or different components described above in the same or different solvents to prepare a plurality of coating solutions and repeating the coating and drying a plurality of times.

The coated amount (solid content) of the image recording layer obtained on the support after coating and drying varies depending on the usage but, in general, the coated amount is preferably from 0.3 to 3.0 g/$m^2$. Within this range, good sensitivity and good film properties of the image recording layer can be obtained.

As for the coating method, various methods may be used and examples thereof include bar coater coating, rotary coating, spray coating, curtain coating, dip coating, air knife coating, blade coating and roll coating.

(Support)

The support for use in the lithographic printing plate precursor of the present invention is not particularly limited and may be sufficient if it is a dimensionally stable plate-like hydrophilic support. Examples thereof include paper, paper laminated with plastic (e.g., polyethylene, polypropylene, polystyrene), metal plate (e.g., aluminum, zinc, copper), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal), and paper or plastic film laminated or vapor-deposited with the above-described metal. Among these supports, polyester film and aluminum plate are preferred, and aluminum plate is more preferred because this is dimensionally stable and relatively inexpensive.

The aluminum plate is a pure aluminum plate, an alloy plate mainly comprising aluminum and containing trace heteroelements, or an aluminum or aluminum alloy thin film laminated with a plastic. Examples of the heteroelement contained in the aluminum alloy include silicon, iron, manganese, copper, magnesium, chromium, zinc, bismuth, nickel and titanium. The heteroelement content in the alloy is preferably 10 mass % or less. In the present invention, a pure aluminum plate is preferred, but perfectly pure aluminum is difficult to produce in view of refining technique and therefore, an aluminum plate containing trace heteroelements may be used. The aluminum plate is not particularly limited in its composition, and a conventionally known and commonly employed material can be appropriately used.

The thickness of the support is preferably from 0.1 to 0.6 mm, more preferably from 0.15 to 0.4 mm, still more preferably from 0.2 to 0.3 mm.

In advance of using the aluminum plate, the aluminum plate is preferably subjected to a surface treatment such as surface roughening and anodization. This surface treatment facilitates enhancing hydrophilicity and ensuring adhesion between the image recording layer and the support. Before surface-roughening the aluminum plate, a degreasing treatment for removing the rolling oil on the surface is performed, if desired, by using a surfactant, an organic solvent, an alkaline aqueous solution or the like.

The surface-roughening treatment of the aluminum plate surface is performed by various methods, and examples thereof include a mechanical surface-roughening treatment, an electrochemical surface-roughening treatment (a surface-roughening treatment of electrochemically dissolving the surface) and a chemical surface-roughening treatment (a surface-roughening treatment of chemically and selectively dissolving the surface).

The mechanical surface-roughening treatment may be performed by a known method such as ball polishing, brush polishing, blast polishing and buff polishing.

The method for the electrochemical surface-roughening treatment includes, for example, a method of passing an alternating or direct current in an electrolytic solution containing an acid such as hydrochloric acid or nitric acid. Also, a method using a mixed acid described in JP-A-54-63902 may be used.

The surface-roughened aluminum plate is, if desired, subjected to an alkali etching treatment using an aqueous solution of potassium hydroxide, sodium hydroxide or the like and after a neutralization treatment, further subjected to an anodization treatment, if desired, so as to enhance the abrasion resistance.

As for the electrolyte used in the anodization treatment of the aluminum plate, various electrolytes of forming a porous oxide film may be used. In general, a sulfuric acid, a hydrochloric acid, an oxalic acid, a chromic acid or a mixed acid thereof is used. The electrolyte concentration is appropriately determined according to the kind of the electrolyte.

The anodization treatment conditions vary depending on the electrolyte used and therefore, cannot be indiscriminately specified, but in general, the conditions are preferably such that the electrolyte concentration is from 1 to 80 mass %, the liquid temperature is from 5 to 70° C., the current density is from 5 to 60 A/$dm^2$, the voltage is from 1 to 100 V, and the electrolysis time is from 10 seconds to 5 minutes. The amount of the anodic oxide film formed is preferably from 1.0 to 5.0 g/$m^2$, more preferably from 1.5 to 4.0 g/$m^2$. Within this range, good press life and good scratch resistance of the non-image part of the lithographic printing plate can be obtained.

As for the support used in the present invention, the substrate having thereon an anodic oxide film after the above-described surface treatment may be directly used, but in order to more improve adhesion to the upper layer, hydrophilicity, antiscumming property, heat insulation and the like, treatments described in JP-A-2001-253181 and JP-A-2001-322365, such as treatment for enlarging micropores of the anodic oxide film, treatment for pore-sealing micropores and surface-hydrophilizing treatment of dipping the substrate in an aqueous solution containing a hydrophilic compound, may be appropriately selected and applied. Of course, the enlarging treatment and pore-sealing treatment are not limited to those described in these patent publications and any conventionally known method may be employed.

The pore-sealing treatment may be a pore-sealing treatment with steam, a pore-sealing treatment with fluorinated zirconic acid alone, a pore-sealing treatment with an aqueous solution containing an inorganic fluorine compound, such as treatment with sodium fluoride, a pore-sealing treatment with steam having added thereto lithium chloride, or a pore-sealing treatment with hot water.

In particular, a pore-sealing treatment with an aqueous solution containing an inorganic fluorine compound, a pore-sealing treatment with water vapor, and a pore-sealing treatment with hot water are preferred.

In the present invention, when the development is performed with a developing solution having a pH of 2 to 10, particularly with a developing solution containing a compound represented by the structure of formula <1>, <2> or <3> and having a pH of 2 to 10, a hydrophilization treatment is preferably performed by dipping the aluminum plate in an aqueous solution containing a hydrophilic compound. In particular, an alkali metal silicate treatment and/or a surface treatment with an organic phosphonic acid, described below, are preferred.

As for the hydrophilization treatment, an alkali metal silicate method described in U.S. Pat. Nos. 2,714,066, 3,181,461, 3,280,734 and 3,902,734 is preferably employed. In this method, the support is dipped in an aqueous solution of sodium silicate or the like, or electrolyzed. Other examples include a method of treating the support with potassium fluorozirconate described in JP-B-36-22063, and a method of treating the support with an organic phosphonic acid such as polyvinylphosphonic acid described in U.S. Pat. Nos. 3,276,868, 4,153,461 and 4,689,272.

In the treatment with an organic phosphonic acid, which is a preferred embodiment, other than the treatment with polyvinylphosphonic acid, a surface treatment with a polyvinylmethylphosphonic acid or a phosphoric acid ester of polyvinyl alcohol provides a high effect, but a treatment with polyvinylphosphonic acid is particularly effective. In the case of applying such a treatment, the residual color at the development can be easily eliminated and very good results are obtained also in terms of staining at the printing.

In the case where a support insufficient in the hydrophilicity on the surface, such as polyester film, is used as the support of the present invention, a hydrophilic layer is preferably coated to render the surface hydrophilic. The hydrophilic layer is preferably a hydrophilic layer formed by coating a coating solution containing a colloid of oxide or hydroxide of at least one element selected from beryllium, magnesium, aluminum, silicon, titanium, boron, germanium, tin, zirconium, iron, vanadium, antimony and a transition metal described in JP-A-2001-199175, a hydrophilic layer having an organic hydrophilic matrix obtained by crosslinking or pseudo-crosslinking an organic hydrophilic polymer described in JP-A-2002-79772, a hydrophilic layer having an inorganic hydrophilic matrix obtained by the sol-gel conversion comprising hydrolysis and condensation reaction of polyalkoxysilane, titanate, zirconate or aluminate, or a hydrophilic layer comprising an inorganic thin film having a metal oxide-containing surface. Among these, a hydrophilic layer formed by coating a coating solution containing a colloid of oxide or hydroxide of silicon is more preferred.

In the case of using polyester film or the like as the support of the present invention, an antistatic layer is preferably provided on the hydrophilic layer side or opposite side of the support or on both sides. When an antistatic layer is provided between the support and the hydrophilic layer, this contributes to the enhancement of adhesion to the hydrophilic layer. Examples of the antistatic layer which can be used include a polymer layer having dispersed therein a metal oxide fine particle or matting agent described in JP-A-2002-79772.

The support preferably has a centerline average roughness of 0.10 to 1.2 μm. Within this range, good adhesion to the image recording layer, good press life and good antiscumming property can be obtained.

The color density of the support is preferably from 0.15 to 0.65 in terms of the reflection density value. Within this range, good image-forming property by virtue of antihalation at the image exposure and good suitability for plate inspection after development can be obtained.

(Undercoat Layer)

In the lithographic printing plate precursor of the present invention, an undercoat layer comprising a compound having a polymerizable group is preferably provided on the support. When an undercoat layer is used, the image recording layer is provided on the undercoat layer. The undercoat layer has an effect of strengthening, in the exposed area, adhesion between the support and the image recording layer and, in the unexposed area, facilitating the separation of image recording layer from the support, thereby enhancing the developability.

Specific suitable examples of the undercoat layer include a silane coupling agent having an addition-polymerizable ethylenic double bond reactive group described in JP-A-10-282679, and a phosphorus compound having an ethylenic double bond reactive group described in JP-A-2-304441 A particularly preferred compound is a compound having a polymerizable group such as methacryl group and allyl group, and a support-adsorbing group such as sulfonic acid group, phosphoric acid group and phosphoric acid ester. Also, a compound having a hydrophilicity-imparting group such as ethylene oxide group, in addition to the polymerizable group and the support-adsorbing group, can be suitably used.

The coated amount (solid content) of the undercoat layer is preferably from 0.1 to 100 mg/$m^2$, more preferably from 1 to 30 mg/$m^2$.

(Protective Layer)

In the lithographic printing plate precursor of the present invention, a water-soluble protective layer may be provided on the image recording layer for the purpose of preventing generation of scratches or the like on the image recording layer, blocking oxygen or preventing ablation at the exposure with a high-intensity laser.

In the present invention, the exposure is usually performed in air and the protective layer prevents a low molecular compound which inhibits a radical polymerization reaction occurring upon exposure in the image recording layer, such as oxygen and basic substance present in air, from intruding into the image recording layer, and thereby prevents the inhibition of the image-forming reaction at the exposure in air. Accordingly, the property required of the protective layer is low permeability to a low molecular compound such as oxygen. Furthermore, the protective layer is preferably a protective layer having good transparency to light used for exposure and excellent adhesion to the image recording layer and being easily removable with an aqueous solution during simple development after exposure. The protective layer having such properties have been heretofore variously studied and described in detail, for example, in U.S. Pat. No. 3,458,311 and JP-B-55-49729.

Examples of the material used for the protective layer include a water-soluble polymer compound having relatively excellent crystallinity. Specific examples thereof include a water-soluble polymer such as polyvinyl alcohol, polyvinylpyrrolidone, acidic celluloses, gelatin, gum arabic and polyacrylic acid. In particular, when polyvinyl alcohol (PVA) is used as the main component, this provides most excellent results in terms of basic properties such as oxygen-blocking property and development removability The polyvinyl alcohol may be partially replaced by an ester, an ether or an acetal or may have partially another copolymerization component, as long as it contains an unsubstituted vinyl alcohol unit for giving necessary oxygen-blocking property and water solubility to the protective layer.

Examples of the polyvinyl alcohol which can be suitably used include those having a hydrolysis degree of 71 to 100% and a polymerization degree of 300 to 2,400. Specific examples thereof include PVA-105, PVA-110, PVA-117, PVA-117H, PVA-120, PVA-124, PVA-124H, PVA-CS, PVA-CST, EVA-HC, PVA-203, PVA-204, PVA-205, PVA-210, PVA-217, PVA-220, PVA-224, PVA-217EE, PVA-217E, PVA-220E, PVA-224E, PVA-405, PVA-420, FVA-613 and L-8 produced by Kuraray Co., Ltd.

The component (for example, selection of PVA and use of additive), coated amount and the like of the protective layer are appropriately selected by taking account of fogging, adhesion, scratch resistance and the like in addition to the oxygen-blocking property and development removability. In general, as the PVA has a higher percentage of hydrolysis (namely, as the percentage of unsubstituted vinyl alcohol unit content in the protective layer is higher) or as the layer thickness is larger, the oxygen-blocking property is elevated and this is preferred in view of sensitivity. Also, in order to prevent occurrence of an unnecessary polymerization reaction during production or storage and prevent unnecessary fogging or thickening of image line at the image exposure, excessively high oxygen permeability is not preferred. Accordingly, the oxygen permeability A at 25° C. under 1 atm is preferably $0.2 \leqq A \leqq 20$ (ml/m$^2$·day).

As for other components of the protective layer, glycerin, dipropylene glycol or the like may be added in an amount corresponding to several mass % based on the ((co)polymer so as to impart flexibility. Also, an anionic surfactant such as sodium alkylsulfate and sodium alkylsulfonate; an amphoteric surfactant such as alkylaminocarboxylate and alkylaminodicarboxylate; or a nonionic surfactant such as polyoxyethylene alkylphenyl ether may be added in an amount of several mass % based on the above-described water-soluble polymer component.

The adhesion to the image part, scratch resistance and the like are also very important in view of handling of the lithographic printing plate precursor. More specifically, when a protective layer which is hydrophilic by containing a water-soluble polymer compound is stacked on the image recording layer which is lipophilic, the protective layer is readily separated due to insufficient adhesive strength and in the separated portion, defects such as curing failure ascribable to polymerization inhibition by oxygen may be caused.

In this respect, various proposals have been made to improve the adhesive property between the image recording layer and the protective layer. For example, JP-A-49-70702 and Unexamined British Patent Publication No. 1,303,578 describe a technique of mixing from 20 to 60 mass % of an acrylic emulsion, a water-insoluble vinylpyrrolidone-vinyl acetate copolymer or the like in a hydrophilic polymer mainly comprising polyvinyl alcohol, and stacking the obtained solution on the image recording layer, thereby obtaining sufficiently high adhesive property. In the present invention, these known techniques all can be used.

In the lithographic printing plate precursor of the present invention, it is also preferred to incorporate an inorganic layered compound into the protective layer for the purpose of enhancing the oxygen-blocking property or the property of protecting the photosensitive layer surface.

Here, the inorganic layered compound is a particle having a thin plate-like shape, and examples thereof include a mica family represented by the following formula:

$$A(B,C)_{2\text{-}5}D_4O_{10}(OH,F,O)_2$$

[wherein A is any one of K, Na and Ca, B and C each is any one of Fe(II), Fe(III), Mn, Al, Mg and V, and D is Si or Al], such as natural mica and synthetic mica; talc represented by the formula:

$$3MgO.4SiO.H_2O \qquad \text{Formula 3:}$$

taeniolite; montmorillonite; saponite; hectorite; and zirconium phosphate.

Out of the mica family, examples of the natural mica include muscovite, paragonite, phlogopite, biotite and lepidolite. Examples of the synthetic mica include non-swelling mica such as fluorophlogopite $KMg_3(AlSi_3O_{10})F_2$ and potassium tetrasilicic mica $KMg_{2.5}(Si_4O_{10})F_2$, and swelling mica such as Na-tetrasililic mica $NaMg_{2.5}(Si_4O_{10})F_2$, Na- or Li-taeniolite (Na, Li) $Mg_2Li$ $(Si_4O_{10})F_2$, and montmorillonite-based Na- or Li-hectorite $(Na, Li)_{1/8}Mg_{2/5}Li_{1/8}(Si_4O_{10})F_2$. Synthetic smectite is also useful.

In the present invention, among these inorganic layered compounds, fluorine-based swelling mica which is a synthetic inorganic layered compound is particularly useful. This swelling synthetic mica and the swelling clay minerals such as montmorillonite, saponite, hectorite and bentonite have a layered structure comprising unit crystalline lattice layers having a thickness of approximately from 10 to 15 Å, and the intra-lattice metallic atom substitution is considerably larger than that of other clay minerals. As a result, the lattice layer causes shortage in positive electric charge, and a cation such as $Na^+$, $Ca^{2+}$ and $Mg^{2+}$ is adsorbed between layers to compensate for the shortage. The cation intervening between these layers is called an exchangeable cation and is exchanged with various cations. Particularly, in the case where the cation between layers is $Li^-$ or $Na^+$, the bonding between layered crystalline lattices is weak due to small ionic radius, and great swelling with water occurs. When shearing is applied in this state, cleavage is readily brought about and a stable sol is formed in water. This tendency is outstanding in bentonite and swelling synthetic mica, and these compounds are useful in the present invention. In particular, swelling synthetic mica is preferred.

As for the shape of the inorganic layered compound for use in the present invention, the thickness is preferably smaller from the standpoint of controlling the dispersion, and the plane size is preferably larger as long as the flatness of coated surface and the transparency to actinic rays are not impaired. Therefore, the aspect ratio is 20 or more, preferably 100 or more, more preferably 200 or more. The aspect ratio is a ratio of thickness to long diameter of a particle and can be measured, for example, from a projection view by a micrograph of particles. As the aspect ratio is larger, the effect obtained is greater.

The particle size of the inorganic layered compound for use in the present invention is, in terms of average long diameter, from 0.3 to 20 μm, preferably from 0.5 to 10 μm, more preferably from 1 to 5 μm. The average thickness of the particle is 0.1 μm or less, preferably 0.05 μm or less, more preferably 0.01 μm or less. For example, out of inorganic layered compounds, the swelling synthetic mica which is a representative compound has a size such that the thickness is from 1 to 50 nm and the plane size is approximately from 1 to 20 μm.

When such an inorganic layered compound particle having a large aspect ratio is incorporated into the protective layer, the coating strength is increased and the permeation of oxygen or water content can be effectively inhibited, so that the protective layer can be prevented from deterioration due to deformation and even when stored for a long time under high-humidity condition, the lithographic printing plate precursor can be free of reduction in the image formability due to change of humidity and assured of excellent storage stability.

The content of the inorganic layered compound in the protective layer is preferably from 5/1 to 1/00 in terms of the mass ratio to the amount of binder used in the protective layer. Even when a plurality of inorganic layered compounds are used in combination, the total amount of these inorganic layered compounds preferably accounts for a mass ratio within the above-described range.

A general dispersion method for the inorganic layered compound used in the protective layer is described below. From 5 to 10 parts by mass of the swelling layered compound described above as a preferred inorganic layered compound is added to 100 parts by mass of water, thoroughly blended and swelled with water, and then dispersed by a dispersing machine. Examples of the dispersing machine used here include various mills of dispersing the layered compound by directly applying mechanical force, a high-speed agitation-type dispersing machine having large shearing force, and a dispersing machine of giving highly intensified ultrasonic energy. Specific examples thereof include a ball mill, a sand grinder mill, a visco-mill, a colloid mill, a homogenizer, a dissolver, a polytron, a homomixer, a homoblender, a KD mill, a jet agitator, a capillary emulsifier, a liquid siren, an electromagnetic strain-type ultrasonic generator, and an emulsifier with Pullman's whistle. A dispersion containing from 5 to 10 mass % of the inorganic layered compound dispersed by the above-described method is in a highly viscous or gelled state, and its storage stability is very good. At the time of preparing a coating solution for the protective layer by using this dispersion, the dispersion is preferably diluted with water, thoroughly stirred and blended with a binder solution.

In this coating solution for the protective layer, known additives such as surfactant for enhancing the coatability and water-soluble plasticizer for improving the physical properties of film can be added in addition to the inorganic layered compound. Examples of the water-soluble plasticizer include propionamide, cyclohexanediol, glycerin and sorbitol. A water-soluble (meth)acrylic polymer may also be added. Furthermore, in this coating solution, known additives for enhancing adhesion to the image recording layer and aging stability of the coating solution may be added.

The thus-prepared coating solution for the protective layer is coated on the photosensitive layer provided on the support, and then dried to form a protective layer. The coating solvent may be appropriately selected according to the binder but when a water-soluble polymer is used, distilled water or purified water is preferably used as the solvent. The coating method of the protective layer is not particularly limited, and known methods such as method described in U.S. Pat. No. 3,458,311 and JP-B-55-49729 may be applied. Specific examples of the coating method for the protective layer include a blade coating method, an air knife coating method, a gravure coating method, a roll coating method, a spray coating method, a dip coating method and a bar coating method.

The coated amount of the protective layer is preferably from 0.05 to 10 $g/m^2$ in terms of the coated amount after drying. In the case of containing an inorganic layered compound, the coated amount is more preferably from 0.1 to 0.5 $g/m^2$ and in the case of not containing an inorganic layered compound, the coated amount is more preferably from 0.5 to 5 $g/m^2$.

(Backcoat Layer)

After the support is subjected to a surface treatment or the undercoat layer is formed, a backcoat may be provided on the back surface of the support, if desired.

Suitable examples of the backcoat include a coat layer comprising an organic polymer compound described in JP-A-5-45885 and a coat layer comprising a metal oxide obtained by hydrolyzing and polycondensing an organic or inorganic metal compound described in JP-A-6-35174. Among these, those using an alkoxy compound of silicon, such as $Si(OCH_3)_4$, $Si(OC_2H_5)_4$, $Si(OC_3H_7)_4$ and $Si(OC_4H_9)_4$, are preferred because the raw material is inexpensive and easily available.

<Exposure>

In the plate-making method of the present invention, the lithographic printing plate precursor is imagewise exposed by exposure through a transparent original having a line image, a halftone image or the like, or by laser scan-exposure based on digital data. Examples of the light source for exposure include a carbon arc lamp, a high-pressure mercury lamp, a xenon lamp, a metal halide lamp, a fluorescent lamp, a tungsten lamp, a halogen lamp, an ultraviolet light laser, a visible light laser and an infrared light laser. In particular, a laser is preferred. Examples thereof include a semiconductor laser of emitting light at 250 to 420 nm and a solid or semiconductor laser of emitting infrared ray at 760 to 1,200 nm. In the case of using a laser, the imagewise scan-exposure is preferably performed according to digital data. Also, in order to shorten the exposure time, a multi-beam laser device is preferably used.

Such a laser is used by mounting it on a so-called plate setter which performs the imagewise exposure under the control by a computer.

In the present invention, the development processing may performed immediately after the exposure step, but a heat-treatment step (preheating) may also be provided between the exposure step and the development step. The heat treatment has an effect of enhancing the press life and furthermore elevating the uniformity of image curing degree in the plate plane. The conditions therefor may be appropriately set within the range of giving these effects. Examples of the heating means include a convection oven in common use, an IR irradiation device, an IR laser, a microwave device and a Wisconsin oven. Specifically, the heat treatment may be performed by holding the plate at a surface peak temperature of 70 to 150° C. for 1 second to 5 minutes, preferably at 80 to 140° C. for 5 seconds to 1 minute, more preferably at 90 to 130° C. for 10 to 30 seconds. These ranges are preferred in that the above-described effects can be efficiently obtained and an adverse effect such as deformation of the printing plate due to heat is not brought about.

At this time, the heat-treatment means used for the heat-treatment step and the developing apparatus used for the development step are preferably connected together to automatically perform the processing in a continuous manner. This is specifically a plate-making line where a plate setter and a developing apparatus are connected through conveying means such as conveyer. Also, heating means may be provided between the plate setter and the developing apparatus, or heating means may be integrated with the developing apparatus.

In the case where the printing plate used is susceptible to ambient light in the working environment, the plate-making line is preferably shielded from light by a filter, a cover or the like. Of course, when a heat treatment is not provided, the exposure means is connected directly to the development processing means and the continuous processing is automatically performed.

In the present invention, the development processing may performed immediately after the exposure step, but a water-washing step (pre-washing) may be provided between the exposure step and the development step for the purpose of, for example, removing the protective layer.

The above-described two steps both are sometimes provided, or either one step is introduced in some cases.

After the development processing is completed in this way and an image is formed, entire surface exposure with actinic rays such as ultraviolet light may be performed to accelerate the curing of the image part. Examples of the light source for the entire surface exposure include a carbon arc lamp, a mercury lamp, a gallium lamp, a metal halide lamp, a xenon lamp, a tungsten lamp and various lasers. In order to obtain a sufficiently long press life, the entire surface exposure amount is preferably at least 10 $mJ/cm^2$ or more, more preferably 100 $mJ/cm^2$ or more.

Furthermore, heating may be performed at the same time with the entire surface exposure and by performing the heating, the press life is more enhanced. Examples of the heating device include a convection oven in common use, an IR irradiation device, an IR laser, a microwave device and a Wisconsin oven. At this time, the plate surface temperature is preferably from 30 to 150° C., more preferably from 35 to 130° C., still more preferably from 40 to 120° C.

In the present invention, the lithographic printing plate precursor on which an image is formed through the development processing and an additional treatment in the preheating or pre-washing step, is preferably dried so as to facilitate the subsequent handling. Examples of the drying method include natural drying of leaving the plate to stand in a room, hot air drying, and a method using a gum coater or a dryer attached to an automatic developing machine.

EXAMPLES

The present invention is described in greater detail below by referring to Examples, but the present invention should not be construed as being limited thereto.

Production of Support:

A 0.3 mm-thick aluminum plate (construction material: 1050) was degreased with an aqueous 10 mass % sodium aluminate solution at 50° C. for 30 seconds to remove the rolling oil on the surface. Thereafter, the aluminum plate surface was grained using three nylon brushes implanted with bundled bristles having a diameter of 0.3 mm and a water suspension (specific gravity: 1.1 g/cm$^3$) of pumice having a median diameter of 25 μm, and then thoroughly washed with water. This plate was etched by dipping it in an aqueous 25 mass % sodium hydroxide solution at 45° C. for 9 seconds and after washing with water, dipped in 20 mass % nitric acid at 60° C. for 20 seconds, followed by washing with water. At this time, the etched amount of the grained surface was about 3 g/m$^2$.

Thereafter, the plate was continuously subjected to an electrochemical surface-roughening treatment by using an AC voltage of 60 Hz. The electrolytic solution used here was an aqueous 1 mass % nitric acid solution (containing 0.5 mass % of aluminum ion) at a liquid temperature of 50° C. This electrochemical surface-roughening treatment was performed using an AC power source of giving a rectangular wave AC having a trapezoidal waveform such that the time TP necessary for the current value to reach the peak from zero was 0.8 msec and the duty ratio was 1.1, by disposing a carbon electrode as the counter electrode. The auxiliary anode was ferrite. The current density was 30 A/dm$^2$ in terms of the peak value of current, and 5% of the current flowing from the power source was split to the auxiliary anode.

The quantity of electricity at the nitric acid electrolysis was 175 C/dm$^2$ when the aluminum plate was serving as the anode.

The aluminum plate was then water-washed by spraying.

Thereafter, the aluminum plate was subjected to an electrochemical surface-roughening treatment in the same manner as in the nitric acid electrolysis above by using, as the electrolytic solution, an aqueous 0.5 mass % hydrochloric acid solution (containing 0.5 mass % of aluminum ion) at a liquid temperature of 50° C. under the conditions that the quantity of electricity was 50 C/dm$^2$ when the aluminum plate was serving as the anode, and then water-washed by spraying. This plate was treated using 15 mass % sulfuric acid (containing 0.5 mass % of aluminum ion) as the electrolytic solution at a current density of 15 A/dm$^2$ to provide a DC anodic oxide film of 2.5 g/m$^2$, then washed with water and dried. The centerline average roughness (Ra) of this substrate was measured using a needle having a diameter of 2 μm and found to be 0.51 μm.

Furthermore, the following Undercoat Solution (1) was coated to have a dry coated amount of 10 mg/m$^2$. In this way, a support for use in the tests later was produced.

Undercoat Solution (1):

| | |
|---|---|
| Undercoat Compound (1) shown below | 0.017 g |
| Methanol | 9.00 g |
| Water | 1.00 g |

Undercoat Compound (1):

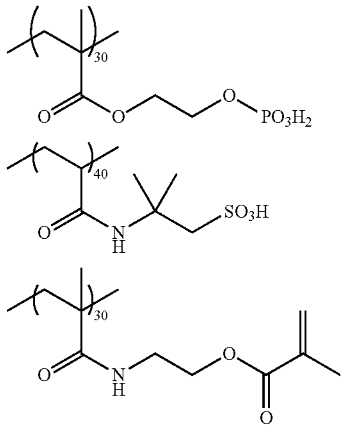

<Production of Lithographic Printing Plate Precursor A>

On the support with an undercoat layer prepared above, Coating Solution (1) for Image Recording Layer was bar-coated and then dried in an oven at 100° C. for 75 seconds to form an image recording layer having a dry coated amount of 1.0 g/m$^2$, and Coating Solution (1) for Protective Layer having the following composition was further coated thereon by using a bar to give a dry coated amount of 1.0 g/m$^2$ and then dried in an oven under the conditions of 100° C. and 90 seconds to obtain Lithographic Printing Plate Precursor A.

Coating Solution (1) for Image Recording Layer was obtained by mixing and stirring Photosensitive Solution (1) and Microcapsule Solution (1) shown below immediately before coating.

Photosensitive Solution (1):

| | |
|---|---|
| Binder Polymer (1) | 0.162 g |
| Polymerization Initiator (1) shown below | 0.100 g |
| Infrared Absorbent (1) shown below | 0.020 g |
| Polymerizable compound, Aronics M315 (produced by Toa Gosei Co., Ltd.) | 0.385 g |
| Fluorine-Containing Surfactant (1) shown below | 0.044 g |
| Methyl ethyl ketone | 1.091 g |
| 1-Methoxy-2-propanol | 8.609 g |

Microcapsule Solution (1):

| | |
|---|---|
| Microcapsule (1) synthesized as follows | 2.640 g |
| Water | 2.425 g |

Binder Polymer (1):

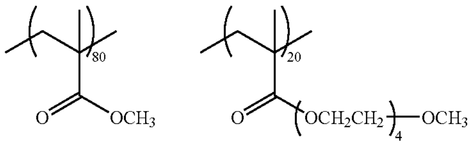

Polymerization Initiator (1):

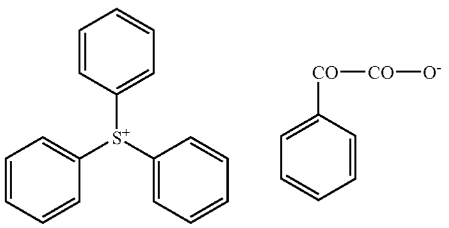

Infrared Absorbent (1):

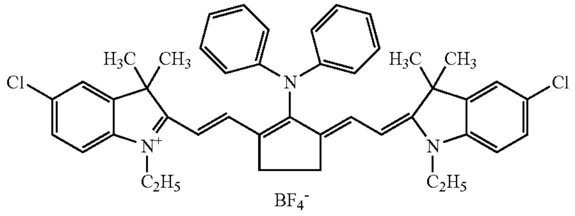

Fluorine-Containing Surfactant (1):

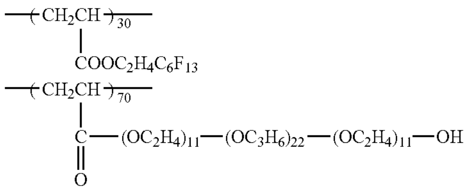

Synthesis of Microcapsule (1):

As the oil phase component, 10 g of trimethylolpropane and xylene diisocyanate adduct (Takenate D-110N, produced by Mitsui Takeda Chemicals, Inc., a 75% ethyl acetate solution), 6.00 g of Aronics M-215 (produced by Toa Gosei Co., Ltd.) and 0.12 g of Pionin A-41C (produced by Takemoto Yushi Co., Ltd.) were dissolved in 16.67 g of ethyl acetate. As the aqueous phase component, 37.5 g of an aqueous 4 mass % PVA-205 (produced by Kuraray Co., Ltd.) solution was prepared. The oil phase component and the aqueous phase component were mixed and emulsified in a homogenizer at 12,000 rpm for 10 minutes. The resulting emulsified product was added to 25 g of distilled water, and the mixture was stirred at room temperature for 30 minutes and then stirred at 40° C. for 2 hours. The thus-obtained microcapsule solution was diluted with distilled water to a solid content concentration of 15 mass %. The average particle diameter was 0.2 μm.

Coating Solution (1) for Protective Layer:

| | |
|---|---|
| Water | 88 g |
| Polyvinyl Alcohol PVA105 (produced by Kuraray Co., Ltd.) | 10 g |
| Polyethylene glycol (molecular weight: 2,000) | 2 g |
| Surfactant shown below | 1 g |

Surfactant:

$C_{12}H_{25}-O-(C_2H_4O)_8-H$

<Production of Lithographic Printing Plate Precursor B>

On the support prepared above, Coating Solution (2) for Image Recording Layer having the following composition was bar-coated and dried in an oven at 100° C. for 60 seconds to form an image recording layer having a dry coated amount of 1.4 g/m$^2$, and Coating Solution (1) for Protective Layer having the composition above was further coated thereon to give a dry coated mass of 0.5 g/m$^2$ and then dried at 120° C. for 1 minute to obtain Lithographic Printing Plate Precursor B.

Coating Solution (2) for Image Recording Layer

| | |
|---|---|
| Binder Polymer (1) | 2.0 g |
| Polymerizable compound: isocyanuric acid EO-modified triacrylate (Aronics M-315, produced by Toa Gosei Co., Ltd.) | 1.5 g |
| Compound (1) shown below | 0.15 g |
| Compound (2) shown below | 0.20 g |
| Compound (3) shown below | 0.4 g |
| Ethyl Violet | 0.1 g |
| Thermopolymerization inhibitor: N-nitrosophenylhydroxylamine aluminum salt | 0.1 g |
| Water-Soluble Fluorine-Containing Surfactant (1) | 0.02 g |
| Tetraethylamine hydrochloride | 0.06 g |
| 1-Methoxy-2-propanol | 17.5 g |
| Methyl ethyl ketone | 19.0 g |

(1)

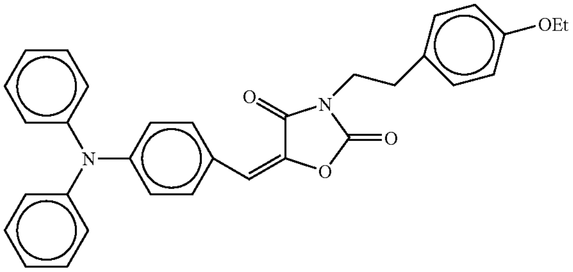

-continued (2)

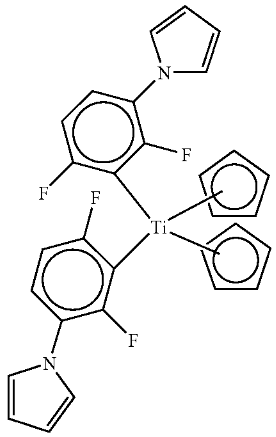

(3)

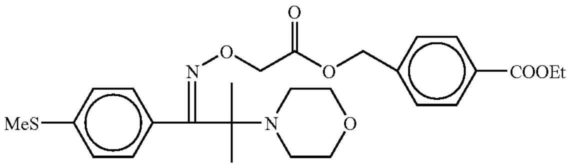

<Production of Lithographic Printing Plate Precursor C>

On the support with an undercoat layer prepared above, Coating Solution (3) for Image Recording Layer having the following composition was bar-coated and then dried in an oven at 70° C. for 60 seconds to form an image recording layer having a dry coated amount of 1.1 g/$m^2$, and Coating Solution (2) for Protective Layer having the following composition was further coated thereon by using a bar to give a dry coated amount of 0.2 g/$m^2$ and then dried at 125° C. for 70 seconds to obtain Lithographic Printing Plate Precursor C.

[Coating Solution (3) for Image Recording Layer]

| | |
|---|---|
| Binder Polymer (1) having the structure below (average molecular weight: 80,000) | 0.54 g |
| Polymerizable compound: isocyanuric acid EO-modified triacrylate (Aronics M-315, produced by Toa Gosei Co., Ltd.) | 0.40 g |
| Polymerizable compound: ethoxylated trimethylolpropane triacrylate (SR9035, produced by Nippon Kayaku Co., Ltd., EO addition molar number: 15, molecular weight: 1,000) | 0.08 g |
| Sensitizing Dye (1) shown below | 0.06 g |
| Polymerization Initiator (2) shown below | 0.18 g |
| Chain Transfer Agent (1) shown below | 0.07 g |
| Dispersion of ε-phthalocyanine pigment (pigment: 15 parts by mass, Binder Polymer (1) as the dispersant: 10 parts by mass, cyclohexanone/methoxypropyl acetate/1-methoxy-2-propanol as solvents = 15 parts by mass/20 parts by mass/40 parts by mass) | 0.40 g |
| Thermopolymerization inhibitor: N-nitrosophenylhydroxylamine aluminum salt | 0.01 g |
| Water-Soluble Fluorine-Containing Surfactant (1) | 0.001 g |
| Polyoxyethylene-polyoxypropylene condensate (Pluronic L44, produced by Asahi Denka Co., Ltd.) | 0.04 g |
| Tetraethylamine hydrochloride | 0.01 g |
| 1-Methoxy-2-propanol | 3.5 g |
| Methyl ethyl ketone | 8.0 g |

-continued

Sensitizing Dye (1):

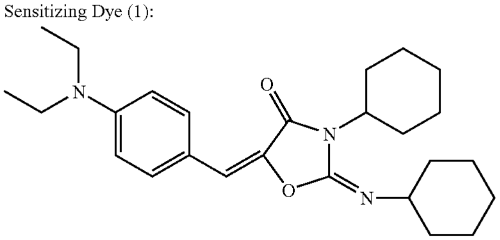

Polymerization Initiator (2):

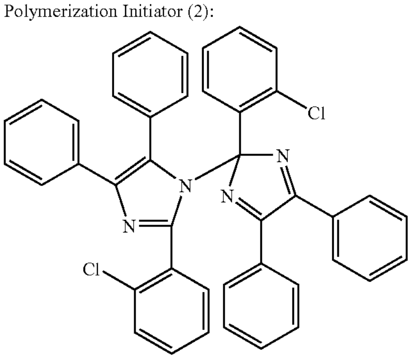

Chain Transfer Agent (1):

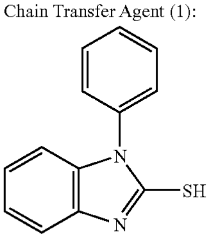

Lithographic Printing Plate Precursor C was obtained in the same manner as Lithographic Printing Plate Precursor A except that Coating Solution (2) for Protective layer having the following composition was coated by using a bar to give a dry coated amount of 0.2 g/$m^2$.

[Coating Solution (2) for Protective Layer]

| | |
|---|---|
| Mica Liquid Dispersion (1) shown below | 13.0 g |
| Polyvinyl alcohol (saponification degree: 98 mol %, polymerization degree: 500) | 1.3 g |
| Sodium 2-ethylhexylsulfosuccinate | 0.2 g |
| Poly(vinylpyrrolidone/vinyl acetate (1/1)), molecular weight: 70,000 | 0.05 g |
| Surfactant (EMALEX 710, produced by produced by Nihon Emulsion Co., Ltd.) | 0.05 g |
| Water | 133 g |

(Preparation of Mica Liquid Dispersion (1))

In 368 g of water, 32 g of synthetic mica ["SOMASIF ME-100", produced by CO-OP Chemical Co., Ltd., aspect ratio: 1,000 or more) was added and dispersed with use of a homogenizer until the average particle diameter (according to the laser scattering method) became 0.5 μm, whereby Mica Liquid Dispersion (1) was obtained.

Furthermore, the oxygen permeation ratio of the protective layer was measured under the following conditions, as a result, the oxygen permeation ratio of the protective layer was 2.0 ml/($m^2$·day·atom)

(Measurement of Oxygen Permeation Ratio)

A protective layer (oxygen-blocking layer) was coated on the surface of a photographic paper having a thickness of about 200 μm, of which both surfaces were coated with polyethylene to a thickness of about 20 μm, in the same manner as the coating on the image recording layer, and then dried to produce a sample for measurement. The preliminarily measured oxygen permeation ratio of the photographic paper was about 700 ml/($m^2$·day·atom) under the following measurement conditions, and this is a value small enough to neglect at the measurement of permeation ratio of the oxygen blocking layer.

Using the sample obtained above, the oxygen permeation ratio [ml/($m^2$·day·atom)] was measured under the conditions of 25° C. and 60% RH by OX-TRAN 2/20 manufactured by Mocon Corp. according to the gas permeation test method described in JIS K7126B and ASTM D3985.

<Preparation of Lithographic Printing Plate Precursor D>

Lithographic Printing Plate Precursor D was obtained in the same manner as Lithographic Printing Plate Precursor A except that the polymerizable compound Aronics M-315 in Coating Solution (1) for Image Recording Layer was changed to PLEX6661-O (7,7,9-trimethyl-4,13-dioxo-3,14-dioxa-5,12-diazahexadecane-1,16-diyldimethacrylate, produced by Rohm GmbH & Co. KG) and Binder Polymer (1) was changed to the polymer shown below.

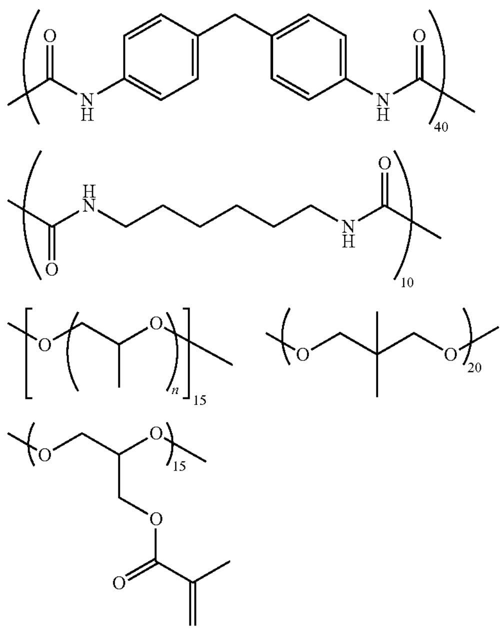

<Preparation of Lithographic Printing Plate Precursor E>

Lithographic Printing Plate Precursor E was obtained in the same manner as Lithographic Printing Plate Precursor A except that the polymerizable compound Aronics M-315 in Coating Solution (1) for Image Recording Layer was changed to PLEX6661-O (7,7,9-trimethyl-4,13-dioxo-3,14-dioxa-5,12-diazahexadecane-1,16-diyldimethacrylate, produced by Rohm GmbH & Co. KG) and Binder Polymer (1) was changed to the polymer shown below.

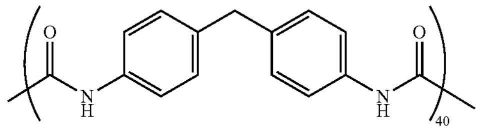

-continued

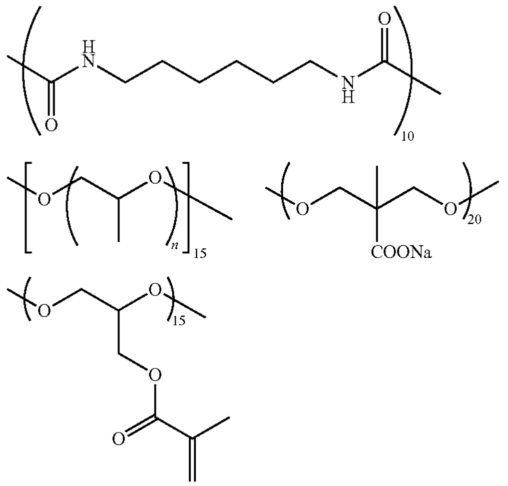

<Preparation of Lithographic Printing Plate Precursor F>

Lithographic Printing Plate Precursor F was obtained in the same manner as Lithographic Printing Plate Precursor C except that the polymerizable compound Aronics M-315 in Coating Solution (3) for Image Recording Layer was changed to PLEX6661-O (7,7,9-trimethyl-4,13-dioxo-3,14-dioxa-5,12-diazahexadecane-1,16-diyldimethacrylate, produced by Rohm GmbH & Co. KG) and the binder polymer was changed to the polymer shown below.

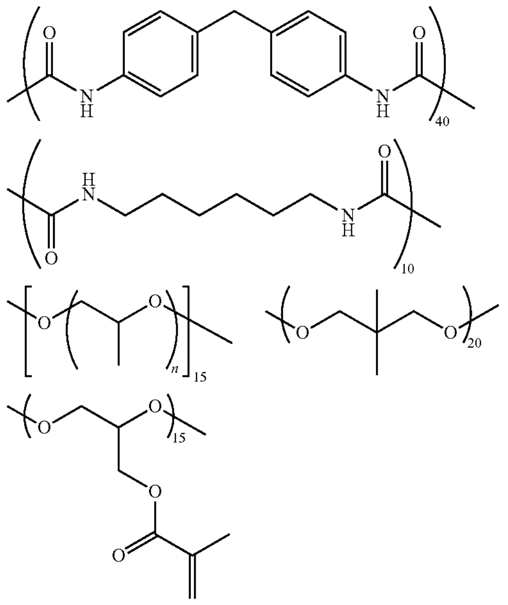

<Preparation of Lithographic Printing Plate Precursor G>

Lithographic Printing Plate Precursor G was obtained in the same manner as Lithographic Printing Plate Precursor C except that the polymerizable compound Aronics M-315 in Coating Solution (3) for Image Recording Layer was changed to PLEX6661-O (7,7,9-trimethyl-4,13-dioxo-3,14-dioxa-5,12-diazahexadecane-1,16-diyldimethacrylate, produced by Rohm GmbH & Co. KG) and the binder polymer was changed to the polymer shown below.

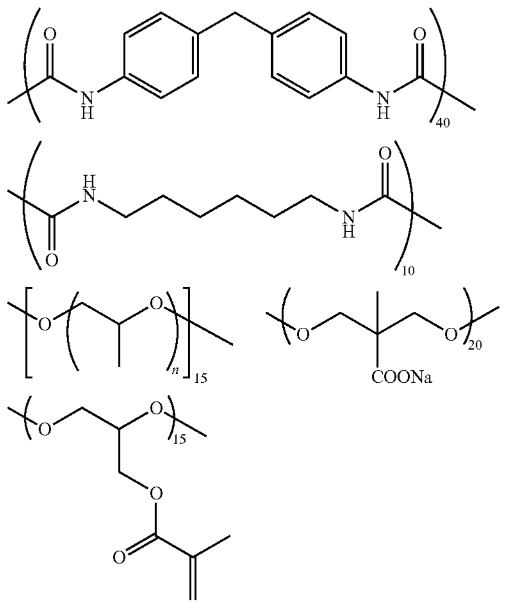

<Preparation of Lithographic Printing Plate Precursor H>

The support of Lithographic Printing Plate Precursor H, prepared as follows, was used. On the thus-prepared support with an undercoat layer, thoroughly the same image recording layer and protective layer as those of Lithographic Printing Plate Precursor F were coated to obtain Lithographic Printing Plate Precursor H.

Preparation Method of Support of Lithographic Printing Plate Precursor H:

A 0.3 mm-thick aluminum substrate was degreased by dipping the aluminum substrate in an aqueous solution containing 40 g/l of sodium hydroxide at 60° C. for 8 seconds and then rinsed with demineralized water for 2 seconds. Subsequently, the substrate was electrochemically grained over 15 seconds by using an AC current in an aqueous solution containing 12 g/l of hydrochloric acid and 38 g/l of aluminum sulfate (18-hydrate) at a temperature of 33° C. and a current density of 130 A/$dm^2$. After rinsing with demineralized water for 2 seconds, the aluminum substrate was desmutted by etching it with an aqueous solution containing 155 g/l of sulfuric acid at 70° C. for 4 seconds and then rinsed with demineralized water at 25° C. for 2 seconds. This substrate was subsequently subjected to anodization over 13 seconds in an aqueous solution containing 155 g/l of sulfuric acid at a temperature of 45° C. and a current density of 22 A/$dm^2$ and then washed with demineralized water for 2 seconds. Furthermore, the substrate was post-treated for 10 seconds with a solution containing 4 g/l of polyvinylphosphonic acid at 40° C., then rinsed with demineralized water at 20° C. for 2 seconds and dried.

<Preparation of Lithographic Printing Plate Precursor I>

On the support obtained by the preparation method of the support of Lithographic Printing Plate Precursor H, thoroughly the same image recording layer and protective layer as those of Lithographic Printing Plate Precursor G were coated to obtain Lithographic Printing Plate Precursor I.

<Preparation of Lithographic Printing Plate Precursor J>

In the preparation method of the support of Lithographic Printing Plate Precursor H, after performing the electrochemical surface-roughening treatment and anodization treatment, the hydrophilization treatment with polyvinylphosphonic acid was not applied to the support surface. On the support obtained, thoroughly the same image recording layer and protective layer as those of Lithographic Printing Plate Precursor G were coated to obtain Lithographic Printing Plate Precursor J.

<Preparation of Lithographic Printing Plate Precursor K>

A 0.3 mm-thick aluminum plate (construction material according to JIS A1050) was etched by dipping it in 10 mass % sodium hydroxide at 60° C. for 25 seconds, washed with running water, washed for neutralization with 20 mass % nitric acid and then washed with water. The resulting plate was subjected to an electrolytic surface-roughening treatment in an aqueous 1 mass % nitric acid solution by using a sinusoidal wave alternating current at an anodic time electricity of 300 coulomb/$dm^2$. Subsequently, the aluminum plate was dipped in an aqueous 1 mass % sodium hydroxide solution at 40° C. for 5 seconds, desmutted at 60° C. for 40 seconds in an aqueous 30 mass % sulfuric acid solution, and then subjected to anodization in an aqueous 20 mass % sulfuric acid solution for 2 minutes under the condition of a current density of 2 A/$dm^2$ to provide an anodic oxide film having a thickness of 2.7 g/$m^2$.

The centerline average roughness (Ra) of the thus-obtained support was measured using a needle having a diameter of 2 μm and found to be 0.25 μm (Ra indication according to JIS B0601).

On the support obtained in this way, thoroughly the same image recording layer and protective layer as those of Lithographic Printing Plate Precursor G were coated to obtain Lithographic Printing Plate Precursor K.

<Preparation of Lithographic Printing Plate Precursor L>

A 0.3 mm-thick aluminum plate (construction material according to JIS A1050) was etched by dipping it in 10 mass % sodium hydroxide at 60° C. for 25 seconds, washed with running water, washed for neutralization with 20 mass % nitric acid and then washed with water. The resulting plate was subjected to an electrolytic surface-roughening treatment in an aqueous 1 mass % nitric acid solution by using a sinusoidal wave alternating current at an anodic time electricity of 300 coulomb/$dm^2$. Subsequently, the aluminum plate was dipped in an aqueous 1 mass % sodium hydroxide solution at 40° C. for 5 seconds, desmutted at 60° C. for 40 seconds in an aqueous 30 mass % sulfuric acid solution, and then subjected to anodization in an aqueous 20 mass % sulfuric acid solution for 2 minutes under the condition of a current density of 2 A/$dm^2$ to provide an anodic oxide film having a thickness of 2.7 g/$m^2$. Thereafter, the plate was treated with an aqueous 1 mass % sodium silicate solution at 20° C. for 10 seconds.

The centerline average roughness (Ra) of the thus-obtained support was measured using a needle having a diameter of 2 μm and found to be 0.25 μm (Ra indication according to JIS B0601).

On the support obtained in this way, thoroughly the same image recording layer and protective layer as those of Lithographic Printing Plate Precursor G were coated to obtain Lithographic Printing Plate Precursor L.

1. Production of Developing Solution

Developing Solutions 1 to 26 having the composition shown in Tables 1 and 2 below were produced. In the Tables, the unit is [g]. Here, the pH of the developing solution was adjusted to 7 by using phosphoric acid and sodium hydroxide.

TABLE 1

(pH was adjusted to 7)

| | Developing Solution | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| Water | 8969.8 | 8769.8 | 8469.8 | 8269.8 | 7969.8 | 7819.8 | 7469.8 | 7969.8 | 7969.8 | 7969.8 | 7969.8 | 7969.8 | 7969.8 |
| Surfactant I-a | | 200 | 500 | 700 | 1000 | 1000 | 1500 | | | | | | 500 |
| Surfactant IV-a | | | | | | | | 1000 | | | | | 500 |
| Surfactant V-a | | | | | | | | | 1000 | | | | |
| Surfactant IV-d | | | | | | | | | | 1000 | | | |
| Surfactant a) | | | | | | | | | | | 1000 | | |
| Surfactant b) | | | | | | | | | | | | 1000 | |
| Benzyl alcohol | | | | | | 50 | | | | | | | |
| Ethylene glycol | | | | | | 50 | | | | | | | |
| Glycerin | | | | | | 50 | | | | | | | |
| Gum arabic | 250 | 250 | 250 | 250 | 250 | 250 | 250 | 250 | 250 | 250 | 250 | 250 | 250 |
| Enzyme-modified potato starch | 700 | 700 | 700 | 700 | 700 | 700 | 700 | 700 | 700 | 700 | 700 | 700 | 700 |
| Sodium salt of dioctylsulfosuccinic acid ester | 50 | 50 | 50 | 50 | 50 | 50 | 50 | 50 | 50 | 50 | 50 | 50 | 50 |
| Monoammonium phosphate | 10 | 10 | 10 | 10 | 10 | 10 | 10 | 10 | 10 | 10 | 10 | 10 | 10 |
| citric acid | 10 | 10 | 10 | 10 | 10 | 10 | 10 | 10 | 10 | 10 | 10 | 10 | 10 |
| EDTA-4-sodium salt | 10 | 10 | 10 | 10 | 10 | 10 | 10 | 10 | 10 | 10 | 10 | 10 | 10 |
| 2-Bromo-2-nitropropane-1,3-diol | 0.1 | 0.1 | 0.1 | 0.1 | 0.1 | 0.1 | 0.1 | 0.1 | 0.1 | 0.1 | 0.1 | 0.1 | 0.1 |
| 2-Methyl-4-isothiazolin-3-one | 0.1 | 0.1 | 0.1 | 0.1 | 0.1 | 0.1 | 0.1 | 0.1 | 0.1 | 0.1 | 0.1 | 0.1 | 0.1 |
| Total | 10000 | 10000 | 10000 | 10000 | 10000 | 10000 | 10000 | 10000 | 10000 | 10000 | 10000 | 10000 | 10000 |

a):

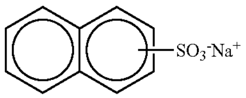

$C_{12}H_{25}—O—(CH_2CH_2O)_n—OH$ b)

TABLE 2

| | Developing Solution | | | | | | | | | | | | |
|---|---|---|---|---|---|---|---|---|---|---|---|---|---|
| | 14 | 15 | 16 | 17 | 18 | 19 | 20 | 21 | 22 | 23 | 24 | 25 | 26 |
| Water | 9969.8 | 9769.8 | 9469.8 | 9269.8 | 9119.8 | 8969.8 | 8469.8 | 9269.8 | 9269.8 | 9269.8 | 9269.8 | 9269.8 | 9369.8 |
| Surfactant I-a | | 200 | 500 | 700 | 700 | 1000 | 1500 | | | | | | 350 |
| Surfactant IV-a | | | | | | | | 700 | | | | | 350 |
| Surfactant V-a | | | | | | | | | 700 | | | | |
| Surfactant IV-d | | | | | | | | | | 700 | | | |
| Surfactant a) | | | | | | | | | | | 700 | | |
| Surfactant b) | | | | | | | | | | | | 700 | |
| Benzyl alcohol | | | | | 50 | | | | | | | | |
| Ethylene glycol | | | | | 50 | | | | | | | | |
| Glycerin | | | | | 50 | | | | | | | | |
| Monoammonium phosphate | 10 | 10 | 10 | 10 | 10 | 10 | 10 | 10 | 10 | 10 | 10 | 10 | 10 |
| Citric acid | 10 | 10 | 10 | 10 | 10 | 10 | 10 | 10 | 10 | 10 | 10 | 10 | 10 |
| EDTA-4-sodium salt | 10 | 10 | 10 | 10 | 10 | 10 | 10 | 10 | 10 | 10 | 10 | 10 | 10 |
| 2-Bromo-2-nitropropane-1,3-diol | 0.1 | 0.1 | 0.1 | 0.1 | 0.1 | 0.1 | 0.1 | 0.1 | 0.1 | 0.1 | 0.1 | 0.1 | 0.1 |
| 2-Methyl-4-isothiazolin-3-one | 0.1 | 0.1 | 0.1 | 0.1 | 0.1 | 0.1 | 0.1 | 0.1 | 0.1 | 0.1 | 0.1 | 0.1 | 0.1 |
| Total | 10000 | 10000 | 10000 | 10000 | 10000 | 10000 | 10000 | 10000 | 10000 | 10000 | 10000 | 10000 | 10000 |

(pH was adjusted to 7)

2. Evaluation of Plate Making (Evaluation of Developability of Unexposed Area)

Evaluation 1: Exposure→Preheating→Development→Natural Drying

The lithographic printing precursor obtained was processed in the order of exposure, preheating, development and drying. Here, the setter used for exposure was changed depending on the photosensitive material. The relationship between the setter used and the lithographic printing plate precursor is as follows.

| Light Source (Setter) Used for Exposure | Photosensitive Material |
|---|---|
| infrared semiconductor laser (Trendsetter 3244VX, manufactured by Creo) | Lithographic Printing Plate Precursors A, D and E |

Exposure conditions of the setter used are as follows. Trendsetter 3244VX, manufactured by Creo:

Imagewise exposure was performed by loading a water-cooling type 40 W infrared semiconductor laser under the conditions of output of 9 W, external drum rotating speed of 210 rpm, and resolution of 2,400 dpi.

The exposed photosensitive material was placed in an oven within 30 seconds, the entire surface of the lithographic printing plate precursor was heated by blowing hot air, and the plate was kept at 110° C. for 15 seconds Thereafter, the plate was developed using the developing solution shown in Tables 1 and 2 within 30 seconds. The processor used for the development was the developing processor shown in FIG. 1. In FIG. 1, the development was performed by setting the developing solution in a developing tank 106 to a liquid temperature of 25° C. In the Figure, 108 is a conveying roller, and the passing time from the inlet to the outlet was set to 15 seconds. In the Figure, 112 is a rotating brush, and the rotating brush was rotated at a speed of 280 mm/sec in the forward direction with respect to the conveying direction. The lithographic printing plate precursor discharged from the developing tank was dried by natural drying. Incidentally, the indices for the evaluation of developability of the unexposed area are as described later. In the case of using the automatic developing processor of FIG. 1, the processor was used under the above-described exposure and preheating conditions.

In this way, the developability of unexposed area and the printing performance were evaluated using the produced lithographic printing plate. In addition, as regards the evaluation of developing solution, dispersibility of the photosensitive layer (image recording layer) was evaluated. The evaluation methods and evaluation indices for the developability of unexposed area, the printing performance and the dispersibility of photosensitive layer are described later.

Figure 2:
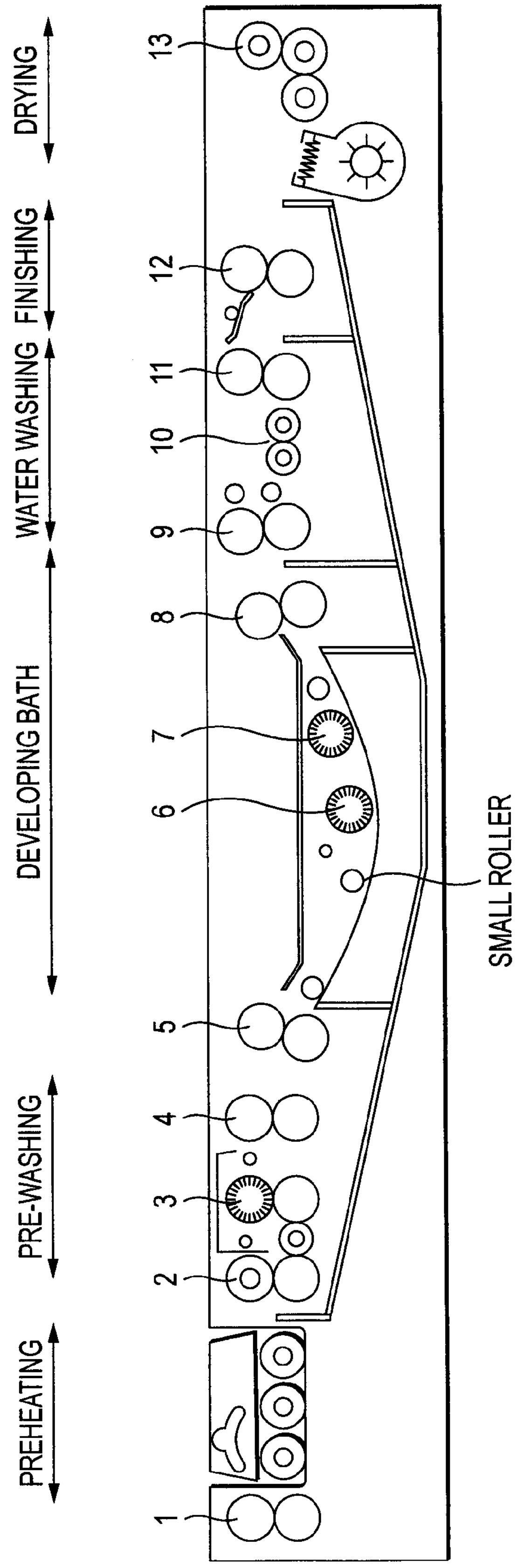
FIG. 2 is a schematic view of another developing machine.

Evaluation 2: Exposure→Preheating→Pre-Washing→Development→Water-Washing→Finishing→Drying An example using an automatic developing processor which has been conventionally used as an automatic developing processor (sometimes referred to as an "automatic processor") is described below. The lithographic printing plate precursor (Lithographic Printing Plate Precursors B, C, F, C, H, I and J) was imagewise exposed by a violet semiconductor laser plate setter, Vx9600 (mounted therein an InGaN semiconductor laser with emission of 405 nm±10 nm/output or 30 mW), manufactured by FUJIFILM Electronic Imaging, Ltd. As for the image, halftone dots of 35% were drawn using an FM screen (TAFFETA 20) manufactured by Fuji Photo Film Co., Ltd. with a plate surface exposure amount of 0.09 mJ/cm$^2$ at a resolution of 2,438 dpi. The exposed lithographic printing plate precursor after imagewise exposure was developed within 30 seconds by using an automatic developing processor, LP1250PLX, manufactured by Fuji Photo Film Co., Ltd. This automatic developing processor was composed of a heating unit/a water-washing unit/a developing unit/a rinsing unit/a finishing unit in this order. In the heating unit, the heating was performed under the conditions of 100° C. and 10 seconds. The developing solution of the present invention, water, and gum solution FP-2W (produced by Fujifilm Corp., prepared by diluting the stock solution at 1:1) were charged into the developing tank, the water-washing tank and the finishing tank, respectively. The temperature of the developing solution was 28° C., and the lithographic printing plate precursor was conveyed at a conveying speed of 110 cm/min. FIG. 2 schematically shows this automatic developing processor.

The evaluation indices are as follows.

X: Not developed at all.

ΔX: Slightly developed with small reduction in the non-image density, but large film remaining.

Δ: Level of allowing slight remaining of thin film but causing no trouble even when used for printing.

Δ○: Level of allowing essentially no remaining of film and causing very occasionally remaining of thin film.

○: Level of causing absolutely no problem without film remaining but allowing production of 2 or 3 processed plates of the ○Δ level out of 20 processed plates.

◎: Level of causing no color remaining in all of 20 processed plates.

The evaluation results are shown in Tables 4 to 19.

3. Evaluation of Printing Performance

For evaluating the desensitization property of the developing solution, a lithographic printing plate precursor from which the photosensitive layer was removed (in an uncoated plate state) was loaded on the cylinder of a printing press, SOR-M, manufactured by Heidelberg and after supplying a fountain solution and ink by using fountain solution (EU-3 (etching solution produced by Fuji Photo Film Co., Ltd.)/water/isopropyl alcohol=1/89/10 (by volume)) and TRANS-G(N) black ink (produced by Dai-Nippon Ink Chemical Co., Ltd.), printing of 500 sheets was performed at a printing speed of 6,000 sheets/hour. When staining did not occur, this is indicated by ○, and when occurred, this is indicated by X. However, Table 19 shows the results when print staining of the non-image part after development was evaluated using the above-described printing conditions.

In Examples of Table 19, the evaluation results are shown on a 6-grade scale. A score of 3 or more is allowable level, and a larger score indicates a higher level.

The results are shown in Tables 4 to 19.

4. Evaluation of Dispersibility of Photosensitive Layer in Developing Solution

Respective concentrate solutions of the coating solution for image recording layer and the coating solution for protective layer used in the preparation of Lithographic Printing Plate Precursor A (hereinafter sometimes simply referred to as a "concentrate solution for image recording layer" and a "concentrate solution for protective layer"; the composition of each concentrate solution is described later) were added to each developing solution to give a ratio of 0.3:1:10 (=concentrate solution for protective layer:concentrate solution for image recording layer:developing solution). This mixed solution was stirred for 10 minutes or more and aged for 2 weeks. The dispersed state of solid contents in the mixed solution at this time was evaluated. The evaluation results are shown in Tables 4 to 18. The evaluation indices of dispersibility of the photosensitive layer are as follows.

X: The components of photosensitive layer started solidifying at the mixing and were not dispersed at all but precipitated or adhered; could not be developed at all.

Δ: Turbid and precipitates started being generated within 2 days but in an easily redispersible state.

○: Turbid but no generation of precipitates for 2 weeks.

◎: Almost no generation of precipitates for about 1 month after mixing, or precipitates were dispersible with slight stirring.

The concentrate solution for protective layer used was obtained by changing the amount of water in the coating solution for protective layer above to "8.8 g", and the concentrate solution for image recording layer used was obtained by removing "1-methoxy-2-propanol" in the coating solution for image recording layer above and changing the amount of methyl ethyl ketone to "4 g". The test results are shown in Tables 4 to 18. Also, the processing constructions at tests performed here are shown together below. Fundamentally, the test of Evaluation 1 was performed according to FIG. 1 described in the paragraph of automatic developing processor, and the test of Evaluation 2 was performed according to FIG. 2. Here, the condition for development processing was such that, in Evaluation 1, preheating was not done in Tables 4, 11 and 18 or pre-washing was done in Table 6, and in Evaluation 2, pre-washing was not done in Table 16.

TABLE 3

| Table of | Developing | Test Conditions | | |
|---|---|---|---|---|
| Test Results | Solution No. | Pre-heating | Pre-Washing | Embodiment (automatic developing processor) |
| Table 4 | | none | none | FIG. 1: Evaluation 1 |
| Table 5 | | done | none | FIG. 1: Evaluation 1 |
| Table 6 | | done | done | FIG. 1: Evaluation 1 |
| Table 7 | | done | done | FIG. 2: Evaluation 2 |
| Table 8 | | done | done | FIG. 2: Evaluation 2 |
| Table 9 | | done | none | FIG. 1: Evaluation 1 |
| Table 10 | | done | done | FIG. 2: Evaluation 2 |
| Table 11 | | none | none | FIG. 1: Evaluation 1 |
| Table 12 | 1 to 13 | done | none | FIG. 1: Evaluation 1 |
| | 14 to 26 | done | done | FIG. 2: Evaluation 2 |
| Table 13 | 1 to 13 | done | none | FIG. 1: Evaluation 1 |
| | 14 to 26 | done | done | FIG. 2: Evaluation 2 |
| Table 14 | 1 to 13 | done | none | FIG. 1: Evaluation 1 |
| | 14 to 26 | done | done | FIG. 2: Evaluation 2 |
| Table 15 | 1 to 13 | done | none | FIG. 1: Evaluation 1 |
| | 14 to 26 | done | done | FIG. 2: Evaluation 2 |
| Table 16 | | done | none | FIG. 2: Evaluation 2 |
| Table 17 | | done | none | FIG. 1: Evaluation 1 |
| Table 18 | | none | none | FIG. 1: Evaluation 1 |
| Table 19 | | done | done | FIG. 2: Evaluation 2 |

TABLE 4

| | Lithographic Printing Plate | Developing Solution | Developability of Unexposed Area | Staining of Non-Image Part at Printing | Dispersibility of Photosensitive Layer |
|---|---|---|---|---|---|
| Comparative Example 1 | Printing Plate A | Developing Solution 1 | X | ○ | X |
| Example 1 | Printing Plate A | Developing Solution 2 | Δ | ○ | Δ |
| Example 2 | Printing Plate A | Developing Solution 3 | Δ○ | ○ | ○ |
| Example 3 | Printing Plate A | Developing Solution 4 | ◎ | ○ | ◎ |

TABLE 4-continued

| | Lithographic Printing Plate | Developing Solution | Developability of Unexposed Area | Staining of Non-Image Part at Printing | Dispersibility of Photosensitive Layer |
|---|---|---|---|---|---|
| Example 4 | Printing Plate A | Developing Solution 5 | ◎ | ○ | ◎ |
| Example 5 | Printing Plate A | Developing Solution 6 | ◎ | ○ | ◎ |
| Example 6 | Printing Plate A | Developing Solution 7 | ◎ | ○ | ◎ |
| Example 7 | Printing Plate A | Developing Solution 8 | ◎ | ○ | ◎ |
| Example 8 | Printing Plate A | Developing Solution 9 | ○ | ○ | ○ |
| Example 9 | Printing Plate A | Developing Solution 10 | ◎ | ○ | ◎ |
| Comparative Example 2 | Printing Plate A | Developing Solution 11 | X | ○ | X |
| Comparative Example 3 | Printing Plate A | Developing Solution 12 | X | ○ | X |
| Example 10 | Printing Plate A | Developing Solution 13 | ○ | ○ | ○ |
| Comparative Example 4 | Printing Plate A | Developing Solution 14 | X | ○ | X |
| Example 11 | Printing Plate A | Developing Solution 15 | Δ | ○ | Δ |
| Example 12 | Printing Plate A | Developing Solution 16 | Δ○ | ○ | ○ |
| Example 13 | Printing Plate A | Developing Solution 17 | ◎ | ○ | ◎ |
| Example 14 | Printing Plate A | Developing Solution 18 | ◎ | ○ | ◎ |
| Example 15 | Printing Plate A | Developing Solution 19 | ◎ | ○ | ◎ |
| Example 16 | Printing Plate A | Developing Solution 20 | ◎ | ○ | ◎ |
| Example 17 | Printing Plate A | Developing Solution 21 | ◎ | ○ | ◎ |
| Example 18 | Printing Plate A | Developing Solution 22 | ○ | ○ | ○ |
| Example 19 | Printing Plate A | Developing Solution 23 | ◎ | ○ | ◎ |
| Comparative Example 5 | Printing Plate A | Developing Solution 24 | X | ○ | X |
| Comparative Example 6 | Printing Plate A | Developing Solution 25 | X | ○ | X |
| Example 20 | Printing Plate A | Developing Solution 26 | ○ | ○ | ○ |

TABLE 5

| | Lithographic Printing Plate | Developing Solution | Developability of Unexposed Area | Staining of Non-Image Part at Printing | Dispersibility of Photosensitive Layer |
|---|---|---|---|---|---|
| Comparative Example 7 | Printing Plate B | Developing Solution 1 | X | ○ | X |
| Example 21 | Printing Plate B | Developing Solution 2 | Δ | ○ | Δ |
| Example 22 | Printing Plate B | Developing Solution 3 | Δ○ | ○ | ○ |
| Example 23 | Printing Plate B | Developing Solution 4 | ◎ | ○ | ◎ |
| Example 24 | Printing Plate B | Developing Solution 5 | ◎ | ○ | ◎ |
| Example 25 | Printing Plate B | Developing Solution 6 | ◎ | ○ | ◎ |
| Example 26 | Printing Plate B | Developing Solution 7 | ◎ | ○ | ◎ |
| Example 27 | Printing Plate B | Developing Solution 8 | ◎ | ○ | ◎ |
| Example 28 | Printing Plate B | Developing Solution 9 | ○ | ○ | ○ |

TABLE 5-continued

| | Lithographic Printing Plate | Developing Solution | Developability of Unexposed Area | Staining of Non-Image Part at Printing | Dispersibility of Photosensitive Layer |
|---|---|---|---|---|---|
| Example 29 | Printing Plate B | Developing Solution 10 | ◎ | ○ | ◎ |
| Comparative Example 8 | Printing Plate B | Developing Solution 11 | X | ○ | X |
| Comparative Example 9 | Printing Plate B | Developing Solution 12 | X | ○ | X |
| Example 30 | Printing Plate B | Developing Solution 13 | ○ | ○ | ○ |
| Comparative Example 10 | Printing Plate B | Developing Solution 14 | X | ○ | X |
| Example 31 | Printing Plate B | Developing Solution 15 | Δ | ○ | Δ |
| Example 32 | Printing Plate B | Developing Solution 16 | Δ○ | ○ | ○ |
| Example 33 | Printing Plate B | Developing Solution 17 | ◎ | ○ | ◎ |
| Example 34 | Printing Plate B | Developing Solution 18 | ◎ | ○ | ◎ |
| Example 35 | Printing Plate B | Developing Solution 19 | ◎ | ○ | ◎ |
| Example 36 | Printing Plate B | Developing Solution 20 | ◎ | ○ | ◎ |
| Example 37 | Printing Plate B | Developing Solution 21 | ◎ | ○ | ◎ |
| Example 38 | Printing Plate B | Developing Solution 22 | ○ | ○ | ○ |
| Example 39 | Printing Plate B | Developing Solution 23 | ◎ | ○ | ◎ |
| Comparative Example 11 | Printing Plate B | Developing Solution 24 | X | ○ | X |
| Comparative Example 12 | Printing Plate B | Developing Solution 25 | X | ○ | X |
| Example 40 | Printing Plate B | Developing Solution 26 | ○ | ○ | ○ |

TABLE 6

| | Lithographic Printing Plate | Developing Solution | Developability of Unexposed Area | Staining of Non-Image Part at Printing | Dispersibility of Photosensitive Layer |
|---|---|---|---|---|---|
| Comparative Example 13 | Printing Plate C | Developing Solution 1 | X | ○ | X |
| Example 41 | Printing Plate C | Developing Solution 2 | Δ | ○ | Δ |
| Example 42 | Printing Plate C | Developing Solution 3 | Δ○ | ○ | ○ |
| Example 43 | Printing Plate C | Developing Solution 4 | ◎ | ○ | ◎ |
| Example 44 | Printing Plate C | Developing Solution 5 | ◎ | ○ | ◎ |
| Example 45 | Printing Plate C | Developing Solution 6 | ◎ | ○ | ◎ |
| Example 46 | Printing Plate C | Developing Solution 7 | ◎ | ○ | ◎ |
| Example 47 | Printing Plate C | Developing Solution 8 | ◎ | ○ | ◎ |
| Example 48 | Printing Plate C | Developing Solution 9 | ○ | ○ | ○ |
| Example 49 | Printing Plate C | Developing Solution 10 | ◎ | ○ | ◎ |
| Comparative Example 14 | Printing Plate C | Developing Solution 11 | X | ○ | X |
| Comparative Example 15 | Printing Plate C | Developing Solution 12 | X | ○ | X |
| Example 50 | Printing Plate C | Developing Solution 13 | ○ | ○ | ○ |
| Comparative Example 16 | Printing Plate C | Developing Solution 14 | X | ○ | X |

TABLE 6-continued

| | Lithographic Printing Plate | Developing Solution | Developability of Unexposed Area | Staining of Non-Image Part at Printing | Dispersibility of Photosensitive Layer |
|---|---|---|---|---|---|
| Example 51 | Printing Plate C | Developing Solution 15 | Δ | ○ | Δ |
| Example 52 | Printing Plate C | Developing Solution 16 | Δ○ | ○ | ○ |
| Example 53 | Printing Plate C | Developing Solution 17 | ◎ | ○ | ◎ |
| Example 54 | Printing Plate C | Developing Solution 18 | ◎ | ○ | ◎ |
| Example 55 | Printing Plate C | Developing Solution 19 | ◎ | ○ | ◎ |
| Example 56 | Printing Plate C | Developing Solution 20 | ◎ | ○ | ◎ |
| Example 57 | Printing Plate C | Developing Solution 21 | ◎ | ○ | ◎ |
| Example 58 | Printing Plate C | Developing Solution 22 | ○ | ○ | ○ |
| Example 59 | Printing Plate C | Developing Solution 23 | ◎ | ○ | ◎ |
| Comparative Example 17 | Printing Plate C | Developing Solution 24 | X | ○ | X |
| Comparative Example 18 | Printing Plate C | Developing Solution 25 | X | ○ | X |
| Example 60 | Printing Plate C | Developing Solution 26 | ○ | ○ | ○ |

TABLE 7

| | Lithographic Printing Plate | Developing Solution | Developability of Unexposed Area | Staining of Non-Image Part at Printing | Dispersibility of Photosensitive Layer |
|---|---|---|---|---|---|
| Comparative Example 19 | Printing Plate D | Developing Solution 1 | X | ○ | X |
| Example 61 | Printing Plate D | Developing Solution 2 | Δ | ○ | Δ |
| Example 62 | Printing Plate D | Developing Solution 3 | Δ○ | ○ | ○ |
| Example 63 | Printing Plate D | Developing Solution 4 | ◎ | ○ | ◎ |
| Example 64 | Printing Plate D | Developing Solution 5 | ◎ | ○ | ◎ |
| Example 65 | Printing Plate D | Developing Solution 6 | ◎ | ○ | ◎ |
| Example 66 | Printing Plate D | Developing Solution 7 | ◎ | ○ | ◎ |
| Example 67 | Printing Plate D | Developing Solution 8 | ◎ | ○ | ◎ |
| Example 68 | Printing Plate D | Developing Solution 9 | ○ | ○ | ○ |
| Example 69 | Printing Plate D | Developing Solution 10 | ◎ | ○ | ◎ |
| Comparative Example 20 | Printing Plate D | Developing Solution 11 | X | ○ | X |
| Comparative Example 21 | Printing Plate D | Developing Solution 12 | X | ○ | X |
| Example 70 | Printing Plate D | Developing Solution 13 | ○ | ○ | ○ |
| Comparative Example 22 | Printing Plate D | Developing Solution 14 | X | ○ | X |
| Example 71 | Printing Plate D | Developing Solution 15 | Δ | ○ | Δ |
| Example 72 | Printing Plate D | Developing Solution 16 | Δ○ | ○ | ○ |
| Example 73 | Printing Plate D | Developing Solution 17 | ◎ | ○ | ◎ |
| Example 74 | Printing Plate D | Developing Solution 18 | ◎ | ○ | ◎ |
| Example 75 | Printing Plate D | Developing Solution 19 | ◎ | ○ | ◎ |

TABLE 7-continued

| | Lithographic Printing Plate | Developing Solution | Developability of Unexposed Area | Staining of Non-Image Part at Printing | Dispersibility of Photosensitive Layer |
|---|---|---|---|---|---|
| Example 76 | Printing Plate D | Developing Solution 20 | ◎ | ○ | ◎ |
| Example 77 | Printing Plate D | Developing Solution 21 | ◎ | ○ | ◎ |
| Example 78 | Printing Plate D | Developing Solution 22 | ○ | ○ | ○ |
| Example 79 | Printing Plate D | Developing Solution 23 | ◎ | ○ | ◎ |
| Comparative Example 23 | Printing Plate D | Developing Solution 24 | X | ○ | X |
| Comparative Example 24 | Printing Plate D | Developing Solution 25 | X | ○ | X |
| Example 80 | Printing Plate D | Developing Solution 26 | ○ | ○ | ○ |

TABLE 8

| | Lithographic Printing Plate | Developing Solution | Developability of Unexposed Area | Staining of Non-Image Part at Printing | Dispersibility of Photosensitive Layer |
|---|---|---|---|---|---|
| Comparative Example 25 | Printing Plate E | Developing Solution 1 | X | ○ | X |
| Example 81 | Printing Plate E | Developing Solution 2 | Δ | ○ | Δ |
| Example 82 | Printing Plate E | Developing Solution 3 | Δ○ | ○ | ○ |
| Example 83 | Printing Plate E | Developing Solution 4 | ◎ | ○ | ◎ |
| Example 84 | Printing Plate E | Developing Solution 5 | ◎ | ○ | ◎ |
| Example 85 | Printing Plate E | Developing Solution 6 | ◎ | ○ | ◎ |
| Example 86 | Printing Plate E | Developing Solution 7 | ◎ | ○ | ◎ |
| Example 87 | Printing Plate E | Developing Solution 8 | ◎ | ○ | ◎ |
| Example 88 | Printing Plate E | Developing Solution 9 | ○ | ○ | ○ |
| Example 89 | Printing Plate E | Developing Solution 10 | ◎ | ○ | ◎ |
| Comparative Example 26 | Printing Plate E | Developing Solution 11 | X | ○ | X |
| Comparative Example 27 | Printing Plate E | Developing Solution 12 | X | ○ | X |
| Example 90 | Printing Plate E | Developing Solution 13 | ○ | ○ | ○ |
| Comparative Example 28 | Printing Plate E | Developing Solution 14 | X | ○ | X |
| Example 91 | Printing Plate E | Developing Solution 15 | Δ | ○ | Δ |
| Example 92 | Printing Plate E | Developing Solution 16 | Δ○ | ○ | ○ |
| Example 93 | Printing Plate E | Developing Solution 17 | ◎ | ○ | ◎ |
| Example 94 | Printing Plate E | Developing Solution 18 | ◎ | ○ | ◎ |
| Example 95 | Printing Plate E | Developing Solution 19 | ◎ | ○ | ◎ |
| Example 96 | Printing Plate E | Developing Solution 20 | ◎ | ○ | ◎ |
| Example 97 | Printing Plate E | Developing Solution 21 | ◎ | ○ | ◎ |
| Example 98 | Printing Plate E | Developing Solution 22 | ○ | ○ | ○ |
| Example 99 | Printing Plate E | Developing Solution 23 | ◎ | ○ | ◎ |
| Comparative Example 29 | Printing Plate E | Developing Solution 24 | X | ○ | X |

TABLE 8-continued

| | Lithographic Printing Plate | Developing Solution | Developability of Unexposed Area | Staining of Non-Image Part at Printing | Dispersibility of Photosensitive Layer |
|---|---|---|---|---|---|
| Comparative Example 30 | Printing Plate E | Developing Solution 25 | X | ○ | X |
| Example 100 | Printing Plate E | Developing Solution 26 | ○ | ○ | ○ |

TABLE 9

| | Lithographic Printing Plate | Developing Solution | Developability of Unexposed Area | Staining of Non-Image Part at Printing | Dispersibility of Photosensitive Layer |
|---|---|---|---|---|---|
| Example 101 | Printing Plate D | Developing Solution 5 | ◎ | ○ | ◎ |
| Example 102 | Printing Plate E | Developing Solution 5 | ◎ | ○ | ◎ |
| Example 103 | Printing Plate E | Developing Solution 8 | ◎ | ○ | ◎ |
| Example 104 | Printing Plate D | Developing Solution 8 | ◎ | ○ | ◎ |
| Example 105 | Printing Plate D | Developing Solution 17 | ◎ | ○ | ◎ |
| Example 106 | Printing Plate D | Developing Solution 23 | ◎ | ○ | ◎ |
| Example 107 | Printing Plate E | Developing Solution 23 | ◎ | ○ | ◎ |
| Example 108 | Printing Plate E | Developing Solution 17 | ◎ | ○ | ◎ |
| Example 109 | Printing Plate D | Developing Solution 10 | ◎ | ○ | ◎ |
| Example 110 | Printing Plate D | Developing Solution 21 | ◎ | ○ | ◎ |
| Example 111 | Printing Plate E | Developing Solution 10 | ◎ | ○ | ◎ |
| Example 112 | Printing Plate E | Developing Solution 21 | ◎ | ○ | ◎ |
| Example 113 | Printing Plate E | Developing Solution 13 | ◎ | ○ | ◎ |

TABLE 10

| | Lithographic Printing Plate | Developing Solution | Developability of Unexposed Area | Staining of Non-Image Part at Printing | Dispersibility of Photosensitive Layer |
|---|---|---|---|---|---|
| Example 114 | Printing Plate A | Developing Solution 4 | ○ | ○ | ○ |
| Example 115 | Printing Plate A | Developing Solution 5 | ○ | ○ | ○ |
| Example 116 | Printing Plate A | Developing Solution 9 | ○ | ○ | ○ |
| Example 117 | Printing Plate C | Developing Solution 21 | ○ | ○ | ○ |
| Example 118 | Printing Plate C | Developing Solution 3 | ○ | ○ | ○ |
| Example 119 | Printing Plate C | Developing Solution 8 | ○ | ○ | ○ |
| Example 120 | Printing Plate B | Developing Solution 23 | ○ | ○ | ○ |
| Example 121 | Printing Plate B | Developing Solution 17 | ○ | ○ | ○ |
| Example 122 | Printing Plate B | Developing Solution 4 | ○ | ○ | ○ |

TABLE 11

| | Lithographic Printing Plate | Developing Solution | Developability of Unexposed Area | Staining of Non-Image Part at Printing | Dispersibility of Photosensitive Layer |
|---|---|---|---|---|---|
| Example 123 | Printing Plate D | Developing Solution 5 | ⊚ | ○ | ⊚ |
| Example 124 | Printing Plate E | Developing Solution 5 | ⊚ | ○ | ⊚ |
| Example 125 | Printing Plate E | Developing Solution 8 | ⊚ | ○ | ⊚ |
| Example 126 | Printing Plate D | Developing Solution 8 | ⊚ | ○ | ⊚ |
| Example 127 | Printing Plate D | Developing Solution 17 | ⊚ | ○ | ⊚ |
| Example 128 | Printing Plate D | Developing Solution 23 | ⊚ | ○ | ⊚ |
| Example 129 | Printing Plate E | Developing Solution 23 | ⊚ | ○ | ⊚ |
| Example 130 | Printing Plate E | Developing Solution 17 | ⊚ | ○ | ⊚ |
| Example 131 | Printing Plate D | Developing Solution 10 | ⊚ | ○ | ⊚ |
| Example 132 | Printing Plate D | Developing Solution 21 | ⊚ | ○ | ⊚ |
| Example 133 | Printing Plate E | Developing Solution 10 | ⊚ | ○ | ⊚ |
| Example 134 | Printing Plate E | Developing Solution 21 | ⊚ | ○ | ⊚ |
| Example 135 | Printing Plate E | Developing Solution 13 | ⊚ | ○ | ⊚ |

TABLE 12

| | Lithographic Printing Plate | Developing Solution | Developability of Unexposed Area | Staining of Non-Image Part at Printing | Dispersibility of Photosensitive Layer |
|---|---|---|---|---|---|
| Comparative Example 31 | Printing Plate F | Developing Solution 1 | X | ○ | X |
| Example 136 | Printing Plate F | Developing Solution 2 | Δ | ○ | Δ |
| Example 137 | Printing Plate F | Developing Solution 3 | Δ○ | ○ | ○ |
| Example 138 | Printing Plate F | Developing Solution 4 | ⊚ | ○ | ⊚ |
| Example 139 | Printing Plate F | Developing Solution 5 | ⊚ | ○ | ⊚ |
| Example 140 | Printing Plate F | Developing Solution 6 | ⊚ | ○ | ⊚ |
| Example 141 | Printing Plate F | Developing Solution 7 | ⊚ | ○ | ⊚ |
| Example 142 | Printing Plate F | Developing Solution 8 | ⊚ | ○ | ⊚ |
| Example 143 | Printing Plate F | Developing Solution 9 | ○ | ○ | ○ |
| Example 144 | Printing Plate F | Developing Solution 10 | ⊚ | ○ | ⊚ |
| Comparative Example 32 | Printing Plate F | Developing Solution 11 | X | ○ | X |
| Comparative Example 33 | Printing Plate F | Developing Solution 12 | X | ○ | X |
| Example 145 | Printing Plate F | Developing Solution 13 | ○ | ○ | ○ |
| Comparative Example 34 | Printing Plate F | Developing Solution 14 | X | ○ | X |
| Example 146 | Printing Plate F | Developing Solution 15 | Δ | ○ | Δ |
| Example 147 | Printing Plate F | Developing Solution 16 | ○ | ○ | ○ |
| Example 148 | Printing Plate F | Developing Solution 17 | ⊚ | ○ | ⊚ |
| Example 149 | Printing Plate F | Developing Solution 18 | ⊚ | ○ | ⊚ |

TABLE 12-continued

| | Lithographic Printing Plate | Developing Solution | Developability of Unexposed Area | Staining of Non-Image Part at Printing | Dispersibility of Photosensitive Layer |
|---|---|---|---|---|---|
| Example 150 | Printing Plate F | Developing Solution 19 | ⊚ | ○ | ⊚ |
| Example 151 | Printing Plate F | Developing Solution 20 | ⊚ | ○ | ⊚ |
| Example 152 | Printing Plate F | Developing Solution 21 | ⊚ | ○ | ⊚ |
| Example 153 | Printing Plate F | Developing Solution 22 | ○ | ○ | ○ |
| Example 154 | Printing Plate F | Developing Solution 23 | ⊚ | ○ | ⊚ |
| Comparative Example 35 | Printing Plate F | Developing Solution 24 | X | ○ | X |
| Comparative Example 36 | Printing Plate F | Developing Solution 25 | X | ○ | X |
| Example 155 | Printing Plate F | Developing Solution 26 | ○ | ○ | ○ |

TABLE 13

| | Lithographic Printing Plate | Developing Solution | Developability of Unexposed Area | Staining of Non-Image Part at Printing | Dispersibility of Photosensitive Layer |
|---|---|---|---|---|---|
| Comparative Example 37 | Printing Plate G | Developing Solution 1 | X | ○ | X |
| Example 156 | Printing Plate G | Developing Solution 2 | Δ | ○ | Δ |
| Example 157 | Printing Plate G | Developing Solution 3 | Δ○ | ○ | ○ |
| Example 158 | Printing Plate G | Developing Solution 4 | ⊚ | ○ | ⊚ |
| Example 159 | Printing Plate G | Developing Solution 5 | ⊚ | ○ | ⊚ |
| Example 160 | Printing Plate G | Developing Solution 6 | ⊚ | ○ | ⊚ |
| Example 161 | Printing Plate G | Developing Solution 7 | ⊚ | ○ | ⊚ |
| Example 162 | Printing Plate G | Developing Solution 8 | ⊚ | ○ | ⊚ |
| Example 163 | Printing Plate G | Developing Solution 9 | ○ | ○ | ○ |
| Example 164 | Printing Plate G | Developing Solution 10 | ⊚ | ○ | ⊚ |
| Comparative Example 38 | Printing Plate G | Developing Solution 11 | X | ○ | X |
| Comparative Example 39 | Printing Plate G | Developing Solution 12 | X | ○ | X |
| Example 165 | Printing Plate G | Developing Solution 13 | ○ | ○ | ○ |
| Comparative Example 40 | Printing Plate G | Developing Solution 14 | X | ○ | X |
| Example 166 | Printing Plate G | Developing Solution 15 | Δ○ | ○ | Δ○ |
| Example 167 | Printing Plate G | Developing Solution 16 | ○ | ○ | ○ |
| Example 168 | Printing Plate G | Developing Solution 17 | ⊚ | ○ | ⊚ |
| Example 169 | Printing Plate G | Developing Solution 18 | ⊚ | ○ | ⊚ |
| Example 170 | Printing Plate G | Developing Solution 19 | ⊚ | ○ | ⊚ |
| Example 171 | Printing Plate G | Developing Solution 20 | ⊚ | ○ | ⊚ |
| Example 172 | Printing Plate G | Developing Solution 21 | ⊚ | ○ | ⊚ |
| Example 173 | Printing Plate G | Developing Solution 22 | ○ | ○ | ○ |
| Example 174 | Printing Plate G | Developing Solution 23 | ⊚ | ○ | ⊚ |

TABLE 13-continued

| | Lithographic Printing Plate | Developing Solution | Developability of Unexposed Area | Staining of Non-Image Part at Printing | Dispersibility of Photosensitive Layer |
|---|---|---|---|---|---|
| Comparative Example 41 | Printing Plate G | Developing Solution 24 | X | ○ | X |
| Comparative Example 42 | Printing Plate G | Developing Solution 25 | X | ○ | X |
| Example 175 | Printing Plate G | Developing Solution 26 | ○ | ○ | ○ |

TABLE 14

| | Lithographic Printing Plate | Developing Solution | Developability of Unexposed Area | Staining of Non-Image Part at Printing | Dispersibility of Photosensitive Layer |
|---|---|---|---|---|---|
| Comparative Example 43 | Printing Plate H | Developing Solution 1 | X | ○ | X |
| Example 176 | Printing Plate H | Developing Solution 2 | Δ○ | ○ | Δ |
| Example 177 | Printing Plate H | Developing Solution 3 | ○ | ○ | ○Δ |
| Example 178 | Printing Plate H | Developing Solution 4 | ◎ | ○ | ◎ |
| Example 179 | Printing Plate H | Developing Solution 5 | ◎ | ○ | ◎ |
| Example 180 | Printing Plate H | Developing Solution 6 | ◎ | ○ | ◎ |
| Example 181 | Printing Plate H | Developing Solution 7 | ◎ | ○ | ◎ |
| Example 182 | Printing Plate H | Developing Solution 8 | ◎ | ○ | ◎ |
| Example 183 | Printing Plate H | Developing Solution 9 | ○ | ○ | ○ |
| Example 184 | Printing Plate H | Developing Solution 10 | ◎ | ○ | ◎ |
| Comparative Example 44 | Printing Plate H | Developing Solution 11 | X | ○ | X |
| Comparative Example 45 | Printing Plate H | Developing Solution 12 | X | ○ | X |
| Example 185 | Printing Plate H | Developing Solution 13 | ◎ | ○ | ○ |
| Comparative Example 46 | Printing Plate H | Developing Solution 14 | X | ○ | X |
| Example 186 | Printing Plate H | Developing Solution 15 | ○ | ○ | Δ○ |
| Example 187 | Printing Plate H | Developing Solution 16 | ◎ | ○ | ○ |
| Example 188 | Printing Plate H | Developing Solution 17 | ◎ | ○ | ◎ |
| Example 189 | Printing Plate F | Developing Solution 18 | ◎ | ○ | ◎ |
| Example 190 | Printing Plate F | Developing Solution 19 | ◎ | ○ | ◎ |
| Example 191 | Printing Plate F | Developing Solution 20 | ◎ | ○ | ◎ |
| Example 192 | Printing Plate F | Developing Solution 21 | ◎ | ○ | ◎ |
| Example 193 | Printing Plate F | Developing Solution 22 | ◎ | ○ | ○ |
| Example 194 | Printing Plate F | Developing Solution 23 | ◎ | ○ | ◎ |
| Comparative Example 47 | Printing Plate F | Developing Solution 24 | X | ○ | X |
| Comparative Example 48 | Printing Plate F | Developing Solution 25 | X | ○ | X |
| Example 195 | Printing Plate F | Developing Solution 26 | ○ | ○ | ○ |

TABLE 15

| | Lithographic Printing Plate | Developing Solution | Developability of Unexposed Area | Staining of Non-Image Part at Printing | Dispersibility of Photosensitive Layer |
|---|---|---|---|---|---|
| Comparative Example 49 | Printing Plate I | Developing Solution 1 | X | ○ | X |
| Example 196 | Printing Plate I | Developing Solution 2 | Δ○ | ○ | Δ |
| Example 197 | Printing Plate I | Developing Solution 3 | ○ | ○ | ○ |
| Example 198 | Printing Plate I | Developing Solution 4 | ◎ | ○ | ◎ |
| Example 199 | Printing Plate I | Developing Solution 5 | ◎ | ○ | ◎ |
| Example 200 | Printing Plate I | Developing Solution 6 | ◎ | ○ | ◎ |
| Example 201 | Printing Plate I | Developing Solution 7 | ◎ | ○ | ◎ |
| Example 202 | Printing Plate I | Developing Solution 8 | ◎ | ○ | ◎ |
| Example 203 | Printing Plate I | Developing Solution 9 | ○ | ○ | ○ |
| Example 204 | Printing Plate I | Developing Solution 10 | ◎ | ○ | ◎ |
| Comparative Example 50 | Printing Plate I | Developing Solution 11 | X | ○ | X |
| Comparative Example 51 | Printing Plate I | Developing Solution 12 | X | ○ | X |
| Example 205 | Printing Plate I | Developing Solution 13 | ◎ | ○ | ○ |
| Comparative Example 52 | Printing Plate I | Developing Solution 14 | X | ○ | X |
| Example 206 | Printing Plate I | Developing Solution 15 | ○ | ○ | Δ |
| Example 207 | Printing Plate I | Developing Solution 16 | ◎ | ○ | ○ |
| Example 208 | Printing Plate I | Developing Solution 17 | ◎ | ○ | ◎ |
| Example 209 | Printing Plate G | Developing Solution 18 | ◎ | ○ | ◎ |
| Example 210 | Printing Plate G | Developing Solution 19 | ◎ | ○ | ◎ |
| Example 211 | Printing Plate G | Developing Solution 20 | ◎ | ○ | ◎ |
| Example 212 | Printing Plate G | Developing Solution 21 | ◎ | ○ | ◎ |
| Example 213 | Printing Plate G | Developing Solution 22 | ◎ | ○ | ○ |
| Example 214 | Printing Plate G | Developing Solution 23 | ◎ | ○ | ◎ |
| Comparative Example 53 | Printing Plate G | Developing Solution 24 | X | ○ | X |
| Comparative Example 54 | Printing Plate G | Developing Solution 25 | X | ○ | X |
| Example 215 | Printing Plate G | Developing Solution 26 | ○ | ○ | ○ |

TABLE 16

| | Lithographic Printing Plate | Developing Solution | Developability of Unexposed Area | Staining of Non-Image Part at Printing | Dispersibility of Photosensitive Layer |
|---|---|---|---|---|---|
| Example 216 | Printing Plate G | Developing Solution 3 | ◎ | ○ | ◎ |
| Example 217 | Printing Plate F | Developing Solution 4 | ◎ | ○ | ◎ |
| Example 218 | Printing Plate G | Developing Solution 5 | ◎ | ○ | ◎ |
| Example 219 | Printing Plate F | Developing Solution 8 | ◎ | ○ | ◎ |
| Example 220 | Printing Plate G | Developing Solution 4 | ◎ | ○ | ◎ |

TABLE 16-continued

| | Lithographic Printing Plate | Developing Solution | Developability of Unexposed Area | Staining of Non-Image Part at Printing | Dispersibility of Photosensitive Layer |
|---|---|---|---|---|---|
| Example 221 | Printing Plate I | Developing Solution 3 | ⊚ | ○ | ⊚ |
| Example 222 | Printing Plate H | Developing Solution 4 | ⊚ | ○ | ⊚ |
| Example 223 | Printing Plate I | Developing Solution 5 | ⊚ | ○ | ⊚ |
| Example 224 | Printing Plate H | Developing Solution 8 | ⊚ | ○ | ⊚ |
| Example 225 | Printing Plate I | Developing Solution 8 | ⊚ | ○ | ⊚ |

TABLE 17

| | Lithographic Printing Plate | Developing Solution | Developability of Unexposed Area | Staining of Non-Image Part at Printing | Dispersibility of Photosensitive Layer |
|---|---|---|---|---|---|
| Example 226 | Printing Plate G | Developing Solution 16 | ⊚ | ○ | ⊚ |
| Example 227 | Printing Plate F | Developing Solution 17 | ⊚ | ○ | ⊚ |
| Example 228 | Printing Plate G | Developing Solution 19 | ⊚ | ○ | ⊚ |
| Example 229 | Printing Plate F | Developing Solution 21 | ⊚ | ○ | ⊚ |
| Example 230 | Printing Plate G | Developing Solution 17 | ⊚ | ○ | ⊚ |
| Example 231 | Printing Plate I | Developing Solution 16 | ⊚ | ○ | ⊚ |
| Example 232 | Printing Plate H | Developing Solution 17 | ⊚ | ○ | ⊚ |
| Example 233 | Printing Plate I | Developing Solution 19 | ⊚ | ○ | ⊚ |
| Example 234 | Printing Plate H | Developing Solution 21 | ⊚ | ○ | ⊚ |
| Example 235 | Printing Plate I | Developing Solution 21 | ⊚ | ○ | ⊚ |

TABLE 18

| | Lithographic Printing Plate | Developing Solution | Developability of Unexposed Area | Staining of Non-Image Part at Printing | Dispersibility of Photosensitive Layer |
|---|---|---|---|---|---|
| Example 236 | Printing Plate G | Developing Solution 3 | ⊚ | ○ | ⊚ |
| Example 237 | Printing Plane F | Developing Solution 4 | ⊚ | ○ | ⊚ |
| Example 238 | Printing Plate G | Developing Solution 5 | ⊚ | ○ | ⊚ |
| Example 239 | Printing Plate F | Developing Solution 8 | ⊚ | ○ | ⊚ |
| Example 240 | Printing Plate G | Developing Solution 4 | ⊚ | ○ | ⊚ |
| Example 241 | Printing Plate I | Developing Solution 3 | ⊚ | ○ | ⊚ |
| Example 242 | Printing Plate H | Developing Solution 4 | ⊚ | ○ | ⊚ |
| Example 243 | Printing Plate I | Developing Solution 5 | ⊚ | ○ | ⊚ |
| Example 244 | Printing Plate H | Developing Solution 8 | ⊚ | ○ | ⊚ |
| Example 245 | Printing Plate I | Developing Solution 8 | ⊚ | ○ | ⊚ |

TABLE 19

| | Lithographic Printing Plate | Developing Solution | Developability of Unexposed Area (Color Remaining) | Print Staining of Non-Image Part after Development |
|---|---|---|---|---|
| Example 246 | Printing Plate F | Developing Solution 2 | Δ | 4 |
| Example 247 | Printing Plate H | Developing Solution 2 | Δ○ | 5 |
| Example 248 | Printing Plate G | Developing Solution 2 | Δ | 4 |
| Example 249 | Printing Plate I | Developing Solution 2 | Δ○ | 5 |
| Example 250 | Printing Plate F | Developing Solution 3 | Δ○ | 5 |
| Example 251 | Printing Plate H | Developing Solution 3 | ○ | 6 |
| Example 252 | Printing Plate G | Developing Solution 3 | Δ○ | 5 |
| Example 253 | Printing Plate I | Developing Solution 3 | ○ | 6 |
| Example 254 | Printing Plate J | Developing Solution 3 | Δ | 3 |
| Comparative Example 55 | Printing Plate J | Developing Solution 1 | X | 1 |
| Example 255 | Printing Plate K | Developing Solution 3 | Δ○ | 5 |
| Example 256 | printing Plate L | Developing Solution 3 | ○ | 5.5 |

In Examples 246 and 247, the photosensitive layer is the same and in Example 247, the support is treated with polyvinylphosphonic acid. At this time, it is seen that the developability of unexposed area, that is, the performance in terms of color remaining, is more excellent and the staining of non-image part after development is more improved than in Example 246. Similarly, there is a tendency that the performance in terms of developability (color remaining) and print staining after development is enhanced in Example 249 as compared with Example 248, in Example 251 as compared with Example 250, and in Example 253 as compared with Example 252. This reveals that the treatment of the support with polyvinylphosphonic acid is effective. Also, it is seen that excellent developability is obtained in Examples of Table 19 as compared with Comparative Example 55 where the substrate is not subjected to a hydrophilization treatment. In Example 256, color remaining was not observed in most of processed plates, but color remaining was generated in 5% of all processed plates. On the other hand, in Examples 251 and 253, color remaining was not generated at all.

Examples 257 to 300

Developing Solutions 27 to 32 having the composition shown in Table 20 were produced. In the Table, the unit is "g". Here, the pH of the developing solution was adjusted to 7 by using phosphoric acid and sodium hydroxide. The performance of the developing solutions obtained was evaluated in the same manner as in Examples above and the results are shown in Tables 21 and 22. The test conditions of Table 21 are such that preheating is done/pre-washing is done and the embodiment of automatic developing processor is FIG. 2. The test conditions of Table 22 are such that preheating is not done/pre-washing is not done and the embodiment of automatic developing processor is FIG. 1.

TABLE 20

| | Developing Solution | | | | | |
|---|---|---|---|---|---|---|
| | 27 | 28 | 29 | 30 | 31 | 32 |
| Water | 8269.8 | 8269.8 | 8269.8 | 8969.8 | 8969.8 | 8969.8 |
| Surfactant IV-m | 700 | | | 1000 | | |
| Surfactant VI-a | | 700 | | | 1000 | |
| Surfactant I-j | | | 700 | | | 1000 |
| Benzyl alcohol | | | | | | |
| Ethylene glycol | | | | | | |
| Glycerin | | | | | | |
| Gum arabic | 250 | 250 | 250 | | | |
| Enzyme-modified potato starch | 700 | 700 | 700 | | | |
| Sodium salt of di-octyl-sulfosuccinic acid ester | 50 | 50 | 50 | | | |
| Mono-ammonium phosphate | 10 | 10 | 10 | 10 | 10 | 10 |
| Citric acid | 10 | 10 | 10 | 10 | 10 | 10 |
| EDTA-4-sodium salt | 10 | 10 | 10 | 10 | 10 | 10 |
| 2-Bromo-2-nitropropane-1,3-diol | 0.1 | 0.1 | 0.1 | 0.1 | 0.1 | 0.1 |
| 2-Methyl-4-isothazolin-3-one | 0.1 | 0.1 | 0.1 | 0.1 | 0.1 | 0.1 |
| Total | 10000 | 10000 | 10000 | 10000 | 10000 | 10000 |

TABLE 21

| | Lithographic Printing Plate | Developing Solution | Developability of Unexposed Area | Staining of Non-Image Part at Printing | Dispersibility of Photosensitive Layer |
|---|---|---|---|---|---|
| Example 257 | Printing Plate B | Developing Solution 27 | ○ | ○ | ○ |
| Example 258 | Printing Plate B | Developing Solution 28 | ○ | ○ | ○ |
| Example 259 | Printing Plate B | Developing Solution 29 | ○ | ○ | ○ |
| Example 260 | Printing Plate C | Developing Solution 27 | ○ | ○ | ○ |
| Example 261 | Printing Plate C | Developing Solution 28 | ○ | ○ | ○ |
| Example 262 | Printing Plate C | Developing Solution 29 | ○ | ○ | ○ |
| Example 263 | Printing Plate F | Developing Solution 27 | ○ | ○ | ○ |
| Example 264 | Printing Plate F | Developing Solution 28 | ○ | ○ | ○ |
| Example 265 | Printing Plate F | Developing Solution 29 | ○ | ○ | ○ |
| Example 266 | Printing Plate G | Developing Solution 27 | ○ | ○ | ○ |
| Example 267 | Printing Plate G | Developing Solution 28 | ○ | ○ | ○ |
| Example 268 | Printing Plate G | Developing Solution 29 | ○ | ○ | ○ |
| Example 269 | Printing Plate H | Developing Solution 27 | ○ | ○ | ○ |
| Example 270 | Printing Plate H | Developing Solution 28 | ○ | ○ | ○ |
| Example 271 | Printing Plate H | Developing Solution 29 | ○ | ○ | ○ |
| Example 272 | Printing Plate I | Developing Solution 27 | ○ | ○ | ○ |
| Example 273 | Printing Plate I | Developing Solution 28 | ○ | ○ | ○ |

TABLE 21-continued

| | Lithographic Printing Plate | Developing Solution | Developability of Unexposed Area | Staining of Non-Image Part at Printing | Dispersibility of Photosensitive Layer |
|---|---|---|---|---|---|
| Example 274 | Printing Plate I | Developing Solution 29 | ○ | ○ | ○ |
| Example 275 | Printing Plate J | Developing Solution 27 | ○ | ○ | ○ |
| Example 276 | Printing Plate J | Developing Solution 28 | ○ | ○ | ○ |
| Example 277 | Printing Plate J | Developing Solution 29 | ○ | ○ | ○ |

TABLE 22

| | Lithographic Printing Plate | Developing Solution | Developability of Unexposed Area | Staining of Non-Image Part at Printing | Dispersibility of Photosensitive Layer |
|---|---|---|---|---|---|
| Example 278 | Printing Plate B | Developing Solution 30 | ○ | ○ | ○ |
| Example 279 | Printing Plate B | Developing Solution 31 | ○ | ○ | ○ |
| Example 280 | Printing Plate B | Developing Solution 32 | ○ | ○ | ○ |
| Example 281 | Printing Plate C | Developing Solution 30 | ○ | ○ | ○ |
| Example 282 | Printing Plate C | Developing Solution 31 | ○ | ○ | ○ |
| Example 283 | Printing Plate C | Developing Solution 32 | ○ | ○ | ○ |
| Example 284 | Printing Plate F | Developing Solution 30 | ○ | ○ | ○ |
| Example 285 | Printing Plate F | Developing Solution 31 | ○ | ○ | ○ |
| Example 286 | Printing Plate F | Developing Solution 32 | ○ | ○ | ○ |
| Example 287 | Printing Plate G | Developing Solution 30 | ○ | ○ | ○ |
| Example 288 | Printing Plate G | Developing Solution 31 | ○ | ○ | ○ |
| Example 289 | Printing Plate G | Developing Solution 32 | ○ | ○ | ○ |
| Example 290 | Printing Plate H | Developing Solution 30 | ○ | ○ | ○ |
| Example 291 | Printing Plate H | Developing Solution 31 | ○ | ○ | ○ |
| Example 292 | Printing Plate H | Developing Solution 32 | ○ | ○ | ○ |
| Example 293 | Printing Plate I | Developing Solution 30 | ○ | ○ | ○ |
| Example 294 | Printing Plate I | Developing Solution 31 | ○ | ○ | ○ |
| Example 295 | Printing Plate I | Developing Solution 32 | ○ | ○ | ○ |
| Example 296 | Printing Plate J | Developing Solution 30 | ○ | ○ | ○ |
| Example 297 | Printing Plate J | Developing Solution 31 | ○ | ○ | ○ |
| Example 298 | Printing Plate J | Developing Solution 32 | ○ | ○ | ○ |
| Example 299 | Printing Plate A | Developing Solution 27 | ○ | ○ | ○ |
| Example 300 | Printing Plate D | Developing Solution 27 | ○ | ○ | ○ |

As apparent from these results, the developing solution for lithographic printing plates and the production method of a lithographic printing plate of Examples according to the present invention are excellent in the developability, staining resistance and dispersibility of photosensitive layer in the developing solution as compared with Comparative Examples.

Also, when this developing solution is combined with the treatment of the support of the lithographic printing plate precursor with an alkali metal silicate and/or an organic phosphonic acid (in the above, an organic phosphonic acid), as shown in the Tables, the developability, particularly performance in terms of color remaining, tends to be more excellent. The printing performance of the photosensitive material after development was examined, as a result, it was found that good results are obtained also in terms of print staining.

This application is based on Japanese Patent application JP 2006-269649, filed Sep. 29, 2006, Japanese Patent application JP 2006-322274, filed Nov. 29, 2006, and Japanese Patent application JP 2007-94778, filed Mar. 30, 2007, the entire contents of which is hereby incorporated by reference, the same as if fully set forth herein.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. A developing solution comprising at least one of compounds represented by the following formulae (I), (III) and (VI) and having a pH of from 2 to 10:

(I)

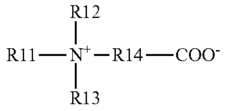

(III)

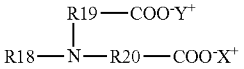

(VI)

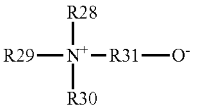

wherein R11 represents H, an alkyl group or an alkyl group having a linking group; the linking group includes an ester, carbonyl or amide bond, and the number of carbon atoms connected to N through the bond is from 8 to 20;

R12, R18, R28 and R29 each represents H or an alkyl group;

R13 represents an alkyl group or a group containing an ethylene oxide group;

R30 represents an alkyl group or a group containing an ethylene oxide group; and R14, R19, R20, and R31 each represents an alkylene group or a single bond);

provided that, when R11 to R14 have a total of 10 to 40 carbon atoms and when each of R11 to R13 is an alkyl group, or R14 is an alkylene group, the structure thereof is linear or branched;

when R18 to R20 have a total of 10 to 30 carbon atoms and when each of R18 and R19 is an alkyl group, or R20 is an alkylene group, the structure thereof is linear or branched; and when R28 to R30 have a total of 8 to 30 carbon atoms and when each of R28 to R30 is an alkyl group, the structure thereof is linear or branched, wherein in formula (III), $X^+$ and $Y^+$ are each independently selected from the group consisting of a monovalent metal ion, a divalent metal ion, an ammonium ion, and a hydrogen ion;

wherein a total concentration of the at least one of compounds represented by formulae (I), (III) and (VI) is 2 mass % or more; and wherein the developing solution further comprises a water-soluble polymer compound.

2. The developing solution as claimed in claim 1, wherein the compound is a compound represented by formula (III).

3. The developing solution as claimed in claim 1, wherein the compound is a compound represented by formula (VI).

4. The developing solution according to claim 1, wherein the water-soluble polymer compound is one of soybean polysaccharide, modified starch, gum arabic, dextrin, pullulan, polyvinyl alcohol and a derivative thereof, polyvinylpyrrolidone, polyacrylamide, an acrylamide copolymer, a vinyl methyl ether/maleic anhydride copolymer, a vinyl acetate/maleic anhydride copolymer and a styrene/maleic anhydride copolymer.

5. A method for producing a lithographic printing plate, comprising imagewise exposing a lithographic printing plate precursor including an image recording layer and a support to cure the image recording layer in the exposed area, and developing the exposed lithographic printing plate precursor with an aqueous solution comprising at least one of the compounds represented by the following formulae (I), (II), (III), (IV), and (VI) and having a pH of 3 to 8:

(I)

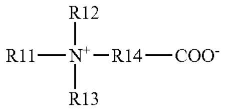

(II)

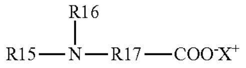

(III)

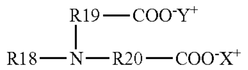

(IV)

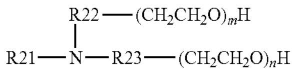

(V)

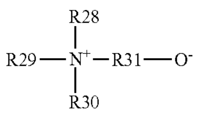

wherein R11 represents H, an alkyl group or an alkyl group having a linking group; the linking group includes an ester, carbonyl or amide bond, and the number of carbon atoms connected to N through the bond is from 8 to 20;

R12, R15, R18 and R24 and R28 to R29 each represents H or an alkyl group;

R13 represents an alkyl group or a group containing an ethylene oxide group;

R16 represents H, an alkyl group or a group containing an ethylene oxide group;

R21 represents H, an alkyl group or

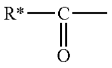

(wherein R* represents H or an alkyl group),

R30 represents alkyl group or a group containing an ethylene oxide group; and

R14, R17, R19, R20, R22, R23 and R31 each represents an alkylene group or a single bond), provided that, when R11 to R14 have a total of 10 to 40 carbon atoms and when each of R11 to R13 is an alkyl group, or R14 is an alkylene group, the structure thereof is linear or branched;

when R15 to R17 have a total of 10 to 30 carbon atoms and when each of R15 and R16 is alkyl group, or R17 is an alkylene group, the structure thereof is linear or branched;

when R18 to R20 have a total of 10 to 30 carbon atoms and when each of R18 and R19 is an alkyl group, or R20 is an alkylene group, the structure thereof is linear or branched;

when R21 to R23 have a total of 8 to 50 carbon atoms and when R21 is an alkyl group, or each of R22 and R23 is an alkylene group, the structure thereof is linear or branched;

m and n make a total of 3 to 40;

when R28 to R30 have a total of 8 to 30 carbon atoms and when each of R28 to R30 is an alkyl group, the structure thereof is linear or branched, wherein in formula (II), $X^+$ is selected from the group consisting of a monovalent metal ion, a divalent metal ion, an ammonium ion, and a hydrogen ion;

wherein in formula (III), $X^+$ and $Y^+$ are each independently selected from the group consisting of a monovalent metal ion, a divalent metal ion, an ammonium ion, and a hydrogen ion;

wherein the support is an aluminum support subjected to surface roughening and anodization, the image recording layer comprises a polymerization initiator, a polymerizable compound and a binder polymer, and the image recording layer has a coating weight of 0.3 to 3.0 $g/m^2$; and wherein the imagewise exposing is conducted with a laser light.

6. The method for producing a lithographic printing plate as claimed in claim 5, wherein the support is surface-treated with at least one of an alkali metal silicate and an organic phosphonic acid.

7. The method for producing a lithographic printing plate as claimed in claim 5, wherein the lithographic printing plate precursor further includes a protective layer so that the support, the image recording layer and the protective layer are provided in this order.

8. The method for producing a lithographic printing plate as claimed in claim 5, wherein components of the image recording layer are partially or entirely enclosed in a microcapsule.

9. The method for producing a lithographic printing plate as claimed in claim 5, further comprising: heat-treating the exposed lithographic printing plate precursor before the developing.

10. The method for producing a lithographic printing plate as claimed in claim 5, further comprising heat-treating or entire-surface exposing the exposed lithographic printing plate precursor after the developing.

11. The method for producing a lithographic printing plate as claimed in claim 5, wherein the aqueous solution has a pH of 4 to 8.

12. The method for producing a lithographic printing plate as claimed in claim 5, wherein the compound is a compound represented by formula (I).

13. The method for producing a lithographic printing plate as claimed in claim 5, wherein the compound is a compound represented by formula (II).

14. The method for producing a lithographic printing plate as claimed in claim 5, wherein the compound is a compound represented by formula (III).

15. The method for producing a lithographic printing plate as claimed in claim 5, wherein the compound is a compound represented by formula (VI).

16. The method for producing a lithographic printing plate as claimed in claim 5, wherein the binder polymer is a hydrophobic binder polymer having an acid value of 0.3 meq/g or less.

17. The method for producing a lithographic printing plate as claimed in claim 5, wherein the binder polymer has a hydroxyl or carboxylate group.

18. The method for producing a lithographic printing plate as claimed in claim 17, wherein the binder polymer has an ethylenically unsaturated bond.

19. The method for producing a lithographic printing plate as claimed in claim 5, wherein in the developing, a non-image part of the image recording layer is removed by a rubbing member in the presence of the aqueous solution.

20. The method for producing a lithographic printing plate as claimed in claim 5, wherein a desensitization treatment is conducted at the same time with the developing.

21. The method for producing a lithographic printing plate as claimed in claim 5, wherein the method further comprises:

heating the exposed lithographic printing plate precursor between the exposing and the developing;

and naturally drying the lithographic printing plate precursor after the developing.

22. The method for producing a lithographic printing plate as claimed in claim 5, wherein a water-washing and a desensitization treatment are not conducted after the developing.

23. The method for producing a lithographic printing plate as claimed in claim 5, wherein the image recording layer further comprises a polymerization initiator, which is a hexaarylbiimidazole compound.

24. A method for producing a lithographic printing plate, comprising imagewise exposing a lithographic printing plate precursor including an image recording layer and a support to cure the image recording layer in the exposed area, and developing the exposed lithographic printing plate precursor with an aqueous solution comprising at least one of the compounds represented by the following formulae (I), (II), (III), (IV), and (VI) and having a pH of 2 to 10:

(I)

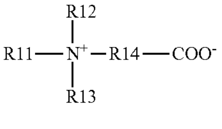

(II)

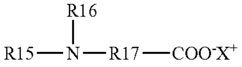

-continued (III)

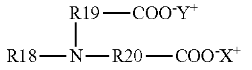

(IV)

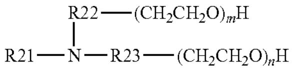

(VI)

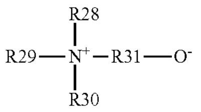

wherein R11 represents H, an alkyl group or an alkyl group having a linking group; the linking group includes an ester, carbonyl or amide bond, and the number of carbon atoms connected to N through the bond is from 8 to 20;

R12, R15, R18 and R24 and R28 to R29 each represents H or an alkyl group;

R13 represents an alkyl group or a group containing an ethylene oxide group;

R16 represents H, an alkyl group or a group containing an ethylene oxide group;

R21 represents H, an alkyl group or

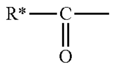

(wherein R* represents H or an alkyl group),

R30 represents alkyl group or a group containing an ethylene oxide group; and

R14, R17, R19, R20, R22, R23 and R31 each represents an alkylene group or a single bond), provided that, when R11 to R14 have a total of 10 to 40 carbon atoms and when each of R11 to R13 is an alkyl group, or R14 is an alkylene group, the structure thereof is linear or branched;

when R15 to R17 have a total of 10 to 30 carbon atoms and when each of R15 and R16 is alkyl group, or R17 is an alkylene group, the structure thereof is linear or branched;

when R18 to R20 have a total of 10 to 30 carbon atoms and when each of R18 and R19 is an alkyl group, or R20 is an alkylene group, the structure thereof is linear or branched;

when R21 to R23 have a total of 8 to 50 carbon atoms and when R21 is an alkyl group, or each of R22 and R23 is an alkylene group, the structure thereof is linear or branched;

m and n make a total of 3 to 40;

when R28 to R30 have a total of 8 to 30 carbon atoms and when each of R28 to R30 is an alkyl group, the structure thereof is linear or branched, wherein in formula (II), $X^+$ is selected from the group consisting of a monovalent metal ion, a divalent metal ion, an ammonium ion, and a hydrogen ion;

wherein in formula (III), $X^+$ and $Y^+$ are each independently selected from the group consisting of a monovalent metal ion, a divalent metal ion, an ammonium ion, and a hydrogen ion;

wherein the support is an aluminum support subjected to surface roughening and anodization, the image recording layer comprises a polymerization initiator, a polymerizable compound and a binder polymer, and the image recording layer has a coating weight of 0.3 to 3.0 $g/m^2$;

wherein the imagewise exposing is conducted with a laser light; and wherein a desensitization treatment is conducted at the same time with the developing.

25. The method for producing a lithographic printing plate as claimed in claim 24, wherein the support is surface-treated with at least one of an alkali metal silicate and an organic phosphonic acid.

26. The method for producing a lithographic printing plate as claimed in claim 24, wherein the lithographic printing plate precursor further includes a protective layer so that the support, the image recording layer and the protective layer are provided in this order.

27. The method for producing a lithographic printing plate as claimed in claim 24, wherein components of the image recording layer are partially or entirely enclosed in a microcapsule.

28. The method for producing a lithographic printing plate as claimed in claim 24, further comprising: heat-treating the exposed lithographic printing plate precursor before the developing.

29. The method for producing a lithographic printing plate as claimed in claim 24, further comprising heat-treating or entire-surface exposing the exposed lithographic printing plate precursor after the developing.

30. The method for producing a lithographic printing plate as claimed in claim 24, wherein the aqueous solution has a pH of 4 to 8.

31. The method for producing a lithographic printing plate as claimed in claim 24, wherein the compound is a compound represented by formula (I).

32. The method for producing a lithographic printing plate as claimed in claim 24, wherein the compound is a compound represented by formula (II).

33. The method for producing a lithographic printing plate as claimed in claim 24, wherein the compound is a compound represented by formula (III).

34. The method for producing a lithographic printing plate as claimed in claim 24, wherein the compound is a compound represented by formula (VI).

35. The method for producing a lithographic printing plate as claimed in claim 24, wherein the binder polymer is a hydrophobic binder polymer having an acid value of 0.3 meq/g or less.

36. The method for producing a lithographic printing plate as claimed in claim 24, wherein the binder polymer has a hydroxyl or carboxylate group.

37. The method for producing a lithographic printing plate as claimed in claim 36, wherein the binder polymer has an ethylenically unsaturated bond.

38. The method for producing a lithographic printing plate as claimed in claim 24, wherein in the developing, a non-image part of the image recording layer is removed by a rubbing member in the presence of the aqueous solution.

39. The method for producing a lithographic printing plate as claimed in claim 24, wherein the method further comprises:

heating the exposed lithographic printing plate precursor between the exposing and the developing;

and naturally drying the lithographic printing plate precursor after the developing.

40. The method for producing a lithographic printing plate as claimed in claim 24, wherein a water-washing and a desensitization treatment are not conducted after the developing.

41. The method for producing a lithographic printing plate as claimed in claim 24, wherein the image recording layer further comprises a polymerization initiator, which is a hexaarylbiimidazole compound.

* * * * *